US012610741B2

(12) United States Patent
Madia et al.

(10) Patent No.: US 12,610,741 B2
(45) Date of Patent: Apr. 21, 2026

(54) SEMICONDUCTOR STRUCTURE AND MANUFACTURING METHOD THEREOF

(71) Applicant: Taiwan Semiconductor Manufacturing Company, Ltd., Hsinchu (TW)

(72) Inventors: Oreste Madia, Brussels (BE); Gerben Doornbos, Kessel-Lo (BE)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 767 days.

(21) Appl. No.: 17/900,804

(22) Filed: Aug. 31, 2022

(65) Prior Publication Data

US 2024/0074315 A1 Feb. 29, 2024

(51) Int. Cl.
| | |
|---|---|
| *H10N 19/00* | (2023.01) |
| *H01L 21/762* | (2006.01) |
| *H01L 23/528* | (2006.01) |
| *H01L 23/58* | (2006.01) |
| *H10D 30/01* | (2025.01) |
| *H10D 30/62* | (2025.01) |

(Continued)

(52) U.S. Cl.
CPC ....... *H10N 19/00* (2023.02); *H01L 21/76224* (2013.01); *H01L 23/5286* (2013.01); *H01L 23/58* (2013.01); *H10D 30/024* (2025.01); *H10D 30/6211* (2025.01); *H10D 84/853* (2025.01); *H10N 10/01* (2023.02)

(58) Field of Classification Search
CPC ........ H10N 19/00; H10N 10/01; H10N 10/13; H10N 10/17; H10N 19/101; H10B 12/056; H10B 12/36; H10D 30/024; H10D 30/62; H10D 84/80; H01L 2924/13067
See application file for complete search history.

(56) References Cited

U.S. PATENT DOCUMENTS

| | | | |
|---|---|---|---|
| 9,773,717 B1 * | 9/2017 | Koswatta | ............... H10N 19/00 |
| 2013/0001655 A1 * | 1/2013 | Huang | ................... H10N 19/00 |
| | | | 257/256 |

(Continued)

*Primary Examiner* — Britt Hanley
*Assistant Examiner* — Jason James Greaving
(74) *Attorney, Agent, or Firm* — JCIPRNET

(57) ABSTRACT

A semiconductor structure includes a substrate, a device, a conductor, a backside interconnect, and a thermoelectric generator. The substrate has a front surface and a rear surface opposite to the front surface. The device is disposed on the front surface of the substrate. The conductor is disposed at or near the front surface of the substrate and electrically coupled to the device. The backside interconnect is disposed on the rear surface of the substrate and electrically coupled to the device. The thermoelectric generator is disposed in the substrate and electrically coupled to the device, and includes a first-type through via and a second-type through via. The first-type through via penetrates from the rear surface of the substrate to the conductor, and is connected to a first conductive feature of the backside interconnect and the conductor. The second-type through via penetrates from the rear surface of the substrate to the conductor, and is connected to a second conductive feature of the backside interconnect and the conductor. The second-type through via is different from the first-type through via.

20 Claims, 75 Drawing Sheets

(51) Int. Cl.
H10D 84/85 (2025.01)
H10N 10/01 (2023.01)

(56) References Cited

U.S. PATENT DOCUMENTS

| 2014/0238045 | A1* | 8/2014 | Griebenow | ......... | H01L 25/0652 |
| | | | | | 62/3.2 |
| 2015/0115431 | A1* | 4/2015 | Chadwick | ............. | H10N 10/01 |
| | | | | | 438/122 |
| 2016/0049401 | A1* | 2/2016 | Sung | ................. | H10D 84/0174 |
| | | | | | 257/369 |
| 2017/0352762 | A1* | 12/2017 | Yang | ...................... | H10D 30/62 |
| 2020/0083284 | A1* | 3/2020 | Manipatruni | ........... | H01L 25/16 |

* cited by examiner

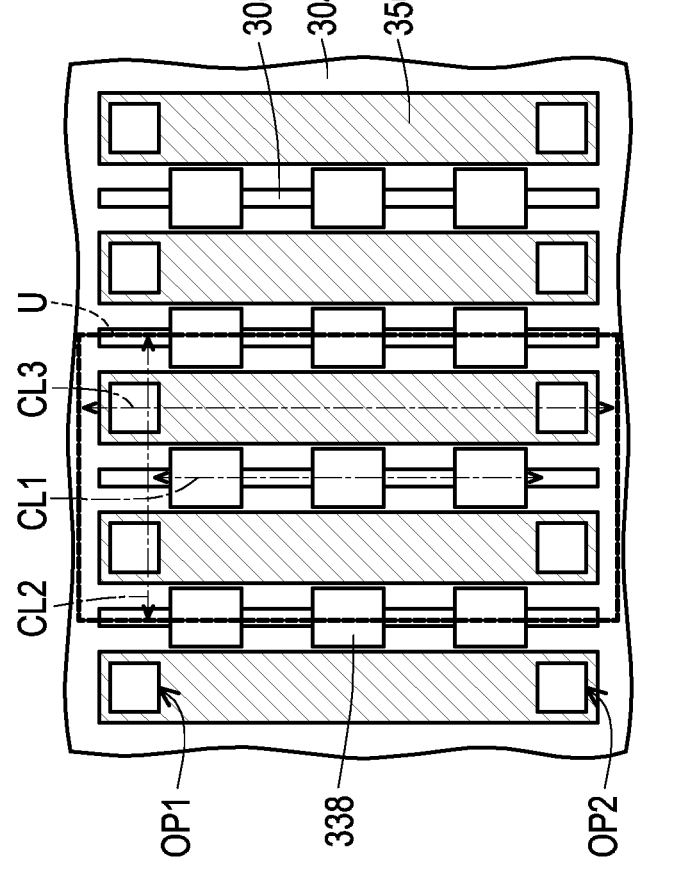
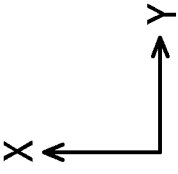
FIG. 5A

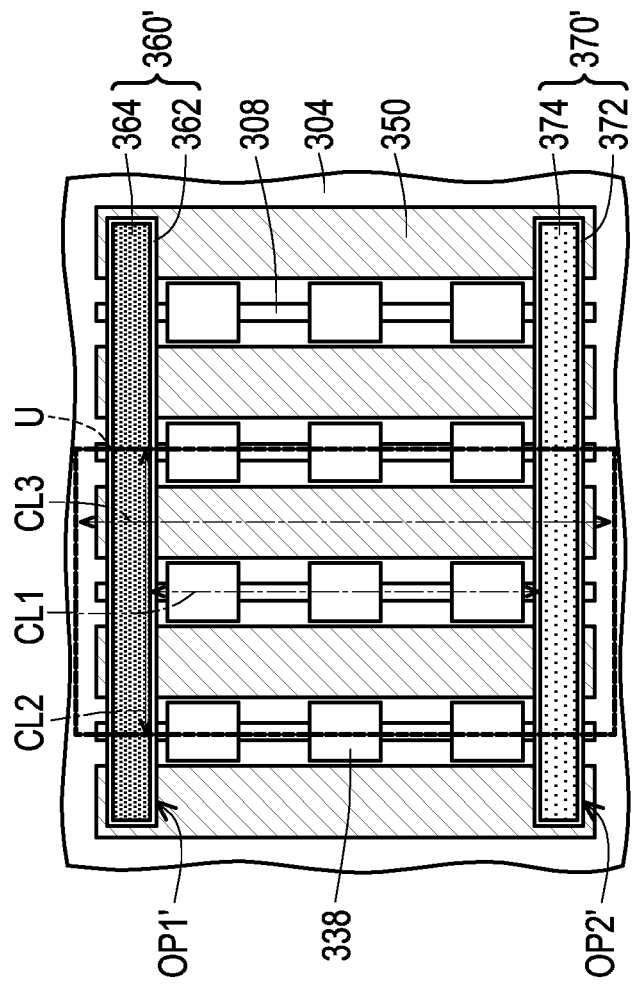
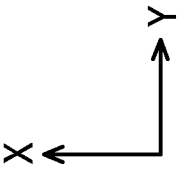
FIG. 9A

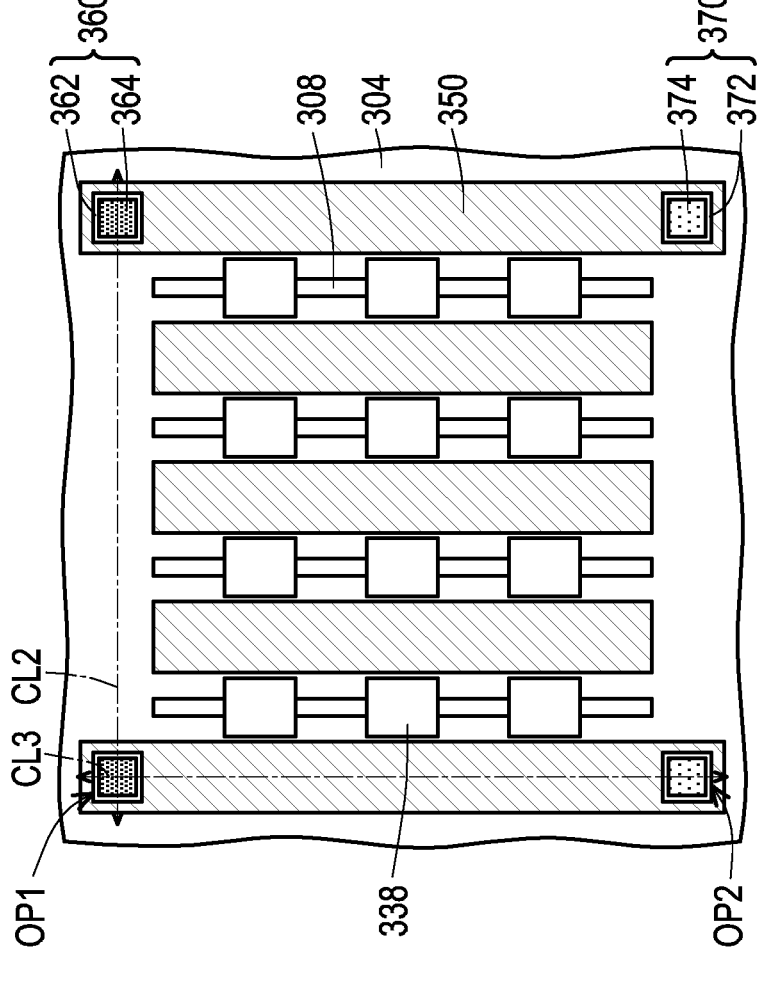
362
364 } 360
308
304
350
374
372 } 370
CL3 CL2
OP1
338
OP2
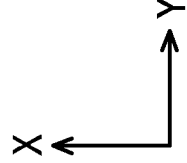
FIG. 12A
X
Y

FIG. 13B

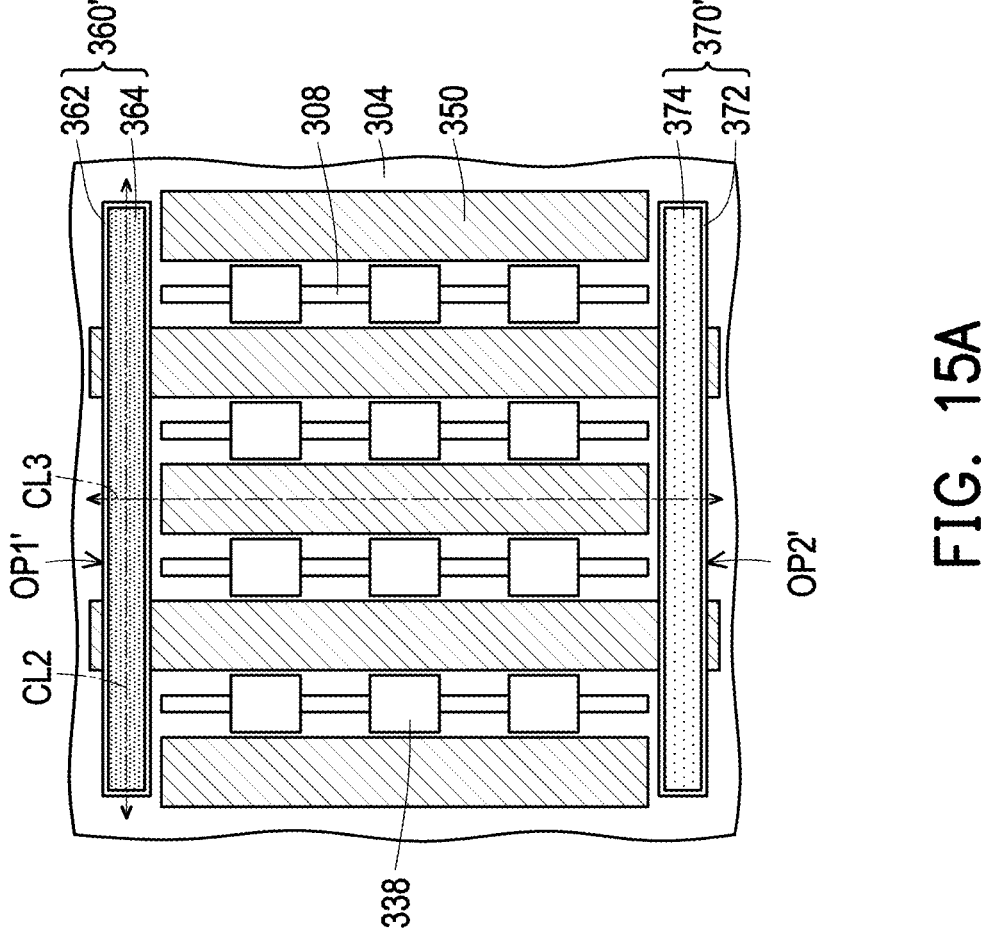
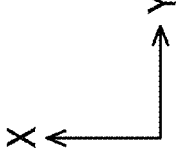
FIG. 15A

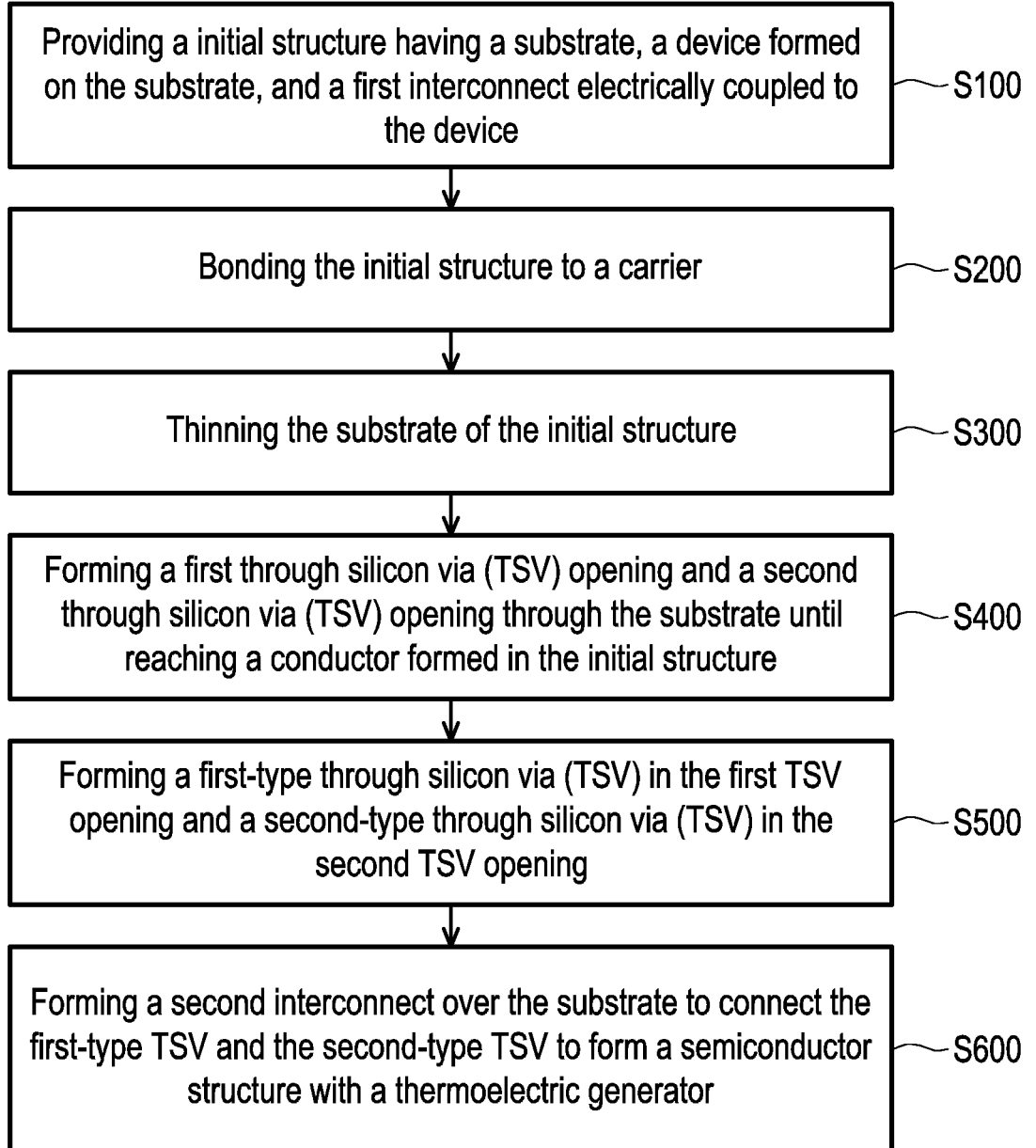

Providing a initial structure having a substrate, a device formed on the substrate, and a first interconnect electrically coupled to the device ⎯ S100

Bonding the initial structure to a carrier ⎯ S200

Thinning the substrate of the initial structure ⎯ S300

Forming a first through silicon via (TSV) opening and a second through silicon via (TSV) opening through the substrate until reaching a conductor formed in the initial structure ⎯ S400

Forming a first-type through silicon via (TSV) in the first TSV opening and a second-type through silicon via (TSV) in the second TSV opening ⎯ S500

Forming a second interconnect over the substrate to connect the first-type TSV and the second-type TSV to form a semiconductor structure with a thermoelectric generator ⎯ S600

FIG. 17

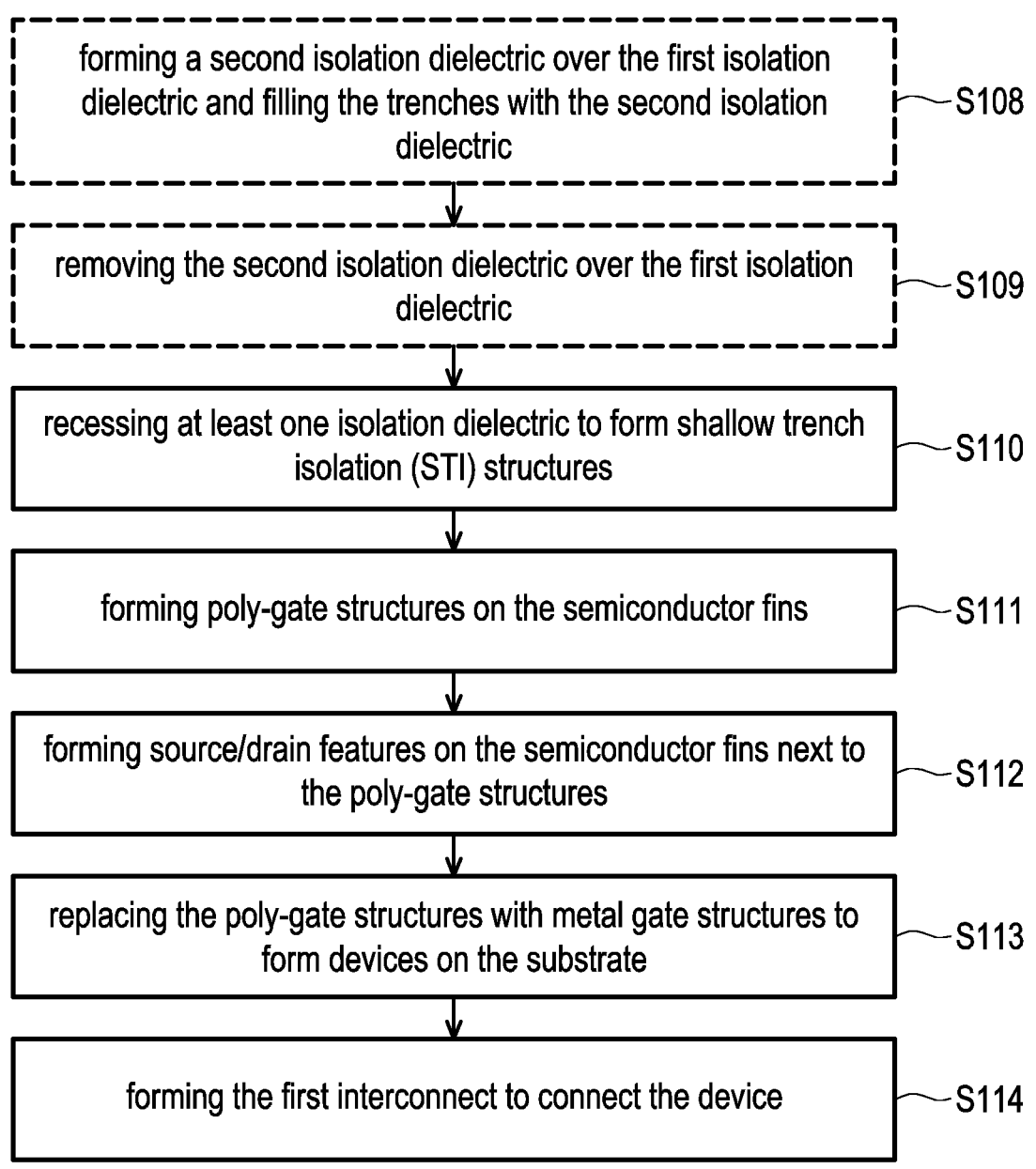

forming a second isolation dielectric over the first isolation dielectric and filling the trenches with the second isolation dielectric ⟋—S108 removing the second isolation dielectric over the first isolation dielectric ⟋—S109 recessing at least one isolation dielectric to form shallow trench isolation (STI) structures ⟋—S110 forming poly-gate structures on the semiconductor fins ⟋—S111 forming source/drain features on the semiconductor fins next to the poly-gate structures ⟋—S112 replacing the poly-gate structures with metal gate structures to form devices on the substrate ⟋—S113 forming the first interconnect to connect the device ⟋—S114

FIG. 19B

SEMICONDUCTOR STRUCTURE AND MANUFACTURING METHOD THEREOF

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5A through FIG. 5D are schematic horizontal cross-sectional views of various embodiments of the semiconductor structure depicted in FIGS. 1E, 2E, and 3E.

FIG. 9A through FIG. 9D are schematic horizontal cross-sectional views of various embodiments of the semiconductor structure depicted in FIGS. 8A, 8B, and 8C.

FIG. 12A through FIG. 12D are schematic horizontal cross-sectional views of various embodiments of the semiconductor structure depicted in FIGS. 11A, 11B, and 11C.

FIGS. 13A, 13B, and 13C are schematic three-dimensional perspective and vertical cross-sectional views of a semiconductor structure in accordance with some alternative embodiments of the disclosure.

FIG. 15A through FIG. 15D are schematic horizontal cross-sectional views of various embodiments of the semiconductor structure depicted in FIGS. 14A, 14B, and 14C.

FIG. 17 is a flow chart illustrating a method for manufacturing a semiconductor structure in accordance with some embodiments of the disclosure.

FIG. 19A and FIG. 19B are a flow chart illustrating a method for manufacturing a portion of a semiconductor structure in accordance with some embodiments of the disclosure.

DETAILED DESCRIPTION

Figure 1A:
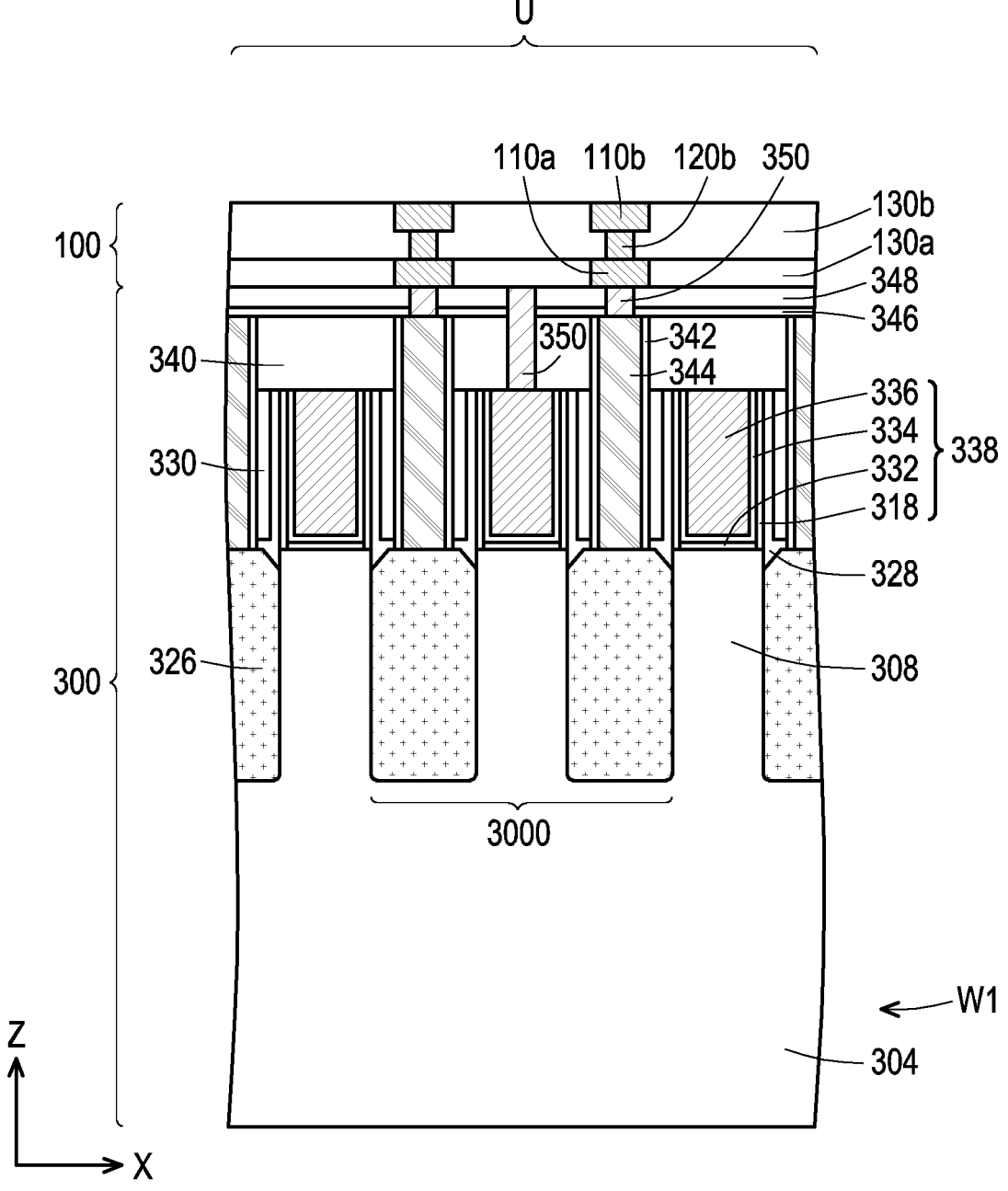
FIG. 1A through FIG. 1H are schematic first vertical cross-sectional views of various stages in a manufacturing method of a portion of a semiconductor structure in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third", "fourth", and the like, may be used herein for ease of description to describe similar or different element(s) or feature(s) as illustrated in the figures, and may be used interchangeably depending on the order of the presence or the contexts of the description.

As used herein, "around," "about," "approximately," or "substantially" shall generally mean within 20 percent, or within 10 percent, or within 5 percent, or within 3 percent, or within 1 percent of a given value or range. Numerical quantities given herein are approximate, meaning that the term "around," "about," "approximately," or "substantially" can be inferred if not expressly stated.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of the disclosure are directed to, but not otherwise limited to, a semiconductor structure including a device such as a transistor device, for example, a field-effect transistor (FET). The FET device, for example, may be a fin-like field-effect transistor (FinFET) device, a complementary metal-oxide-semiconductor (CMOS) transistor device including a P-type metal-oxide-semiconductor (PMOS) FinFET device and an N-type metal-oxide-semiconductor (NMOS) FinFET device, a bipolar junction transistor (BJT) device, a high voltage transistor device, a high frequency transistor device, a p-channel (PFET) and/or n-channel field effect transistor (NFET) device, a metal-oxide-semiconductor field effect transistor (MOSFET) device, a planar MOS transistor device with raised source/drain, tunnel field-effect transistors (TFETs), or the like. Alternatively, the device may be a FET device including a gate-all-around (GAA) FET device, for example, a GAA nanowire transistor device, a GAA nanosheet transistor device, or the like. The following disclosure will continue with one or more FinFET examples to illustrate various embodiments of the disclosure. It is understood, however, that the disclosure should not be limited to a particular type of device, except as specifically claimed.

In some embodiments, the device is formed on bulk silicon substrates. Still, the device may be formed on a silicon-on-insulator (SOI) substrate, a germanium-on-insulator (GOI) substrate, a silicon germanium substrate, or a Group III-V semiconductor substrate. Also, in accordance with some embodiments, the silicon substrate may include other conductive layers or other semiconductor elements, such as transistors, diodes or the like. The embodiments are not limited in this context. The device may be included in microprocessors, memories, and/or other integrated circuits (IC). Accordingly, it is understood that additional processes may be provided before, during, and after the illustrated method, and that some other processes may only be briefly described herein. Also, the features illustrated in the drawings are simplified for a better understanding of the concepts of the disclosure. For example, although the figures illustrate the features of the semiconductor structure having a device, it is understood the device may be part of an IC that further includes a number of other devices such as resistors, capacitors, inductors, fuses, etc. On the other hand, the features may be form/patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process.

It should be appreciated that the following embodiment(s) of the disclosure provides applicable concepts that can be embodied in a wide variety of specific contexts. The specific embodiment(s) discussed herein is merely illustrative and is related to a semiconductor structure containing one or more than one thermoelectric generator (TEG) device, and is not intended to limit the scope of the disclosure. In accordance with some embodiments, the semiconductor structure includes a substrate, a device formed on the substrate, a frontside interconnect over a front surface of the substrate and electrically coupled to the device, a first through via and a second through via penetrating the substrate to electrically couple to a conductor formed at or near the front surface of substrate, and a backside interconnect over a rear surface of the substrate and having metallization lines electrically coupled to the first and second through vias. In some embodiments, the first and second through vias are disposed between the frontside interconnect and the backside interconnect. In the case, the first through via is made of one of n-type and p-type semiconductor material, while the second via is made of other one of n-type and p-type semiconductor material, so to form a TEG device in the semiconductor structure. In embodiments of which the TEG device is formed in the semiconductor structure, the TEG device serves as a thermocouple being capable of converting a heat energy (which is generated from the device at the front surface of the substrate) into a voltage potential due to Seebeck effect or thermoelectric effect. In the case, an embedded memory, such as a random access memory (RAM), in the semiconductor structure can be refreshed immediately by the power drawn from the TEG device (which saves operating time); and/or, an embedded capacitor, such as a metal-insulator-metal (MIM) capacitor, in the semiconductor structure can be pre-charged with the power drawn from the TEG device (which stores power for later use). In some embodiments, the semiconductor structure may be a semiconductor wafer or a semiconductor die/chip, constituted by a plurality of cell units (or referred to as repeated units or computational cells). For one example, one, some, or all of the cell units included in the semiconductor wafer individually can be equipped with one or more than one TEG device formed therein (e.g., intra-a-cell unit). For another one example, the semiconductor die/chip (having multiple cell units), as a whole, can be equipped with one or more than one TEG device formed at a periphery thereof 5 (e.g., intra-a-die or intra-a-chip).

Figure 4A:
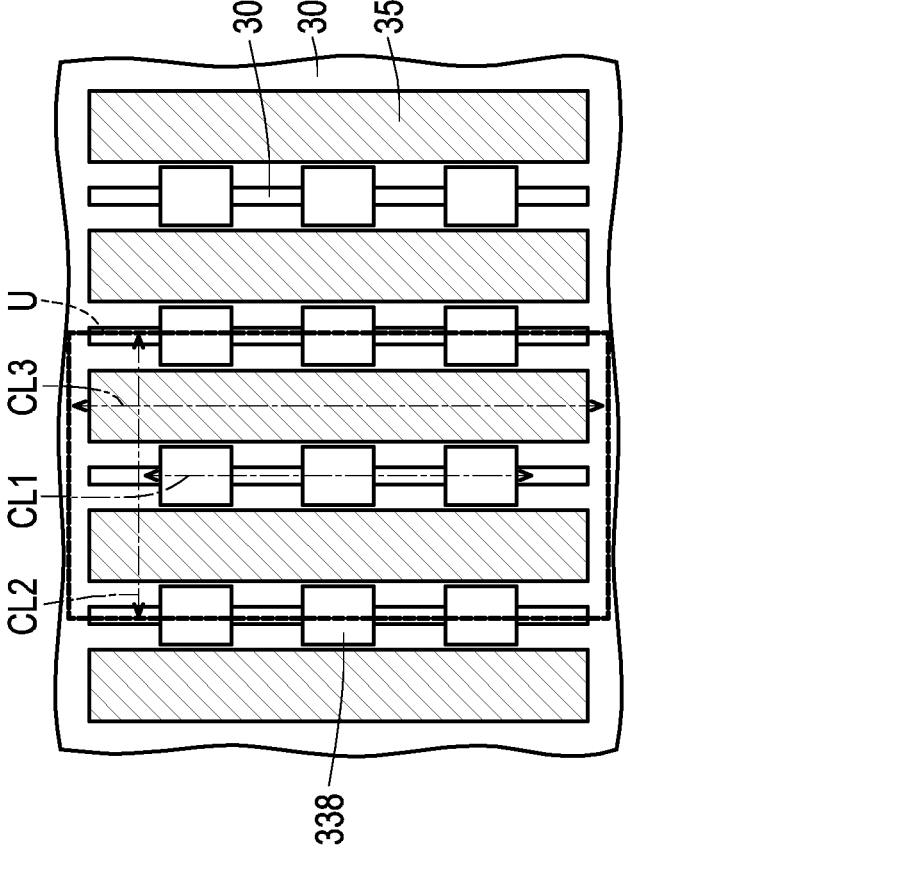
FIG. 4A through FIG. 4D are schematic horizontal cross-sectional views of various embodiments of the semiconductor structure depicted in FIGS. 1A, 2A, and 3A.
Figure 4B:
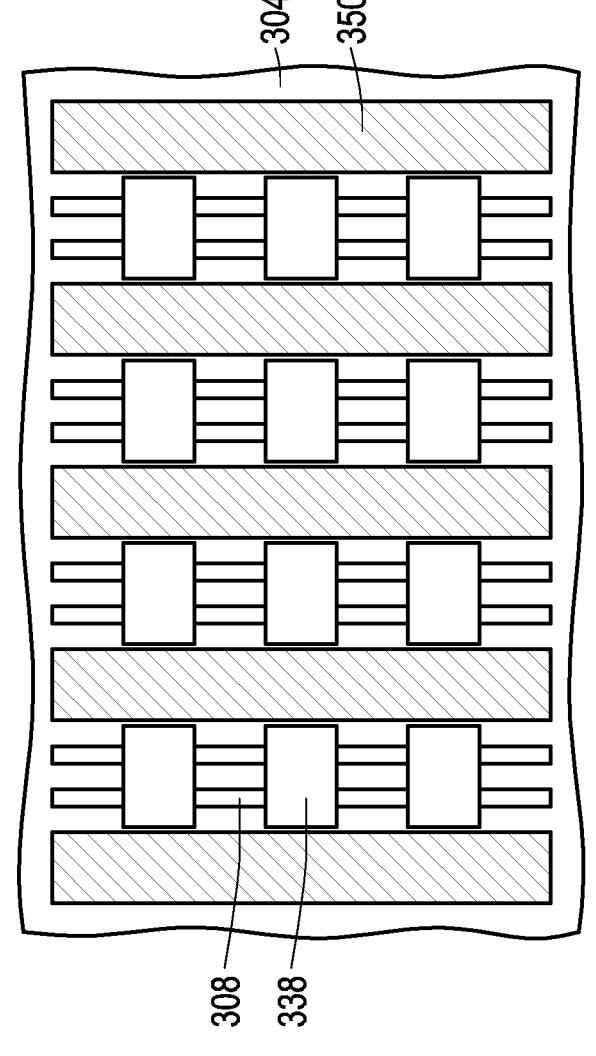
Figure 4C:
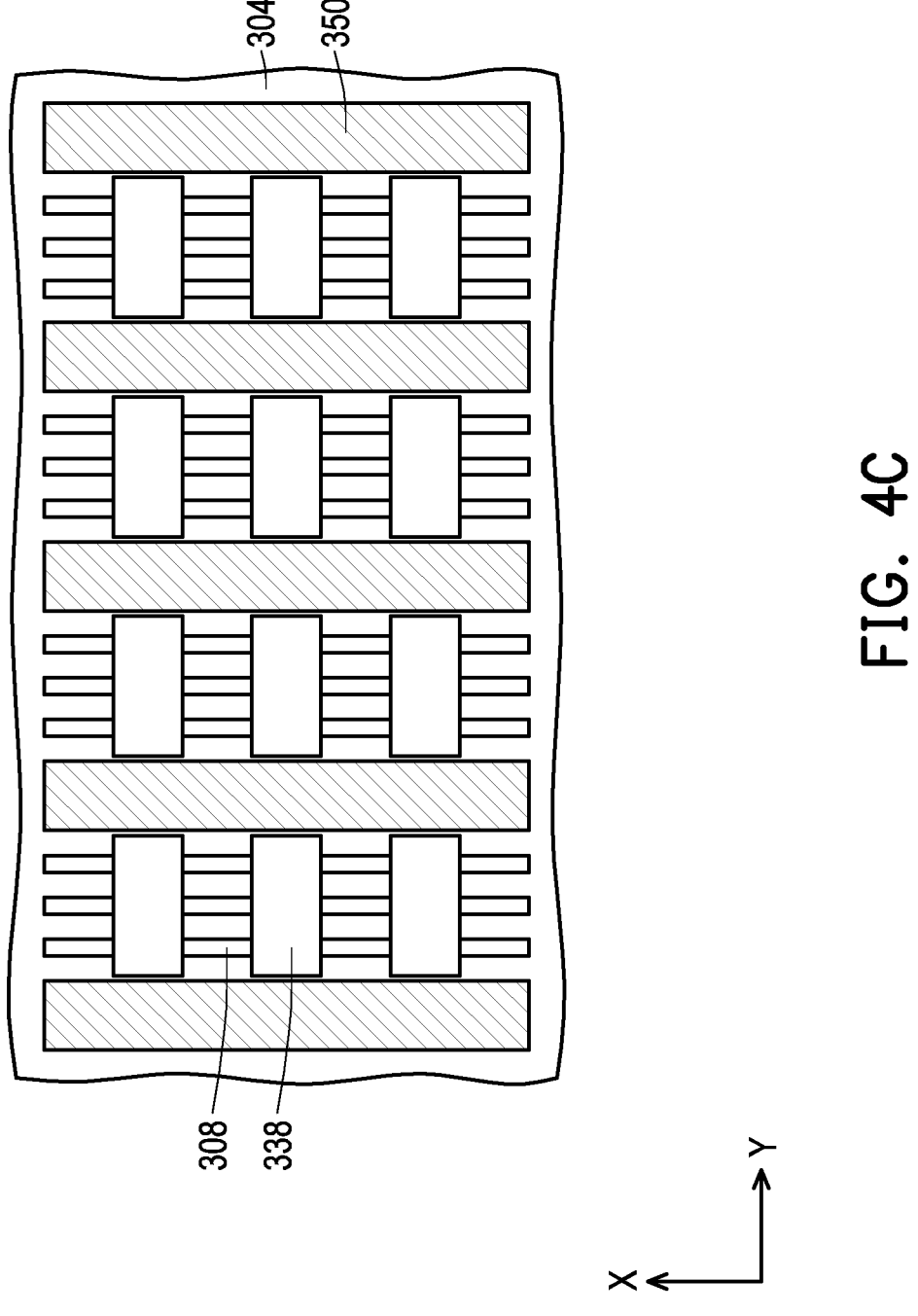
Figure 4D:
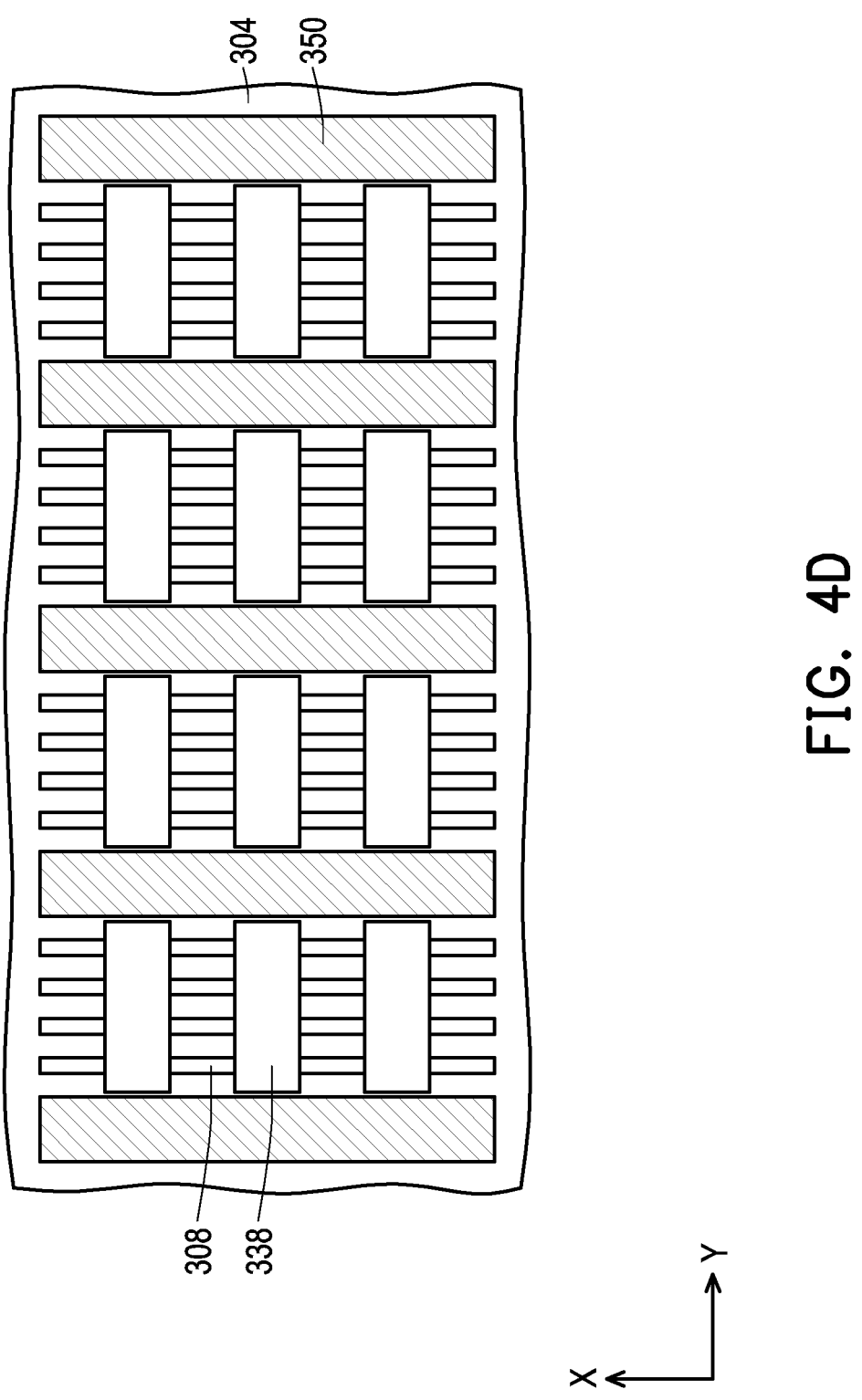
Figure 5B:
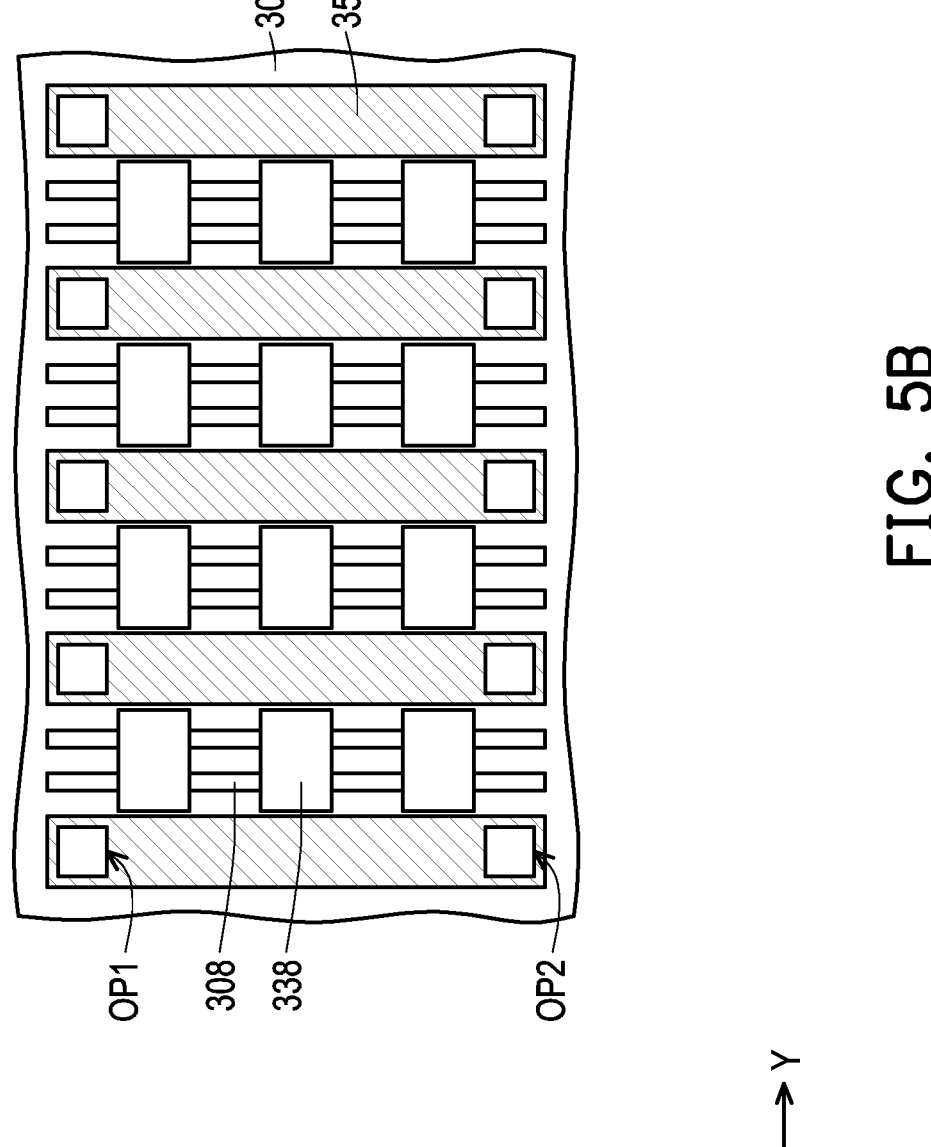
Figure 5C:
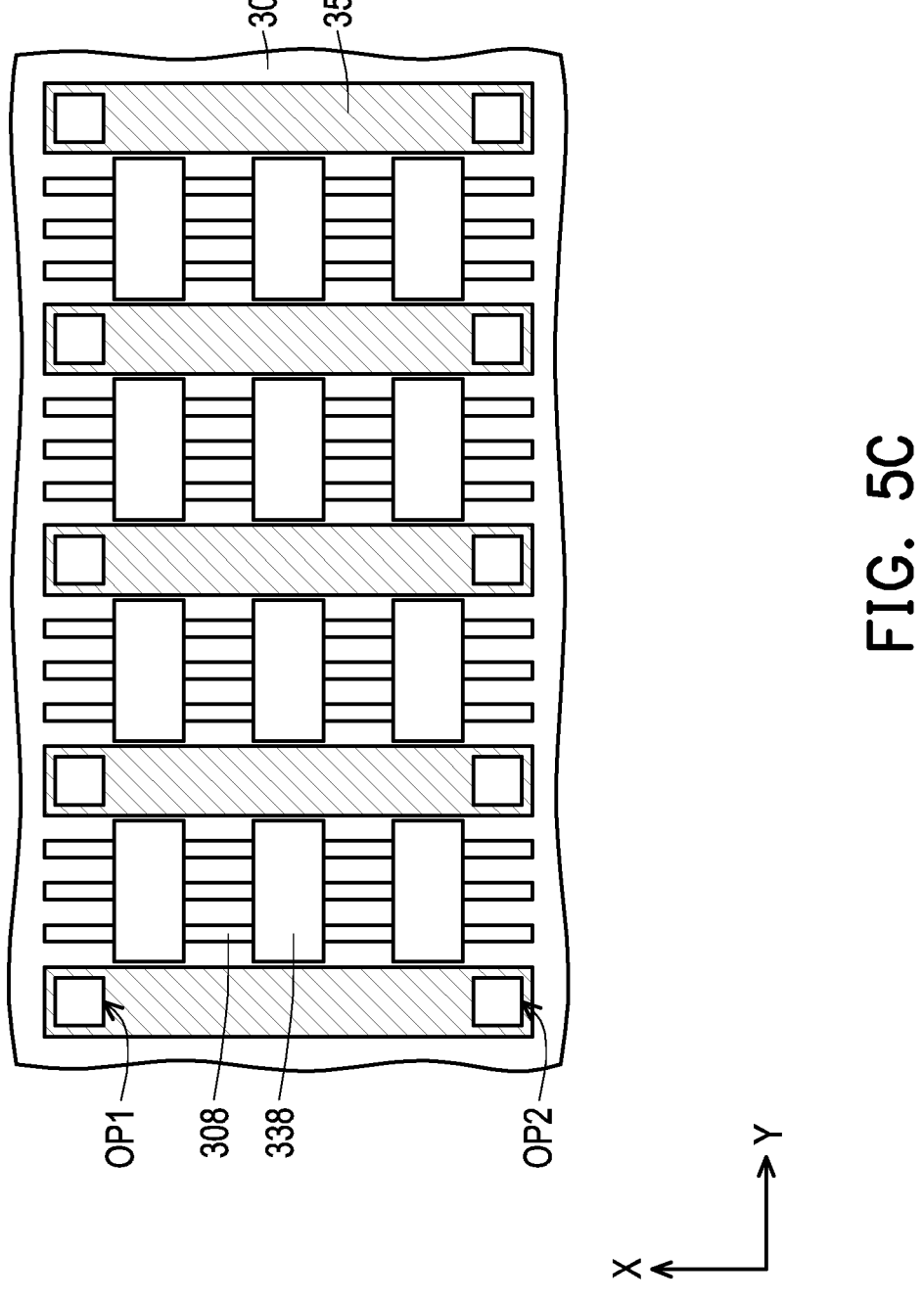
Figure 5D:
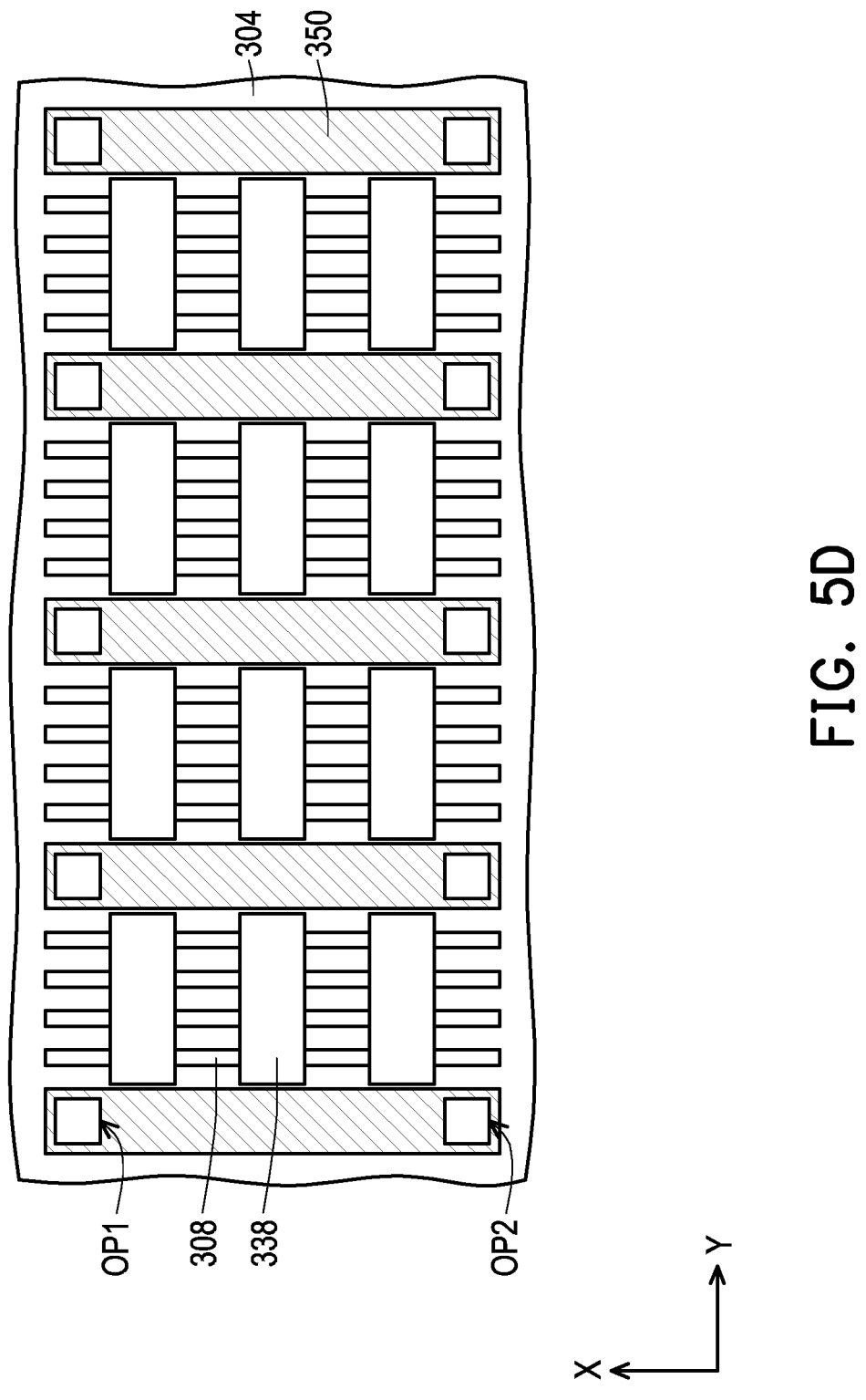
Figure 6A:
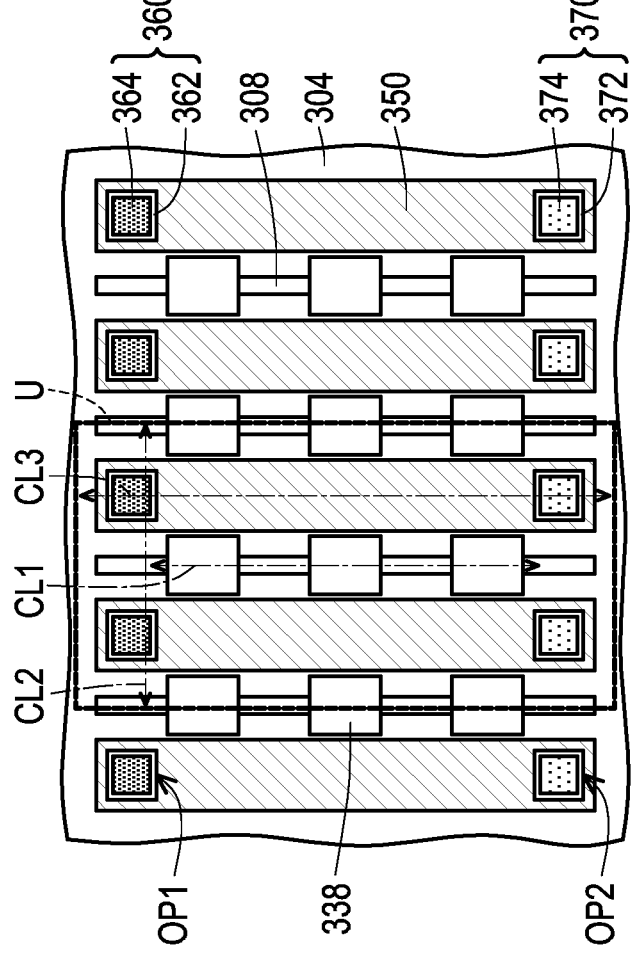
FIG. 6A through FIG. 6D are schematic horizontal cross-sectional views of various embodiments of the semiconductor structure depicted in FIGS. 1F, 2F, and 3F.
Figure 6B:
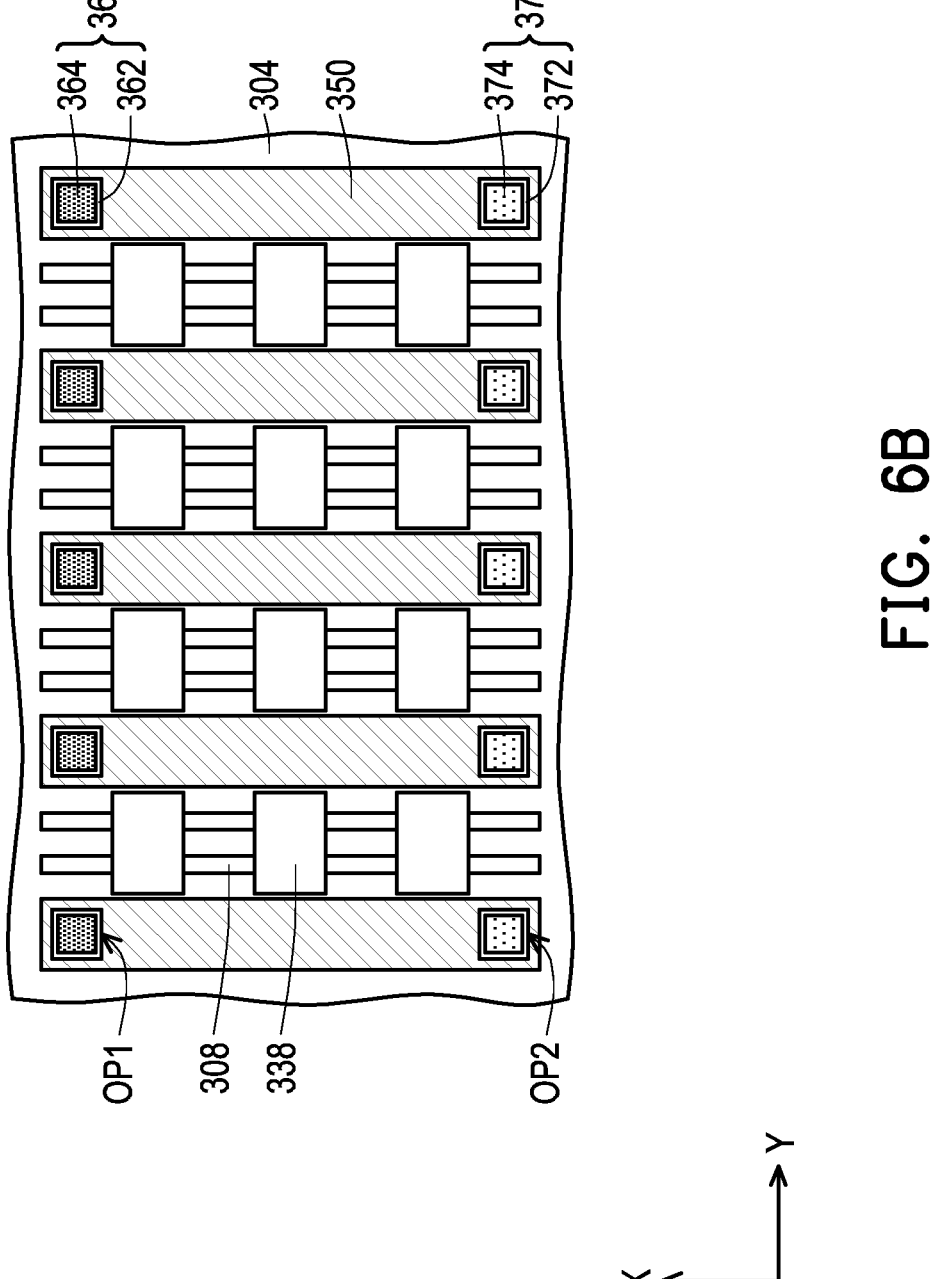
Figure 6C:
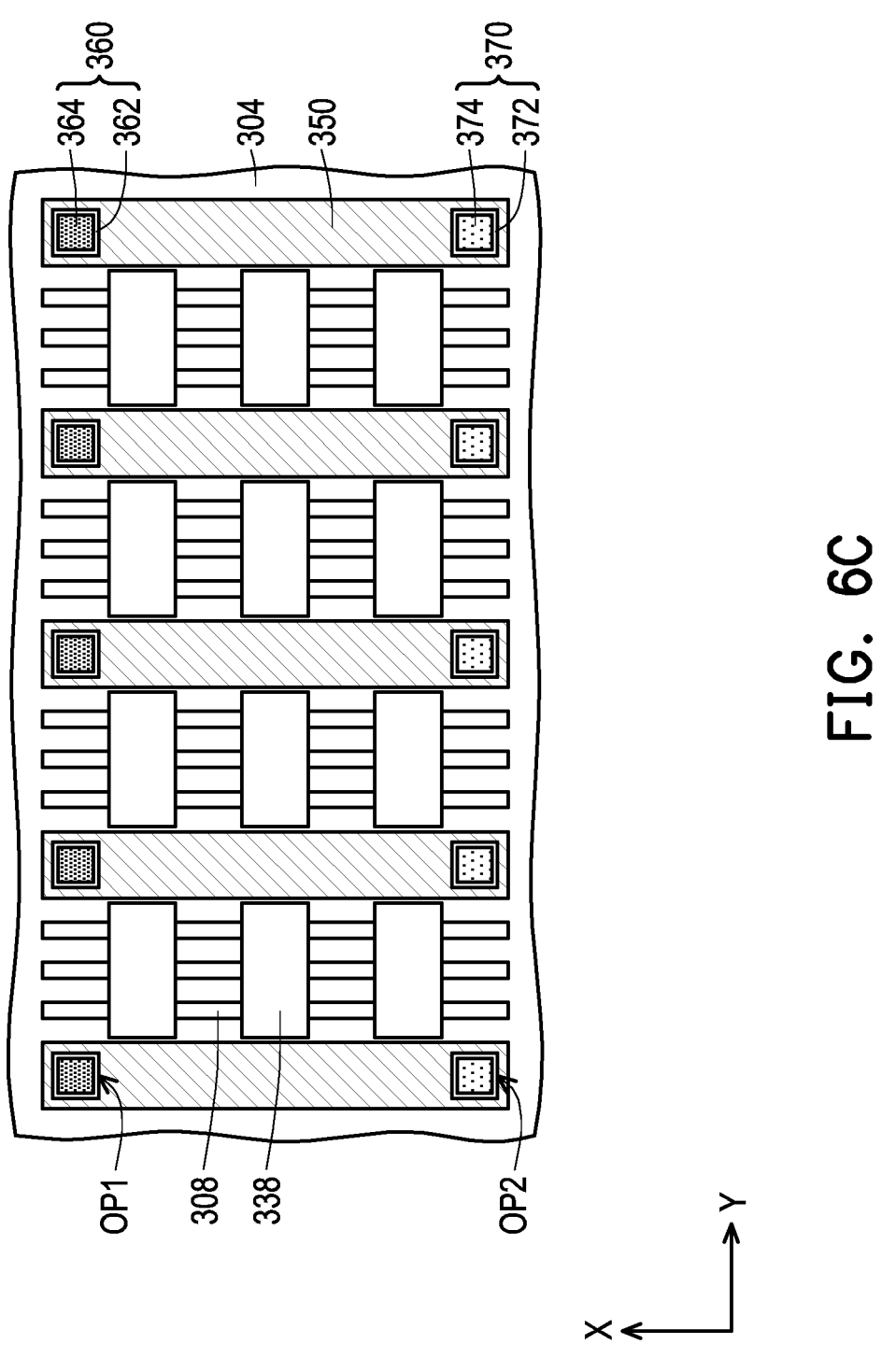
Figure 6D:
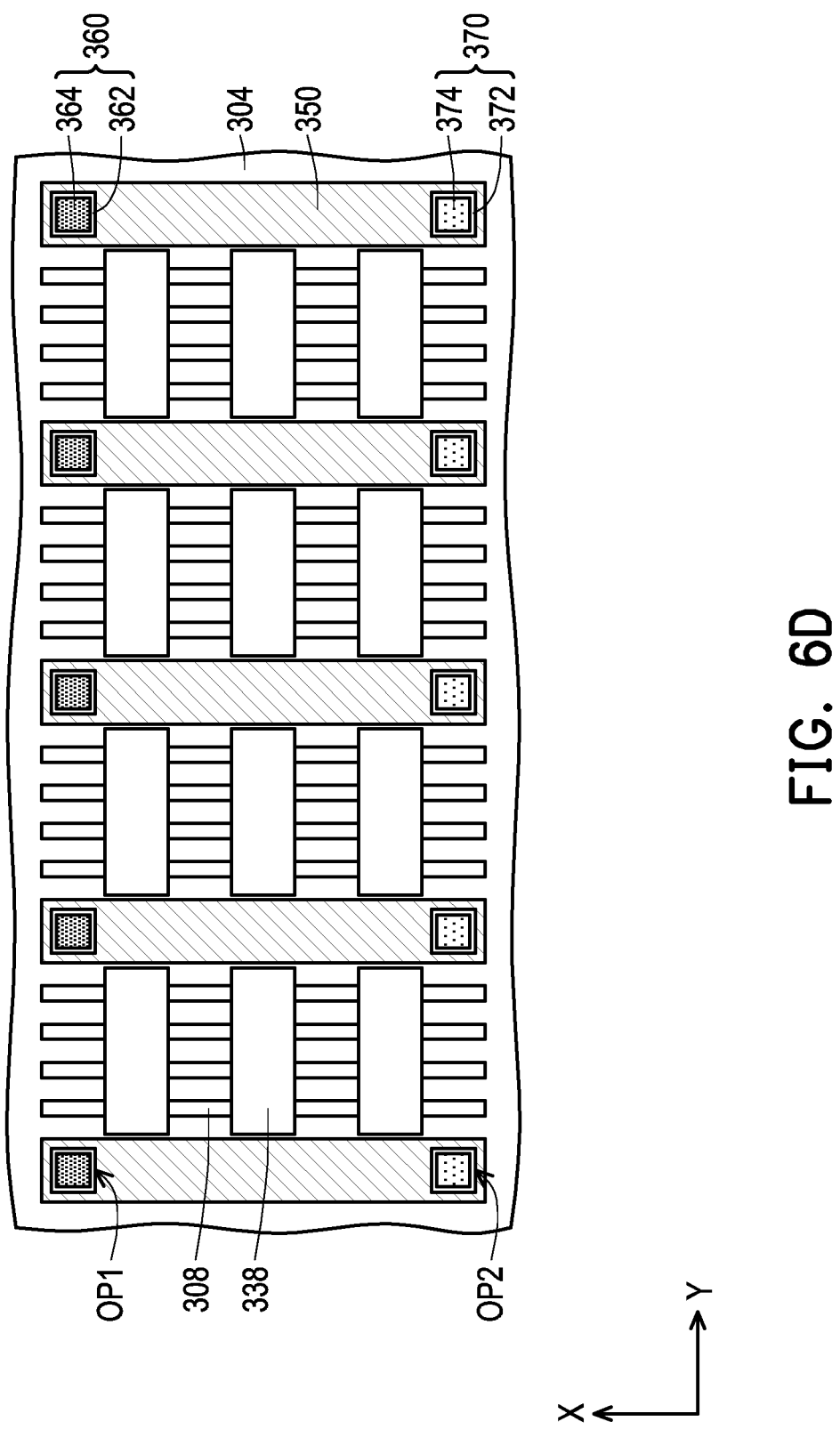

FIGS. 1A, 1B, 1C, 1D, 1E, 1F, 1G, and 1H are schematic first vertical cross-sectional views of various stages in a manufacturing method of a semiconductor structure SS1 with cell units U along a Z-X plane in accordance with some embodiments of the disclosure, where FIGS. 2A, 2B, 2C, 2D, 2E, 2F, 2G, and 2H are schematic second vertical cross-sectional views of the semiconductor structure SS1 with the cell units U along a Z-Y plane and are respectively corresponding to FIGS. 1A, 1B, 1C, 1D, 1E, 1F, 1G, and 1H, and FIGS. 3A, 3B, 3C, 3D, 3E, 3F, 3G, and 3H are schematic third vertical cross-sectional views of the semiconductor structure SS1 with the cell units U along the Z-X plane and are respectively corresponding to FIGS. 1A, 1B, 1C, 1D, 1E, 1F, 1G, and 1H. FIG. 4A is a schematic horizontal cross-sectional view of the semiconductor structure SS1 along a X-Y plane corresponding to FIGS. 1A, 2A, and 3A, where FIGS. 4B, 4C, and 4C are schematic horizontal cross-sectional views illustrating other possible non-limiting embodiments of the semiconductor structure SS1. FIG. 5A is a schematic horizontal cross-sectional view of the semiconductor structure SS1 along the X-Y plane corresponding to FIGS. 1E, 2E, and 3E, where FIGS. 5B, 5C, and 5C are schematic horizontal cross-sectional views illustrating other possible non-limiting embodiments of the semiconductor structure SS1. FIG. 6A is a schematic horizontal cross-sectional view of the semiconductor structure SS1 along the X-Y plane corresponding to FIGS. 1F, 2F, and 3F, where FIGS. 6B, 6C, and 6C are schematic horizontal cross-sectional views illustrating other possible non-limiting embodiments of the semiconductor structure SS1. It is appreciated that the horizontal cross-sectional views of FIGS. 4A-4D, 5A-5D, and 6A-6D illustrate certain features only to emphasize positioning configuration/arrangement thereof for better understanding of the disclosure with simplicity, and are not intended to limit the content of the disclosure. The embodiments are intended to provide further explanations but are not used to limit the scope of the disclosure.

It should be appreciated that the illustration of components throughout all figures is schematic and is not in scale. Throughout the various views and illustrative embodiments of the disclosure, the elements similar to or substantially the same as the elements described previously will use the same reference numbers, and certain details or descriptions (e.g., the materials, formation processes, positioning configurations, electrical connections, etc.) of the same elements would not be repeated. For clarity of illustrations, in the drawings are illustrated the orthogonal axes (X, Y and Z) of the Cartesian coordinate system according to which the views are oriented; however, the disclosure is not specifically limited thereto. For example, FIGS. 1A, 1B, 1C, 1D, 1E, 1F, 1G, and 1H are the schematic first vertical cross-sectional views in the Z-X plane taken along a cross-sectional line CL1 depicted in FIGS. 4A, 5A, and 6A, FIGS. 2A, 2B, 2C, 2D, 2E, 2F, 2G, and 2H are the schematic second vertical cross-sectional views in the Z-Y plane taken alone a cross-sectional line CL2 depicted in FIGS. 4A, 5A, and 6A, and FIGS. 3A, 3B, 3C, 3D, 3E, 3F, 3G, and 3H are the schematic third vertical cross-sectional views in the Z-X plane taken alone a cross-sectional line CL3 depicted in FIGS. 4A, 5A, and 6A. In the case, the X-Z plane, the Y-Z plane and the X-Y plane are substantially perpendicular to one other. In other words, the directions X, Y, and Z are substantially perpendicular to one other, for example.

Figure 2A:
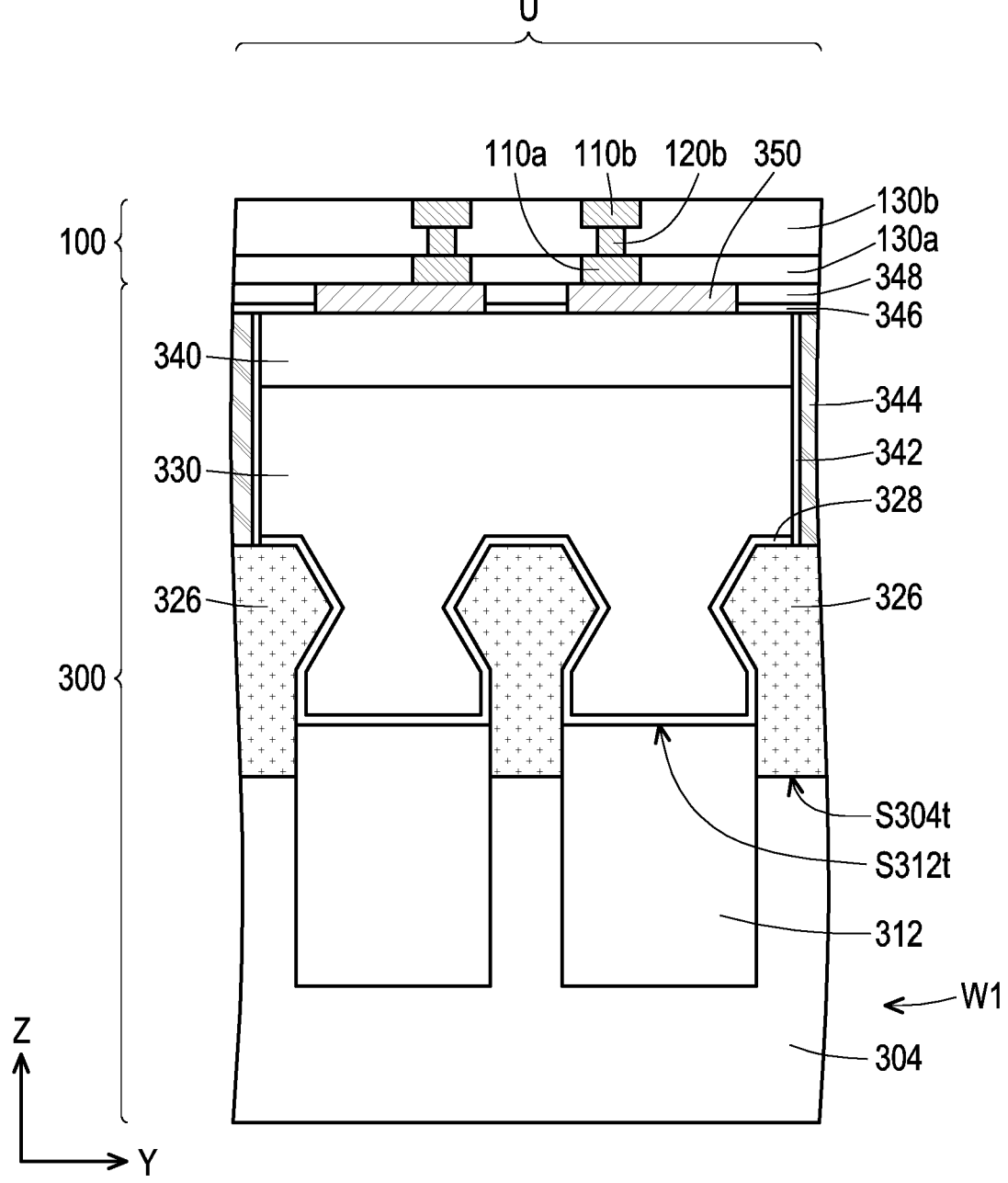
FIG. 2A through FIG. 2H are schematic second vertical cross-sectional views of various stages in a manufacturing method of a portion of the semiconductor structure in accordance with some embodiments of the disclosure.
Figure 3A:
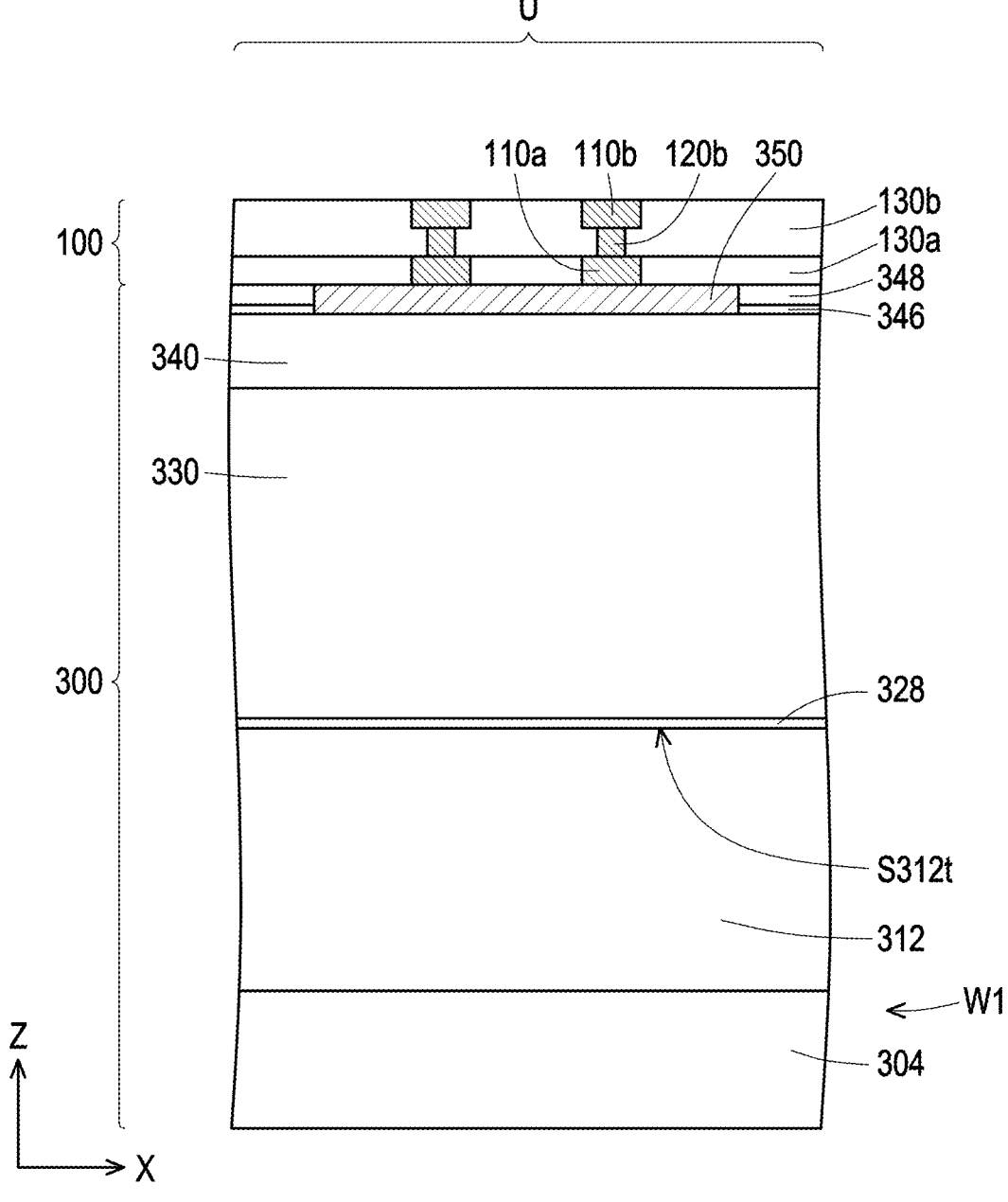
FIG. 3A through FIG. 3H are schematic third vertical cross-sectional views of various stages in a manufacturing method of a portion of a semiconductor structure in accordance with some embodiments of the disclosure.

Referring to FIGS. 1A, 2A, and 3A, in some embodiments, an initial structure is provided, in accordance with a step S100 of a method depicted in FIG. 17. In FIGS. 1A, 2A, and 3A, the initial structure may include or be a wafer W1 having a plurality of cell units U (or referred to as repeated units or computational cells). In some embodiments, the wafer W1 includes a substrate 304, at least one device 3000 disposed on the substrate 304, a plurality of isolation structures 312 (sometimes referred to as shallow trench isolation (STI) structures) disposed in the substrate 304, a plurality of contact plugs 344, a plurality of conductors 350, and a plurality of routing layers (e.g., 110a, 120b, 110b, etc.), where the contact plugs 344 and the conductors 350 are disposed over and electrically coupled to the device 3000, and the routing layers are disposed over and electrically coupled to the device 3000 through the contact plugs 344 and the conductors 350. For example, In some embodiments, the wafer W1 is a bulk wafer having a plurality of dies interconnected, where each of the dies are composed of one or more cell units U, and the structure depicted in FIGS. 1A, 2A and 3A is shown as a portion of the wafer W1, e.g., one unit cell U.

As illustrated in FIGS. 1A, 2A, and 3A, the device 3000 may include a semiconductor fin 308 on the substrate 304 and interposed between two of the isolation structure 312, a gate structure 338 covering a portion of the semiconductor fin 308, and source/drain regions 326 (sometimes referred to as source/drain structures or source/drain features) covering portions of the semiconductor fin 308 revealed by the gate structure 338. For example, the gate structure 338 includes an interfacial (IL) layer 332, a gate dielectric layer 334 and a gate electrode 336, where sidewalls and bottom of the gate electrode 336 are lined with the gate dielectric layer 334, and the bottom of the gate dielectric layer 334 is lined with the interfacial layer 332. In other words, the interfacial layer 332 interposes between the semiconductor fin 308 and the gate dielectric layer 334 lining the gate electrode 336, for example, as shown in FIGS. 1A, 2A, and 3A. Alternatively, the gate structure may further include one or more work function layer (not shown) disposed between each gate dielectric layer 334 and the overlying gate electrode 336. In some embodiments, the device 3000 further includes a pair of gate spacers 318 are disposed at two opposite sides of the gate structure 338 to protect the gate structure 338.

In some embodiments, a dielectric layer 328 and an inter-layer dielectric (ILD) layer 330 are sequentially disposed on the device 3000 and next to the gate spacers 318, where an illustrated top surface of the gate structure 338, illustrated top surfaces of the gate spacers 318, an illustrated top surface of the dielectric layer 328, and an illustrated top surface of the ILD layer 330 are substantially leveled with and substantially coplanar to each other, within process variations. In some embodiments, an ILD layer 340 is disposed over the device 3000, the dielectric layer 328 and the ILD layer 330, where the contact plugs 344 are disposed over the source/drain regions 326 and penetrate through the ILD 340, the ILD layer 330 and the dielectric layer 328 to be in (physical) contact with the source/drain regions 326 for electrical connections therebetween. Barrier layer or adhesive layers 342 may be optionally adopted to line sidewalls of the contact plugs 344, where the contact plugs 344 are separated from the ILD layers 330 and 340 and the dielectric layer 328 through the barrier layer or adhesive layers 342, as shown in FIGS. 1A, 2A and 3A. The dielectric layer 328 may be referred to as an etch stop layer or a contact etch stop (CES) layer for avoiding over-etching during the formation of the contact plugs 344 and the barrier layer or adhesive layers 342, so to protect the device 3000 from undesired damages during the manufacture.

In some embodiments, the contact plugs 344 are disposed over and connected to the source/drain regions 326, where the contact plugs 344 are referred to as metallization contacts, metal contacts or metallic contacts to the source/drain regions 326. In some embodiments, a dielectric layer 346 and a dielectric layer 348 are sequentially disposed on the contact plugs 344, the barrier layer or adhesive layers 342, and the ILD layer 340. The dielectric layer 346 may be referred to as a protection layer, an etch stop layer or a contact etch stop (CES) layer. The dielectric layer 348 may be referred to as an ILD layer. The conductors 350 penetrate through the dielectric layers 346 and 348 to electrically coupled to the contact plugs 344 and the gate structures 338, and are physically spacing away from each other, for example. Some of the conductors 350 may be electrically connected to the contact plugs 344 connected to the source/drain regions 326, and some of the conductors 350 may be electrically connected to the gate electrodes 336 of the gate structure 338. The conductors 350 electrically connected to the contact plugs 344 connected to the source/drain regions 326 may be referred to as source/drain contacts (e.g., the conductors 350 overlapped with and connecting the contact plugs 344 disposed on the source/drain regions 326 in FIG. 1A), and the conductors 350 electrically connected to the gate electrodes 336 of the gate structure 338 may be referred to as gate contacts (e.g., the conductors 350 overlapped with and connecting the gate electrodes 336 depicted in FIG. 1A). In addition, some of the conductor 350 are not connected to the source/drain regions 326 and the gate electrodes 336. In some embodiments, the substrate 304, the device 3000, the isolation structure 312, the dielectric layer 328, the ILD layer 330, the ILD layer 340, the barrier layer or adhesive layers 342, the contact plugs 344, the dielectric layer 346, the dielectric layer 348, and the conductors 350 are together constituted a device layer 300 (or referred to as a device structure) which is formed during the front-end-of-line (FEOL) processes of the wafer W1, forming steps and materials thereof would be discussed in great details later in conjunction with FIGS. 19A and 19B.

Continued on FIGS. 1A, 2A and 3A, for example, a plurality of conductive lines 110a, 110b, a plurality of conductive vias 120b and a plurality of dielectric layers 130a, 130b are disposed on the device layer 300. For example, the conductive lines 110a are disposed on (e.g. in physical contact with) and connected to the conductors 350 and laterally covered by the dielectric layer 130a to form a first build-up layer of an interconnect 100 disposed on the device layer 300, where the conductive vias 120b are disposed on (e.g. in physical contact with) and connected to the conductive lines 110a, the conductive lines 110b are disposed on (e.g. in physical contact with) and connected to the conductive vias 120b, and the conductive lines 110b and the conductive vias 120b are laterally covered by the dielectric layer 130b to form a second build-up layer of the interconnect 100. As shown in FIGS. 1A, 2A and 3A, illustrated top surface of the conductive lines 110b are substantially leveled with and coplanar to an illustrate top surface of the dielectric layer 130b for further electrical connection to later-formed features (e.g., terminals or another build-up layer) or external devices. The conductive lines 110a are physically and electrically connected to the conductors 350, and the conductive lines 110b are electrically coupled to the conductors 350 through the conductive vias 120b connecting to the conductive lines 110a. In other words, the interconnect 100 provides routing function to the device layer 300 (e.g., the device 3000 or other devices (not shown) formed in/on the substrate 304). However, the disclosure is not specifically limited to the drawings of the embodiments; it is appreciated that build-up layers of the interconnect 100 may individually include a conductive horizontal (or line) portion extending along a direction X and/or a direction Y (e.g., routing lines/wire) laterally covering by a dielectric (e.g., a dielectric layer), a conductive vertical (or via) portion extending along a direction Z (e.g., routing vias) together laterally covering by a dielectric (e.g., a dielectric layer), or a conductive horizontal (or line) portion extending along the direction X and/or the direction Y (e.g., routing lines/wire) and a conductive vertical (or via) portion extending along the direction Z (e.g., routing vias) together laterally covering by a dielectric (e.g., a dielectric layer), depending on the design requirement and demand. In addition, the conductive lines 110a, 110b and the conductive vias 120b are referred to as redistribution lines or wires. The number of the build-layers of the interconnect 100 may be one, two, or more than two, depending on the design requirement and demand. In some embodiments, the interconnect 100 is formed during the back-end-of-line (BEOL) processes of the wafer W1, forming steps and materials thereof would be discussed in great details later in conjunction with FIGS. 19A and 19B. The interconnect 100 may be referred to as a frontside interconnect, a frontside interconnect structure, or a first interconnect of the wafer W1.

As shown in FIG. 4A in conjunction with FIGS. 1A, 2A and 3A, in one cell unit U, one gate structure 338 is overlapped with (e.g., across over) one respective semiconductor fin 308, and one conductor 350 not overlying (e.g., not overlapped with the source/drain regions 326 and the gate structures 338 is disposed between two adjacent semiconductor fins 308 and offset from the gate structures 338, where the conductors 350 overlying (e.g., overlapped with) the source/drain regions 326 and the gate structures 338 and the source/drain regions 326 are not shown in the top view. However, the disclosure is not limited thereto; alternatively, in one cell unit U, one gate structure 338 may be overlapped with (e.g., across over) two respective semiconductor fins 308, three respective semiconductor fins 308 (see FIG. 4B), fourth respective semiconductor fins 308 (FIG. 4C), fourth respective semiconductor fins 308 (FIG. 4D), or more respective semiconductor fins 308 (not shown). That is, the number of the semiconductor fins 308 being overlapped with one gate structure 338 can be one, two, three, fourth, or more, depending on the design requirement and demand.

Figure 19A:
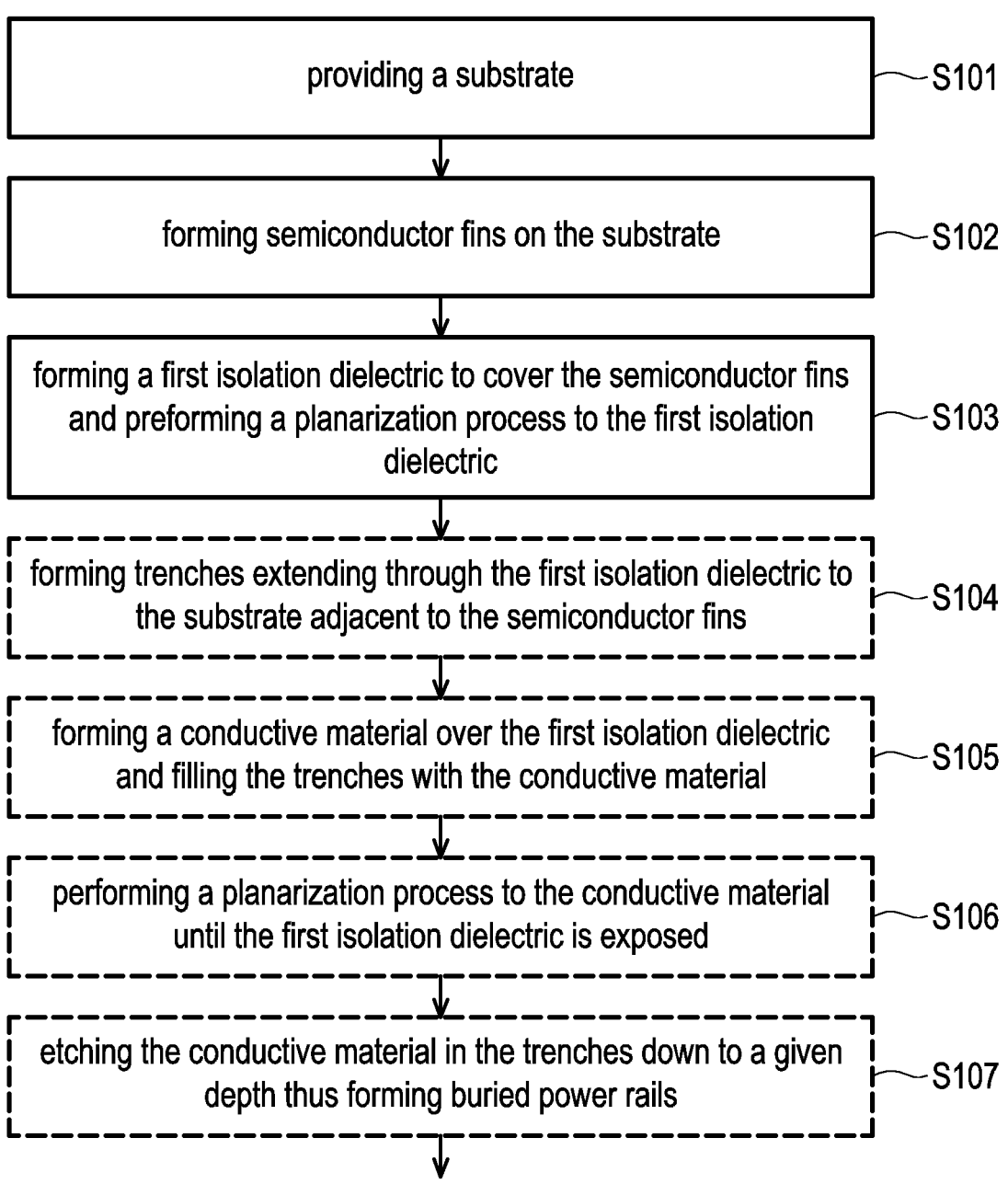

The initial structure (e.g., the wafer W1) depicted in FIGS. 1A, 2A and 3A may be manufactured by a method of FIGS. 19A and 19B including at least steps S101, S102, S103, S110, S111, S112, S113, and S114. It should be understood that additional processing may occur before, during, and after the illustrated actions of the method of FIGS. 19A and 19B to complete formation of the initial structure (e.g., the wafer W1). For example, the method shown in FIGS. 19A and 19B begins with step S101, which provides a substrate 304. In some embodiments, the substrate 304 includes or is a bulk semiconductor substrate (e.g., wafer) such as a crystalline silicon substrate, and may be doped (e.g., p-type or n-type semiconductor substrate) or undoped. In one embodiment, the semiconductor substrate 304 comprises a silicon-on-insulator substrate or a germanium-on-insulator substrate. In certain embodiments, the semiconductor substrate 304 includes one or more doped regions or various types of doped regions, where the doped regions may be configured for an n-type FET, or alternatively, configured for a p-type FET, depending on design requirements. In some embodiments, the doped regions are doped with p-type and/or n-type dopants. For example, the p-type dopants are boron, indium, aluminum, or gallium, and the n-type dopants are phosphorus or arsenic. In some embodiments, the semiconductor substrate 304 includes a semiconductor substrate made of other suitable elemental semiconductor, such as diamond or germanium; a suitable compound semiconductor, such as gallium arsenide (GaAs), silicon carbide (SiC), indium arsenide (InAs), or indium phosphide (InP); or a suitable alloy semiconductor, such as silicon-germanium (SiGe), gallium arsenic phosphide (GaAsP), or gallium indium phosphide (GaInP). In some embodiments, the semiconductor substrate 304 includes an oxide semiconductor material such as indium tin oxide (ITO). It is understood that different types of substrates, such as single-layer, multi-layered, or gradient substrates may be used. The substrate 304 may be referred to as a semiconductor substrate 304.

The method of FIGS. 19A and 19B proceeds to step S102, which forming semiconductor fins 308 on the substrate 304. Before forming the semiconductor fins 308, a first hard mask material (not shown) and a second hard mask material (not shown) may be subsequently formed on the substrate 304 in a manner of blanket layer (e.g., extending along the X-Y plane), and then the first hard mask material and the second hard mask material are patterned to form a first hard mask (including a plurality of first patterned strips) and a second hard mask (including a plurality of second patterned strips) stacked on the first hard mask along the direction Z. The first hard mask material and the second hard mask material may be made of different insulating materials. For instance, materials of the first hard mask material and the second hard mask material may be selected from a group consisting of silicon oxide, silicon nitride, silicon oxynitride and the like. A method for forming the first hard mask material and the second hard mask material may include one or more deposition processes, such as chemical vapor deposition (CVD) processes or the like. A method for patterning the first hard mask material and the second hard mask material may include a self-aligned multiple patterning process (e.g., a self-aligned double patterning (SADP) process or a self-aligned quadruple patterning (SAQP) process), which involves photolithography and etching processes. The etching may include a dry etching, a wet etching, or a combination thereof. The etching includes as an anisotropic etching process, for example. The first patterned strips of the first hard mask and the second patterned strips of the second hard mask may be together constituted hard mask structures used for defining the semiconductor fins, where the hard mask structures continuously extends along the direction X and arranged along the direction Y. The hard mask structures may be referred to as hard masks or hard mask patterns. The number of sub-layers of the hard mask structures may be one, two, or more than two sub-layers.

For example, the hard mask structures are used as mask, portions of the substrate 304 are removed to form multiple semiconductor fins 308, thereby define one semiconductor fin 308 between two adjacent first trenches (not labeled; where the isolation structures 312 located at). The semiconductor fins 308 and the first trenches are arranged along the direction Y and continuously extend along the direction X. It should be noted that the disclosure is not limited by the numbers of the semiconductor fins 308 depicted in FIGS. 1A, 2A, and 3A, which may be adjusted according to the requirements of the circuit design. When multiple semiconductor fins 308 are formed, the first trenches may be disposed between any adjacent ones of the semiconductor fins 308.

The hard mask structures may be removed from the substrate 304 during forming the semiconductor fins 308, or may be removed during the subsequently-performed etching process. In some embodiments, a cleaning process may be performed to remove native oxides of the substrate 304 and the semiconductor fins 308. The cleaning process may be performed using diluted hydrofluoric (DHF) acid or other suitable cleaning solutions.

The method of FIGS. 19A and 19B proceeds to step S103, which forming a first isolation dielectric to cover the semiconductor fins and preforming a planarization process to the first isolation dielectric; and step S110, which recessing the first isolation dielectric to form the isolation structure 312 in the first trenches. In some embodiments, the isolation structures 312 are formed by initially depositing a layer of insulation material (not shown) over the substrate 304 and covering the semiconductor fins 308 and planarizing the insulation material layer to reveal the semiconductor fins 308 (step S103); recessing the insulation material layer using an acceptable etching process, such as one that is selective to the material of the isolation structures 312, so to form the isolation structures 312 in the first trenches, where the semiconductor fins 308 protrude out of the isolation structures 312 (step S110). For example, a dry etching process is performed to form the isolation structures 312 having a relatively smooth top surfaces S312t. In alternative embodiments, a wet etching process is used. Or alternatively, a dry etching process and wet etching process are both used. The isolation structures 312 may be recessed, so that the semiconductor fins 308 protrudes from the neighboring isolation structures 312, as shown in FIGS. 1A, 2A and 3A. The illustrated top surfaces S312t of the isolation structures 312 may be a flat surface (e.g., FIGS. 1A, 2A and 3A), a curved surface such as a convex surface and a concave surface, or combinations thereof, depending on the etching process.

For example, the isolation structures 312 extend at opposing sides of a lower portion of the substrate 304. In some embodiments where multiple semiconductor fins 308 are provided, each of the isolation structures 312 is disposed between adjacent ones of the semiconductor fins 308 and covers respectively a sidewall of a lower portion of the respective semiconductor fins 308. The isolation structures 312 may be formed of an insulation material (e.g., an oxide, a Si-based oxide (e.g., SiOC, SiOCN, or the like), a nitride, the like, any other suitable material, or combinations thereof) which may electrically isolate neighboring semiconductor fins 308 from each other.

The method of FIGS. 19A and 19B now proceeds to step S111, which forming poly-gate structures (not shown) over the semiconductor fins 308. In some embodiments, an extending direction of the poly-gate structures are intersected with an extending direction of the semiconductor fins 308, and the poly-gate structures cover (e.g., in physical contact with) portions of the semiconductor fins 308 that are overlapped with the poly-gate structures. In those embodiments where the semiconductor fins 308 are arranged along the direction Y and extending along the direction X, the poly-gate structures may be arranged along the direction X and extend along the direction Y. The poly-gate structures may be referred to as dummy gate structures or sacrificial gate structures. In some embodiments, each poly-gate structure includes a dummy gate dielectric layer (not show) and a dummy gate electrode (not shown) stacked thereon along the direction Z. The dummy gate dielectric layer is conformally formed on the substrate 304 and wrapping the semiconductor fins 308, whereas the dummy gate electrode covers the dummy gate dielectric layer, and are formed to a height greater than a height of the semiconductor fins 308. In some embodiments, each poly-gate structure further includes a capping structure (not shown) lying on the dummy gate electrode. The capping structure may include a first capping layer and a second capping layer lying above the first capping layer. In some embodiments, the second capping layer has rounded top corners. The number of sub-layers of the capping structure may be one, two, or more, the disclosure is not limited thereto.

Materials of the dummy gate dielectric layer, the first capping layer and the second capping layer may respectively include silicon oxide, silicon nitride, silicon oxynitride, the like or combinations thereof, whereas a material of the dummy gate electrode may include polysilicon. In addition, methods for forming the dummy gate dielectric layer, the first and second capping layers and the dummy gate electrode may respectively include a deposition process, such as a CVD process or an atomic layer deposition (ALD) process. In each poly-gate structure, the dummy gate dielectric layer may be referred to as a dummy gate dielectric strip, a sacrificial gate dielectric layer or a sacrificial gate dielectric strip, the dummy gate electrode may be referred to as dummy gate electrode strip, a sacrificial gate electrode or a sacrificial gate electrode strip, the capping structure may be referred to as a patterned mask structure, and the first and second capping layers may be referred to as mask strips or mask patterns.

In addition, after forming the poly-gate structures, the gate spacers 318 may be formed at two opposite sides of the poly-gate structures. For example, a pair of the gate spacers 318 are disposed at two opposite sides of a respective one poly-gate structure. The gate spacers 318 may be formed by, but not limited to, globally forming a blanket layer of gate spacer material on the poly-gate structures, the semiconductor fins 308 and the isolation structure 312 exposed by the poly-gate structures; then, patterning the gate spacer material blanket layer to form the gate spacers. The patterning may include an etching process. The etching includes as an anisotropic etching process, for example. A material of the gate spacer material blanket layer may include silicon oxide, silicon nitride, silicon carbide, silicon oxynitride (SiON), silicon carbide nitride (SiCN), silicon oxycarbide (SiOC), silicon carbide oxynitride (SiOCN), the like or combinations thereof, and a method for forming the gate spacer material blanket layer may include a deposition process, such as a CVD process or an ALD process. In some embodiments, portions of the semiconductor fins 308 are exposed by the poly-gate structures and the gate spacers 318.

The method of FIGS. 19A and 19B now proceeds to step S112, which forming source/drain features over the semiconductor fins 308 next to the poly-gate structures. In some embodiments, some portions of the semiconductor fins 308 exposed by the poly-gate structures and the gate spacers 318 are removed to form second trenches (not labeled; where the source/drain regions 326 located at) exposing portions of semiconductor fins 308, where the second trenches further extend into the substrate 304, and illustrated top surfaces S304$t$ of the substrate 304 (overlapping with the second trenches) are lower than the illustrated top surfaces S312$t$ of the isolation structure 312 (FIGS. 2A and 3A). One sacrificial gate structure and a respective underlying one semiconductor fin 308 are located between two adjacent second trenches, for example. In some embodiments, the first trenches and the second trenches are spatially communicated to each other. The disclosure is not limited thereto; alternatively, the second trenches may not further extend into the substrate 304 (e.g., stop at the substrate 304), where the illustrated top surfaces S304$t$ of the substrate 304 (overlapping with the second trenches) may be substantially leveled with (e.g., substantially coplanar to) the illustrated top surfaces S312$t$ of the isolation structure 312, within process variations.

After forming the second trenches, the source/drain regions 326 are formed over the substrate 304 between the lower portion of the semiconductor fins 308, in some embodiments. In some embodiments, one source/drain region 326 is disposed between two adjacent isolation structures 312 arranged along the direction Y as shown in FIG. 2A. On the other hand, each of the semiconductor fins 308 is disposed between two adjacent source/drain regions 326 along the direction X as shown in FIG. 1A. In other words, the source/drain regions 326 are arranged in a matrix along the direction X and the direction Y, where the source/drain regions 326 and the semiconductor fins 308 are alternatively arranged along the direction X, and the source/drain regions 326 and the isolation structures 312 are alternatively arranged along the direction Y. For example, as shown in FIG. 1A, FIGS. 2A and 3A, the source/drain regions 326 are disposed on (e.g., in physical contact with) the illustrated top surface of the semiconductor substrate 304 exposed by the second trenches and further protrudes out of the illustrated top surface S312$t$ of the isolation structures 312 and the illustrated top surface S304$t$ of the semiconductor substrate 304 underlying the semiconductor fins 308. In some embodiments, illustrated top surfaces (not labeled) of the source/drain regions 326 are substantially coplanar to (e.g., leveled with) the illustrated top surfaces of the semiconductor fins 308, within process variations. Alternatively, the illustrated top surfaces of the source/drain regions 326 may be above the illustrated top surfaces of the semiconductor fins 308. Or alternatively, the illustrated top surfaces of the source/drain regions 326 may be below the illustrated top surfaces of the semiconductor fins 308.

The source/drain regions 326 may each include silicon germanium, indium arsenide, indium gallium arsenide, indium antimonide, germanium arsenide, germanium antimonide, indium aluminum phosphide, indium phosphide, any other suitable material, or combinations thereof. The source/drain regions 326 may be formed using an epitaxial layer growth process on the exposed surfaces of each of the semiconductor fins 308 (e.g., sidewalls/surface of the portions of the semiconductor fins 308 exposed by the second trenches). The material of the source/drain regions 326 may be doped with a conductive dopant. For example, a strained material is epitaxially grown with an n-type dopant (or a p-type dopant) for straining the source/drain regions 326 in the n-type region (or the p-type region). That is, the strained material is doped with the n-type dopant (or the p-type dopant) to be the source/drain regions 326 of the p-type FET (or the n-type FET). For one non-limiting example, the source/drain regions 326 include SiGe, which are epitaxial-grown with a p-type dopant for straining a p-type FET. In the case, the p-type dopant includes boron or BF$_2$, and the source/drain regions 326 are epitaxial-grown by LPCVD process with in-situ doping. For another non-limiting example, the source/drain regions 326 include SiC, which are epitaxial-grown with an n-type dopant for straining an n-type FET. In the case, the n-type dopant includes arsenic and/or phosphorus, and the source/drain regions 326 are epitaxial-grown by LPCVD process with in-situ doping.

In some embodiments, the source/drain regions 326 are grown to have substantially identical size. The source/drain regions 326 may be symmetrical to one another, as shown in FIG. 1A, FIG. 2A, and FIG. 3A. However, the disclosure is not limited thereto. Alternatively, the source/drain regions 326 may be grown to have different sizes. In some embodiments, the source/drain regions 326 located at the same side of the semiconductor fins 308 along the direction X and arranged along the direction Y may be grown to physically spacing away from each other, which may be considered as discrete pieces, as shown in FIG. 2A. Alternatively, the source/drain regions 326 located at the same side of the semiconductor fins 308 along the direction X and arranged along the direction Y may be grown to physically connected to each other, which may be together considered as an integral piece. The source/drain regions 326 may be coupled to (e.g., physically connected to) the exposed sidewalls the semiconductor fins 308 by the second trenches. As shown in FIG. 1A, FIG. 2A, and FIG. 3A, the source/drain regions 326 may be disposed as a single-layered structure. However, the disclosure is not limited thereto; alternatively, the source/drain regions 326 may be disposed as a multi-layered structure, with different layers having different degrees of doping. It should be noted that the source/drain regions 326 may have other types of configurations, while remaining within the scope of the disclosure. The source/drain regions 326 may be referred to as epitaxial structures, epitaxial layers (epi layers), strained elements, or strained structures. The source/drain regions 326 may be referred to as source/drain structures or source/drain features of the device 3000.

After formation of the source/drain regions 326, in some embodiments, the dielectric layer 328 and the ILD layer 330 are globally formed. The dielectric layer 328 includes, for example, a suitable material such as silicon nitride, silicon oxynitride, silicon nitride with oxygen or carbon elements, the like or combinations thereof. In some embodiments, the dielectric layer 328 is deposited by using processes such as CVD (e.g., high density plasma (HDP) CVD or sub-atmospheric CVD (SACVD)), ALD, molecular layer deposition (MLD), or other suitable methods. The dielectric layer 328 functions as a protection layer that effectively blocks water or moisture from penetrating into the elements underlying thereto or damages from the subsequent process(es) such as an etching process. The dielectric layer 328 may be referred to as a protection layer, an etch stop layer or a contact etch stop (CES) layer. The ILD layer 330 may be formed of a dielectric material such as silicon oxide, silicon oxide, silicon nitride, silicon oxynitride, silicon carbonitride, silicon carbide oxynitride, spin-on glass (SOG), tetraethylorthosilicate (TEOS) oxide, phosphosilicate glass (PSG), borosilicate glass (BSG), boron-doped phosphosilicate Glass (BPSG), fluoride-doped silicate glass (FSG), undoped silicate glass (USG), carbon doped silicon oxide (e.g., SiCOH), polyimide, and/or a combination thereof. In some alternative embodiments, the ILD layer 330 may include low-K dielectric materials. It should be noted that the low-k dielectric materials are generally dielectric materials having a dielectric constant lower than 3.9. Examples of low-K dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. It is understood that the ILD layer 330 may include one or more dielectric materials. In some embodiments, the ILD layer 330 is formed to a suitable thickness by CVD such as flowable chemical vapor deposition (FCVD), HDP CVD, SACVD, spin-on, sputtering, or other suitable methods.

In some embodiments, a material layer of the dielectric layer 328 may be conformally formed over the source/drain regions 326, the isolation structures 312, the poly-gate structures, the gate spacers 318, and the capping structures. Next, a material layer of the ILD layer 330 may be formed over the dielectric layer 328 and fills the second trenches. Subsequently, a planarization process (e.g., a grinding process, a chemical mechanical polishing (CMP) process, an etching process, or combinations thereof) may be performed to remove excess materials of the dielectric layer 328 and the ILD layer 330. In some embodiments, the planarization process may also remove the capping structures to expose illustrated top surfaces of the dummy gate electrodes 316 of the poly-gate structures. After the planarization process, the illustrated top surfaces of the ILD layer 330 and the dielectric layer 328 may be substantially leveled with (e.g., coplanar to) illustrated top surfaces of the poly-gate structures (e.g., the illustrated top surfaces of the dummy gate electrodes 316) and illustrated top surfaces of the gate spacers 318, within process variations.

In certain cases, parts of top portions of the poly-gate structures may also be removed during the planarization process. After the planarization process, a cleaning step may be optionally performed, for example to clean and remove the residue generated from the planarization process.

The method of FIGS. 19A and 19B now proceeds to step S113, which replacing the poly-gate structures with metal gate structures to form the device 3000 on the substrate 304. In some embodiments, after the poly-gate structures are accessibly revealed, the dummy gate electrodes and the dummy gate dielectric layers of the poly-gate structures are removed to form first recesses between a respective pair of the gate spacers 318. The removal process may include an etching process (such as a dry etching, a wet etching, or a combination thereof) or any other suitable process. During the removal process, the ILD layer 330 and the dielectric layer 328 may protect the underneath components/elements, e.g., the source/drain regions 326 and the isolation structures 312. In some embodiments, the interfacial layers 332, the gate dielectric layers 334, and the gate electrodes 336 are formed in the first recesses defined between adjacent gate spacers 318. That is, the previously shown poly-gate structures may be regarded as being replaced by the gate structures 338. Such process may be referred to as a gate replacement process. The interfacial layers 332 are lining on sidewalls and bottoms of the first recesses, for example. In the case, the gate dielectric layers 334 are lining on exposed surfaces of the interfacial layers 332, and the gate electrodes 336 fill the remainder space in these first recesses. The interfacial layers 332 may include a dielectric material such as silicon oxide layer or silicon oxynitride. In some embodiments, the interfacial layers 332 may be formed by a deposition process such as ALD, CVD, and/or other suitable deposition methods. The interfacial layers 332 may be adapted to provide a good interface between the semiconductor surface (i.e., the semiconductor fins 308) and a gate insulator (i.e., the gate dielectric layers 334) and to suppress the mobility degradation of the channel carrier of the devices 3000. A material of the gate dielectric layer 334 may include a high-k dielectric material. In some embodiments, low-k dielectric materials are generally dielectric materials having a dielectric constant greater than about 4, greater than about 12, greater than about 16, or even greater than about 20.

Examples of the high-k dielectric material may include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer 334 may be one-layer structure or a multi-layer structure of different sublayers. The gate dielectric layer 334 may be referred to as a high-k dielectric layer. A method for forming the gate dielectric layers 334 may include a deposition process, such as a CVD process or an ALD process. A material of the gate electrodes 336 may include polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. A method for forming the gate electrodes 336 may include a deposition process (e.g., a CVD process or an ALD process), a plating process (e.g., an electrical plating process or an electroless plating process) or a combination thereof. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc. Up to here, a plurality of devices 3000 included in the wafer W1 (or saying, included in one unit cell U) is manufactured.

The devices 3000 each include one of the gate structures 338, one of the semiconductor fins 308 respectively underlying this gate structure 338, and a pair of source/drain structures 326 at opposite sides of this gate structure 338. In addition, the devices 3000 each may further include a pair of the gate spacers 318 at the opposite sides of this gate structure 338. The number and configurations of the devices 3000 formed in the wafer W1 or in one unit cell U should not be limited by the embodiments or drawings of this disclosure. It is understood that the number and configurations of the devices 3000 may have different material or configurations depending on product designs. In addition, the one or more work function layer may be formed between each gate dielectric layer 334 and the overlying gate electrode 336. A material of the work function layer may include p-type work function metals or n-type work function metals. For example, the p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. For example, the n-type work function metals include Ti, Ag, TaAl, TaAlC, TiAlN, TaC, TaCN, TaSiN, Mn, Zr, other suitable n-type work function materials, or combinations thereof. In some embodiments, the method of forming the work function layer includes performing at least one suitable deposition technique, such as CVD (e.g., PECVD), ALD (e.g., remote plasma atomic layer deposition (RPALD), plasma enhanced atomic layer deposition (PEALD), molecular beam deposition (MBD), or the like. The work function layer may serve the purpose of adjusting threshold voltage (Vt) of the devices 3000.

In some embodiments, the ILD layer 340 is formed over the devices 3000. For example, the ILD layer 340 is disposed on the devices 3000 and extends onto the illustrated top surfaces of the ILD layer 330 and the dielectric layer 328. The formation and material of the ILD layer 340 is similar to or substantially identical to the formation and material of the ILD layer 330 as previously described, and thus are not repeated herein for brevity. Thereafter, a plurality of first through openings (not labeled; where the contact plugs 344 located at) may be formed in the ILD layer 340 and further extend into the ILD layer 330 and the dielectric layer 328 to expose (e.g., accessibly reveal) portions of the source/drain regions 326, as shown in FIG. 1A, FIG. 2A, and FIG. 3A. The first through openings may be formed by patterning the ILD layer 340, the ILD layer 330 and the dielectric layer 328 with lithography and etching processes. The etching process may include a dry etching, a wet etching, or a combination thereof. For example, side-walls of the first through openings are vertical sidewalls. Alternatively, the sidewalls of the first through openings may be slant sidewalls or step-side sidewalls.

In some embodiments, after forming the first through openings in the ILD layer 340, the ILD layer 330 and the dielectric layer 328, the barrier layer or adhesive layers 342 lines sidewalls of the first through openings, and the contact plugs 344 are formed to fill the first through openings to couple with (directly connect to) the source/drain regions 326 at bottoms of the first through openings. In some embodiments, the contact plugs 344 may include ruthenium (Ru), cobalt (Co), copper (Cu), titanium (Ti), titanium nitride (TiN), tantalum (Ta), tantalum nitride (TaN), molybdenum (Mo), nickel (Ni), a combination of thereof, or the like. The contact plugs 344 may be formed by, for example, plating such as electroplating or electroless plating, CVD such as PECVD, ALD, and physical vapor deposition (PVD), a combination thereof, or the like. The additional barrier layer or adhesive layers 342 may include Ti, TiN, Ta, TaN, a combination thereof, a multilayer thereof, or the like, and may be formed using CVD, ALD, PVD, a combination thereof, or the like. Owing to the additional barrier layer or adhesive layers 342, it is able to ensure the adhesion between the contact plugs 344 and the ILD layer 340, between the contact plugs 344 and the ILD layer 330, and between the contact plugs 344 and the dielectric layer 328. In one embodiment, the additional barrier layer or adhesive layer 342 may be omitted.

Seed layers (not shown) may be optionally formed before forming the contact plugs 344 to line sidewalls and illustrated bottoms of the first through openings and after forming the barrier layer or adhesive layers 342. In some embodiments, each of the seed layers is a metal layer, which may be a single layer or a composite layer comprising a plurality of sub-layers formed of different materials. The seed layers are formed using, for example, PVD or the like. In one embodiment, the seed layers may be omitted. In an alternative embodiment of which the seed layers are included, the additional barrier layer or adhesive layer 342 is interposed between the seed layer and the ILD layer 340, between the seed layer and the ILD layer 330 and between the seed layer and the dielectric layer 328, where the seed layers are interposed between the contact plugs 344 and the additional barrier layer or adhesive layer 342. In the embodiments of the seed layers are included, owing to the additional barrier layer or adhesive layer 342, it is able to prevent the seed layer and/or the contact plugs 344 from diffusing to the underlying layers and/or the surrounding layers.

In some embodiments, the dielectric layer 346 is formed on the contact plugs 344, the dielectric layer 348 is then formed atop the dielectric layer 346, and the conductors 350 is formed in a plurality of second through openings (not labeled) penetrating the dielectric layer 348, the dielectric layer 346 and the ILD layer 340 and in a plurality of third through openings (not labeled) penetrating the dielectric layer 348 and the dielectric layer 346. The conductors 350 are physically spacing away from each other, in some embodiments. The conductors 350 formed in the second through openings are laterally covered by the ILD layer 340, the dielectric layer 346 and the dielectric layer 348, and the conductors 350 formed in the third through openings are laterally covered by the dielectric layer 346 and the dielectric layer 348, where illustrated top surfaces (not labeled) of the conductors 350 are accessibly revealed by the dielectric layer 348 for electrical connection with later-formed elements, such as conductive features in a later-formed interconnect or interconnection structure. The conductors 350 may be referred to as contact vias, metallization vias, metal vias, or metallic vias. The illustrated top surfaces of the conductors 350 may be substantially leveled with the illustrated top surface of the dielectric layer 348, as shown in FIG. 1A, FIG. 2A, and FIG. 3A, within process variations. In the case, the illustrated top surface of the conductors 350 are substantially coplanar to the illustrated top surface of the dielectric layer 348. For example, the conductors 350 formed in the second through openings are electrically connected to the gate electrodes 336 of the gate structure 338. For example, some of the conductors 350 formed in the third through openings are electrically connected to the contact plugs 344 connected to the source/drain regions 326, and the rest of the conductors 350 formed in the third through openings are electrically coupled to later-formed elements (e.g., 360 and 370 depicted in FIGS. 2F and 3F, interconnects, or the like). The conductors 350 electrically connected to the contact plugs 344 connected to the source/drain regions 326 may be referred to as source/drain contacts (e.g., the conductors 350 disposed between two adjacent gate electrodes 336 depicted in FIGS. 1A, 2A, and 3A), and the conductors 350 electrically connected to the gate electrodes 336 of the gate structure 338 may be referred to as gate contacts (e.g., the conductors 350 overlapped with the gate electrodes 336 depicted in FIG. 1A). Up to here, the device layer 300 is manufactured.

The dielectric layer 346 may be referred to as a protection layer, an etch stop layer or a contact etch stop (CES) layer. In some embodiments, a material of the dielectric layer 346 includes SiC, LaO, AlO, AlON, ZrO, HfO, SiN, ZnO, ZrN, ZrAlO, TiO, TaO, YO, TaCN, ZrSi, SiOCN, SiOC, SiCN, LaO, or SiO. The dielectric layer 346 may be formed to a suitable thickness by suitable fabrication techniques such as spin-on coating, CVD, PECVD, or the like. The dielectric layer 348 may be referred to as an ILD layer. In some embodiments, a material of the dielectric layer 348 includes SiC, LaO, AlO, AlON, ZrO, HfO, SiN, ZnO, ZrN, ZrAlO, TiO, TaO, YO, TaCN, ZrSi, SiOCN, SiOC, SiCN, LaO, or SiO. The dielectric layer 348 may be formed to a suitable thickness by suitable fabrication techniques such as spin-on coating, CVD, PECVD, or the like. In some embodiments, the material of the dielectric layer 346 is different from the material of the dielectric layer 348.

In some embodiments, a material of the conductors 350 includes Co, W, Ru, Al, Mo, Ti, or Cu. The conductors 350 may be formed by plating such as electroplating or electroless plating; CVD such as PECVD; ALD; PVD; a combination thereof; or the like. In addition, seed layers (not shown) may be optionally formed before forming the conductors 350 to line the illustrated bottom surfaces and sidewalls of the second and third through openings for wrapping the bottoms and outer sidewalls of the conductors 350. In some embodiments, each of the seed layers is a metal layer, which may be a single layer or a composite layer comprising a plurality of sub-layers formed of different materials. The seed layers are formed using, for example, PVD or the like. In one embodiment, the seed layers may be omitted.

The method of FIGS. 19A and 19B now proceeds to step S114, which forming the interconnect to connect the devices 3000. In some embodiments, the interconnect 100 may be formed over the device layer 300 to be connected to the conductors 350 for electrically coupling to the devices 3000. The interconnect 100 may include the conductive lines 110a, 110b, the conductive vias 120b and the dielectric layers 130a, 130b. The interconnect 100 is electrically connected to the devices 3000 through the conductors 350 and the contact plugs 344 for providing routing functions to the device layer 300, for example. As shown in FIGS. 1A, 2A, and 3A, the conductive layers 110a, 110b may be connected and electrically coupled to each other through the conductive vias 120b, and the conductive layer 110a may be connected and electrically coupled to the conductors 350, so to provide routing function to the devices 3000. The formation and material of each of the conductive layers 110a, 110b and the conductive vias 120b are similar to or substantially identical to the formation and material of the conductors 350, the formation and material of the dielectric layers included in the stack 130 are similar to or substantially identical to the formation and material of the dielectric layer 348, and thus are not repeated herein for brevity. Up to here, the interconnect 100 is manufactured. The interconnect 100 may incudes one or more than one first build-up layer and one or more than one second build-up layer alternatively stacked along the direction Z.

Up to here, the wafer W1 is manufactured, where the wafer W1 includes the device layer 300 and the interconnect 100 disposed on and electrically coupled to the front side of the device layer 300. The interconnect 100 may be referred to as a front-side interconnect, a front-side interconnection, or a front-side interconnection structure to provide routing functions to the devices 3000 and/or other devices (e.g., resistor, memory, capacitor, or the like) formed underneath thereto.

Figure 1B:
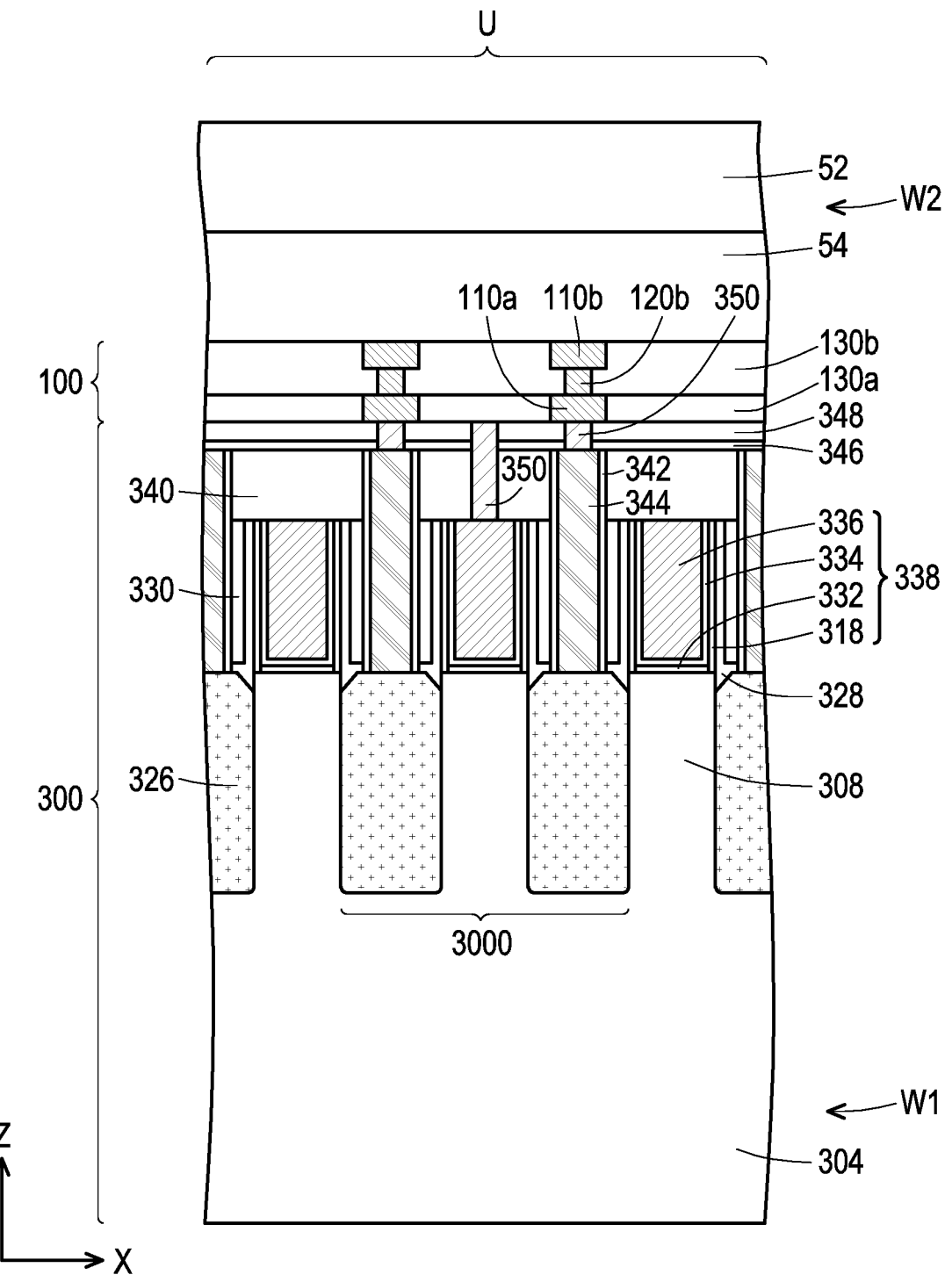
Figure 2B:
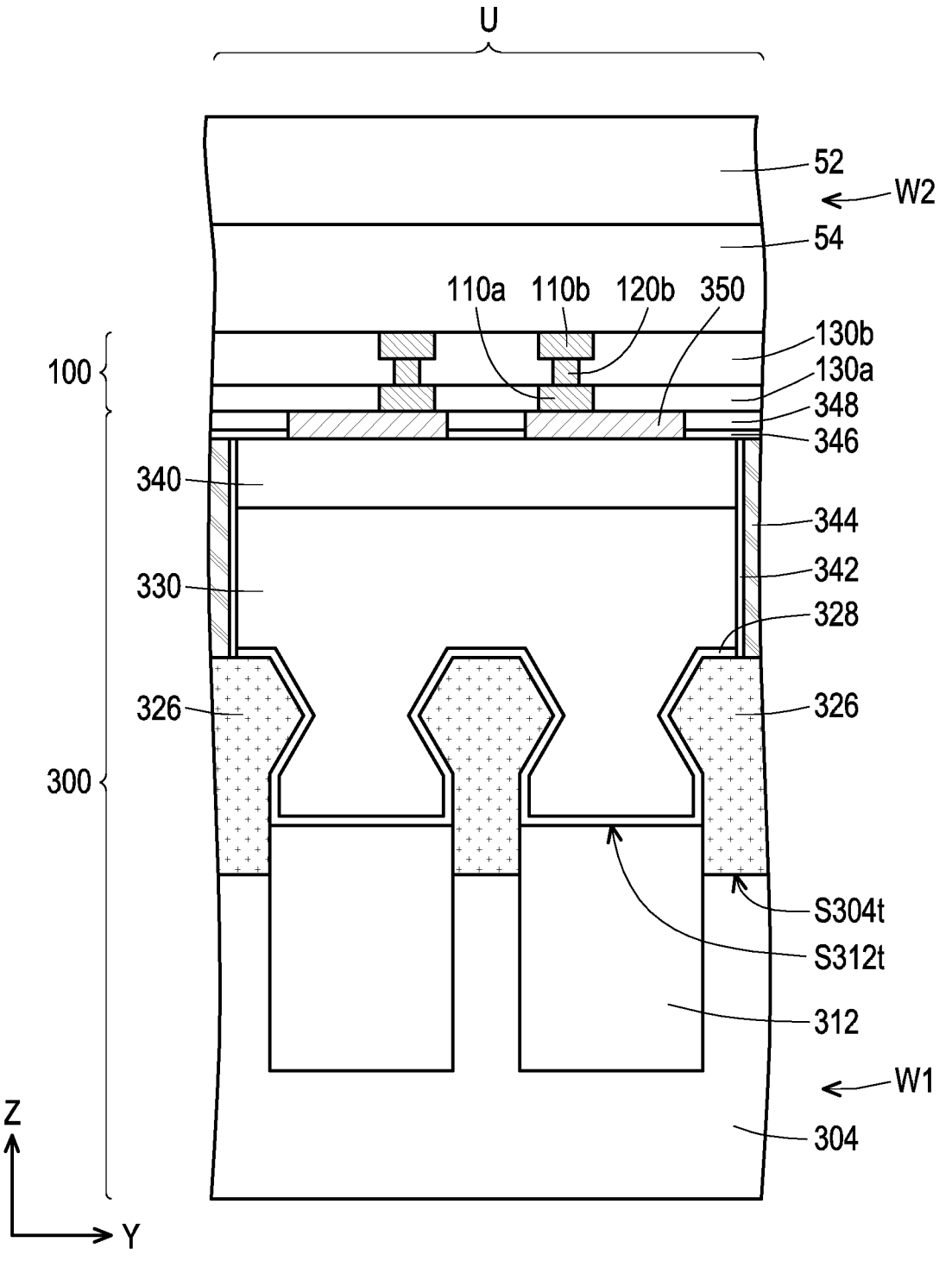
Figure 3B:
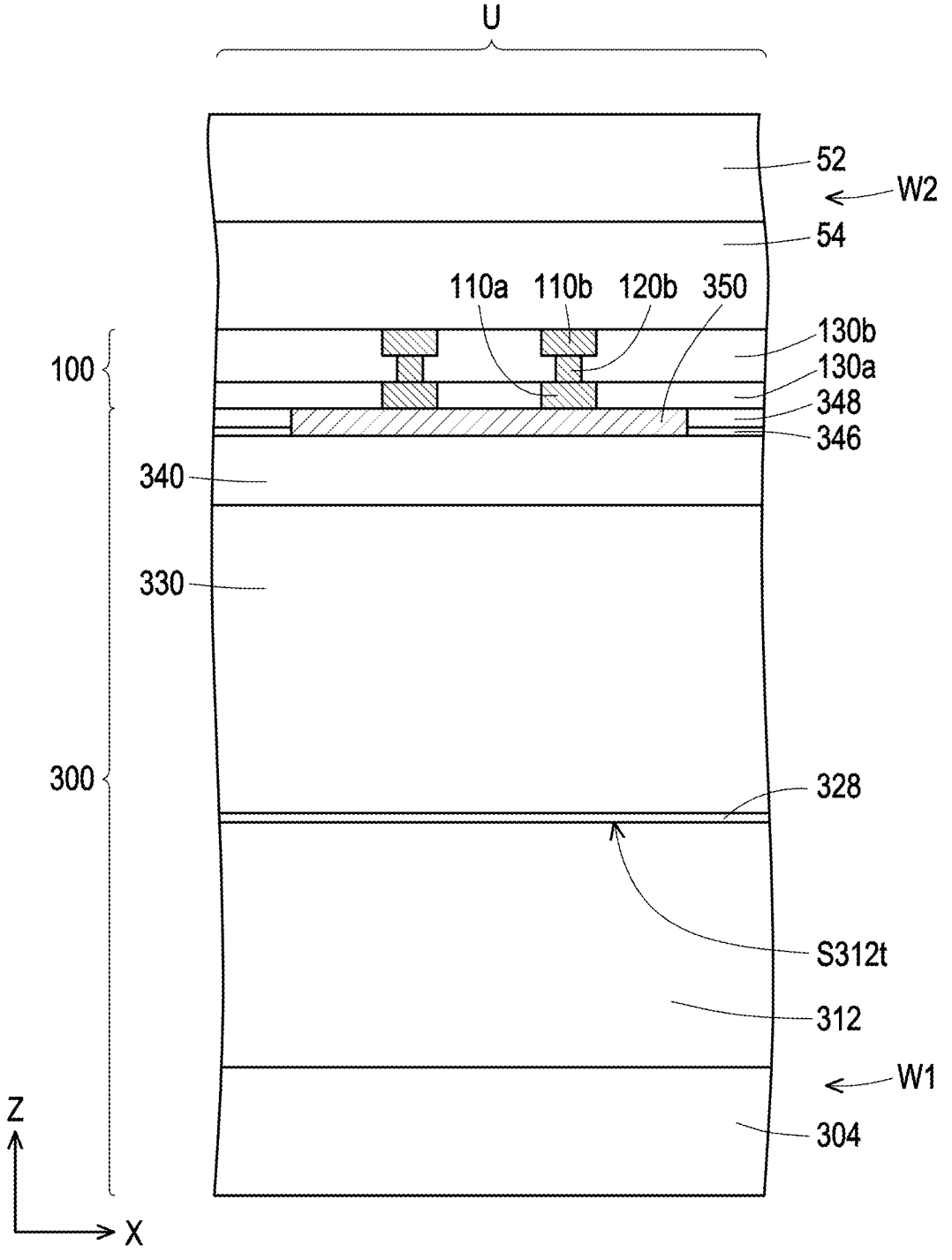

Referring to FIGS. 1B, 2B, and 3B, in some embodiments, the initial structure is bonded to a carrier, in accordance with a step S200 of the method depicted in FIG. 17. For example, the carrier is or include a wafer W2 that includes a temporary carrier 52 and a debond layer 54 disposed thereon. In some embodiments, the temporary carrier 52 is placed on and adhered to the interconnect 100 of the wafer W1. In some embodiments, the temporary carrier 52 is a glass carrier or any suitable carrier for carrying a semiconductor wafer or a reconstituted wafer for the manufacturing method of the semiconductor structure SS1 (e.g., semiconductor wafer, semiconductor device, component, die, or chip). In some embodiments, the temporary carrier 52 is coated with the debond layer 54. The material of the debond layer 54 may be any material suitable for bonding and debonding the temporary carrier 52 from the layer(s) or any wafer(s) disposed underneath thereto.

In some embodiments, the debond layer 54 includes a dielectric material layer made of a dielectric material including any suitable polymer-based dielectric material (such as BCB, polybenzoxazole (PBO)). In an alternative embodiment, the debond layer 104 includes a dielectric material layer made of an epoxy-based thermal-release material, which loses its adhesive property when heated, such as a light-to-heat-conversion (LTHC) release coating film. In a further alternative embodiment, the debond layer 54 includes a dielectric material layer made of an ultra-violet (UV) glue, which loses its adhesive property when exposed to UV lights. The debond layer 54 may be dispensed as a liquid and cured, may be a laminate film laminated onto the temporary carrier 52, or may be the like. In certain embodiments, the debond layer 54 is a LTHC layer with good chemical resistance, and such layer enables room temperature debonding from the temporary carrier 52 by applying laser irradiation, however the disclosure is not limited thereto.

Figure 1C:
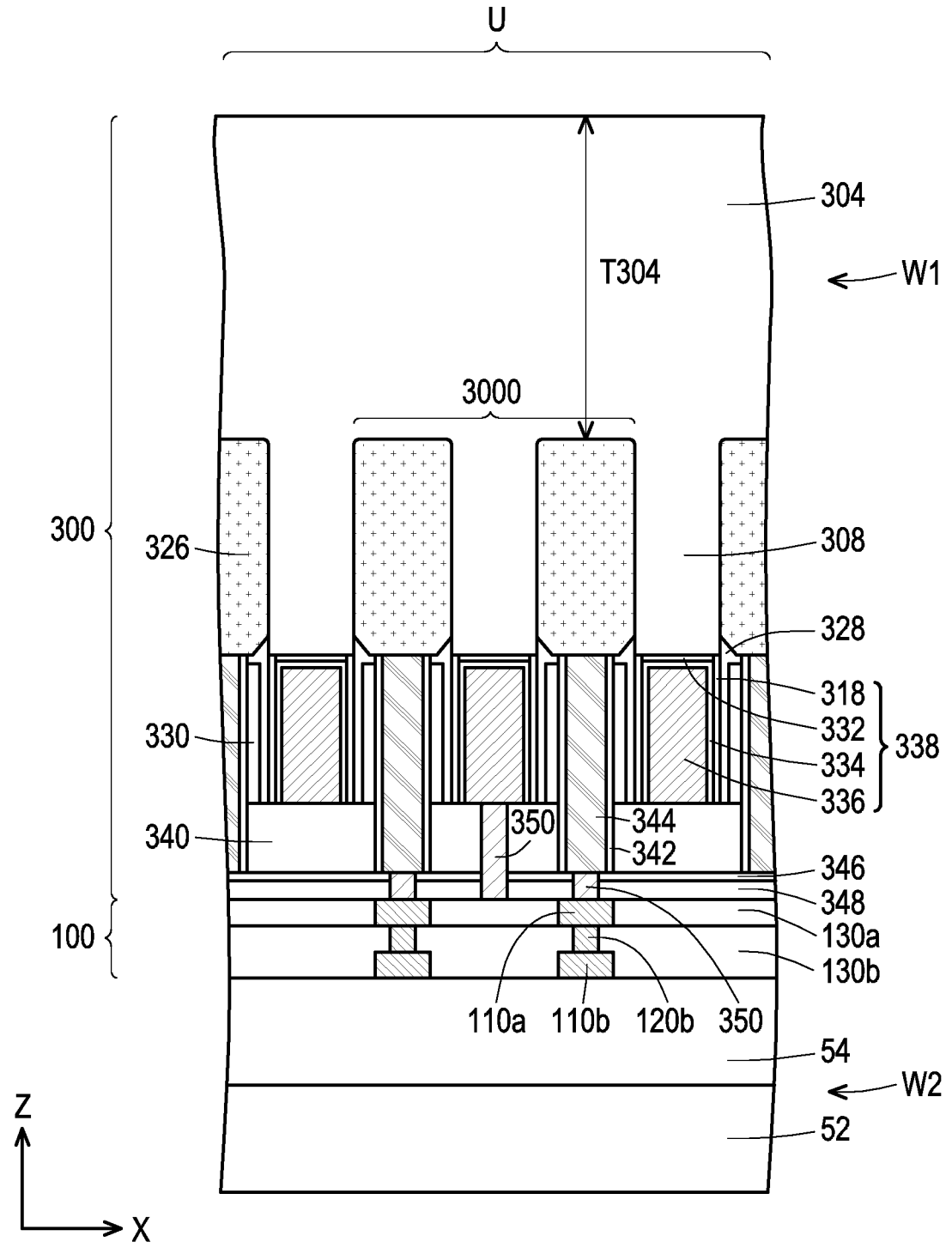
Figure 2C:
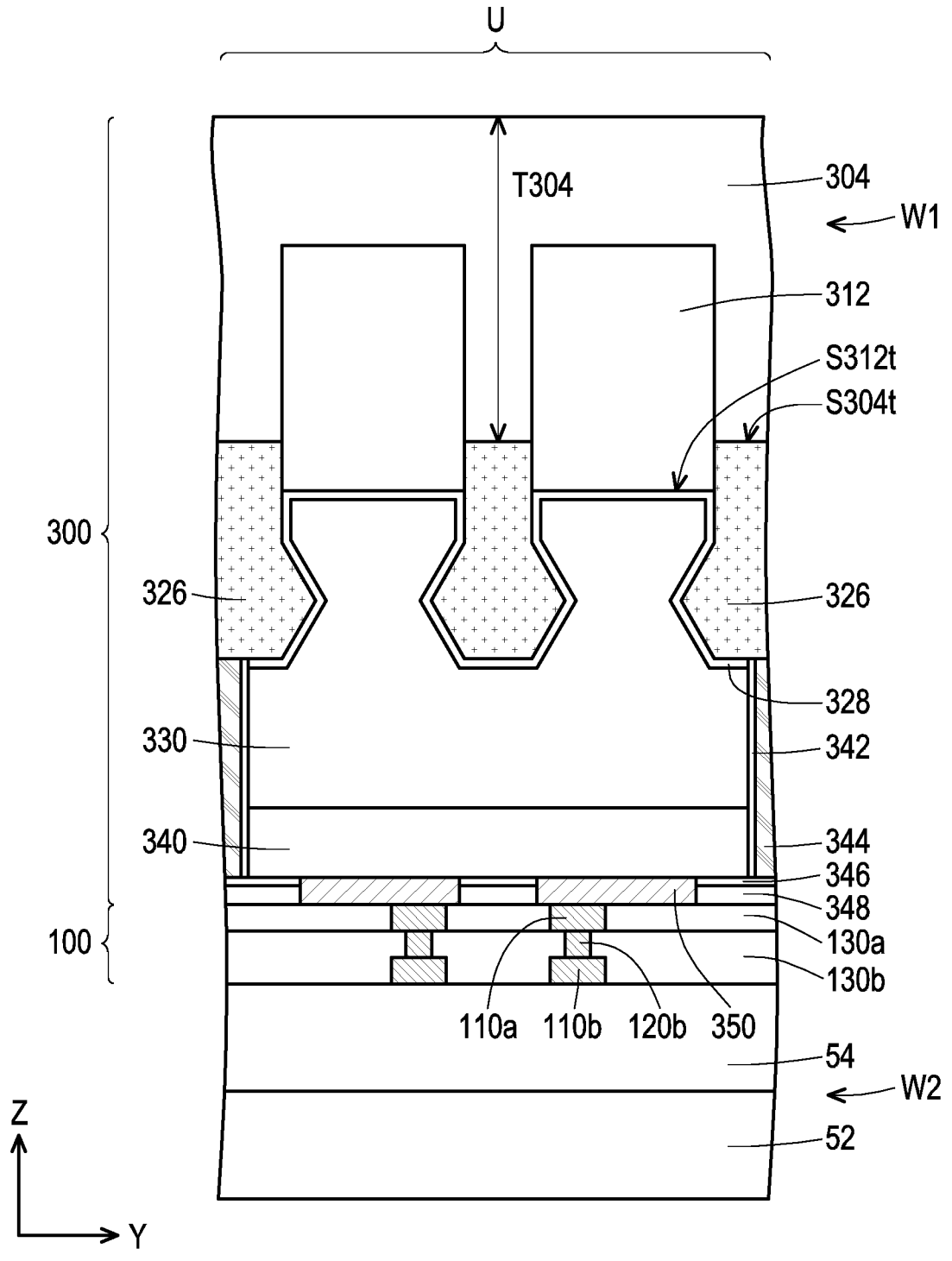
Figure 3C:
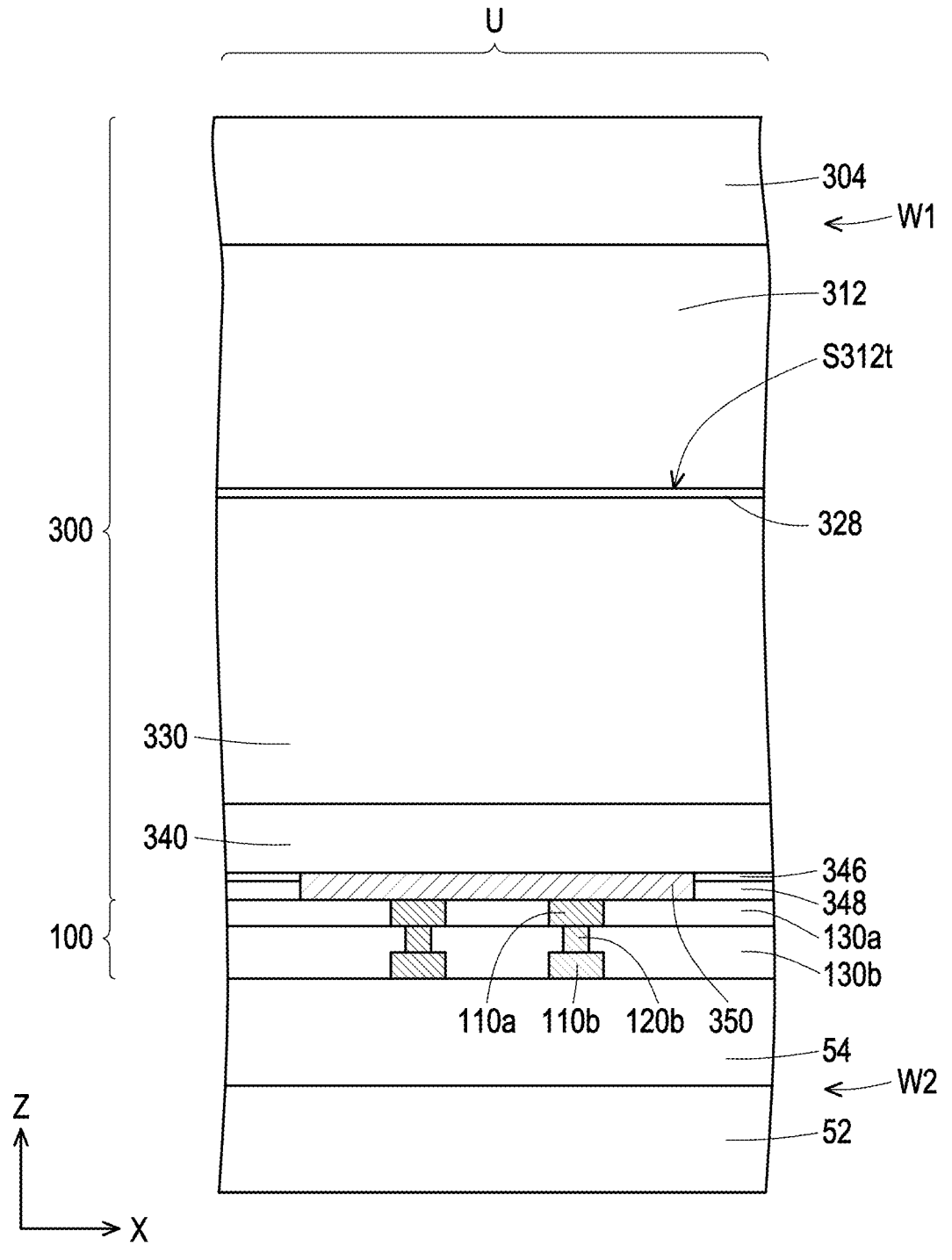

Referring to FIGS. 1C, 2C, and 3C, in some embodiments, the whole structure depicted in FIGS. 1B, 2B, and 3B is flipped (turned upside down). For example, a rear surface (not label; which is opposite to a front surface where disposed with the interconnect 100) of the substrate 304 of the wafer W1 is facing upwards and accessibly revealed. In some embodiment, a thickness T304 of the substrate 304 is approximately in a range of 100 μm to 1000 μm. For example, the thickness T304 of the substrate is 500 μm.

Figure 1D:
Figure 2D:
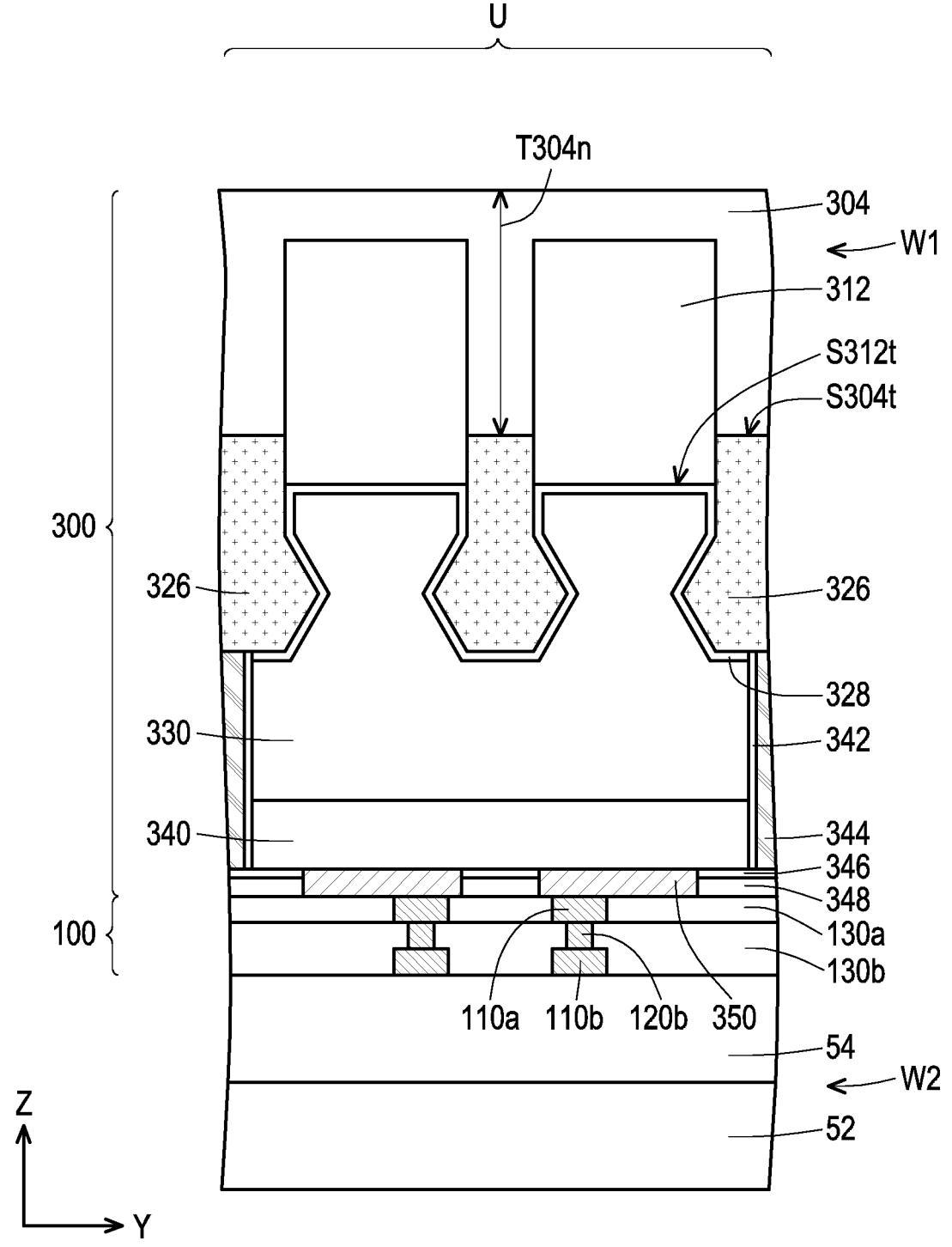
Figure 3D:
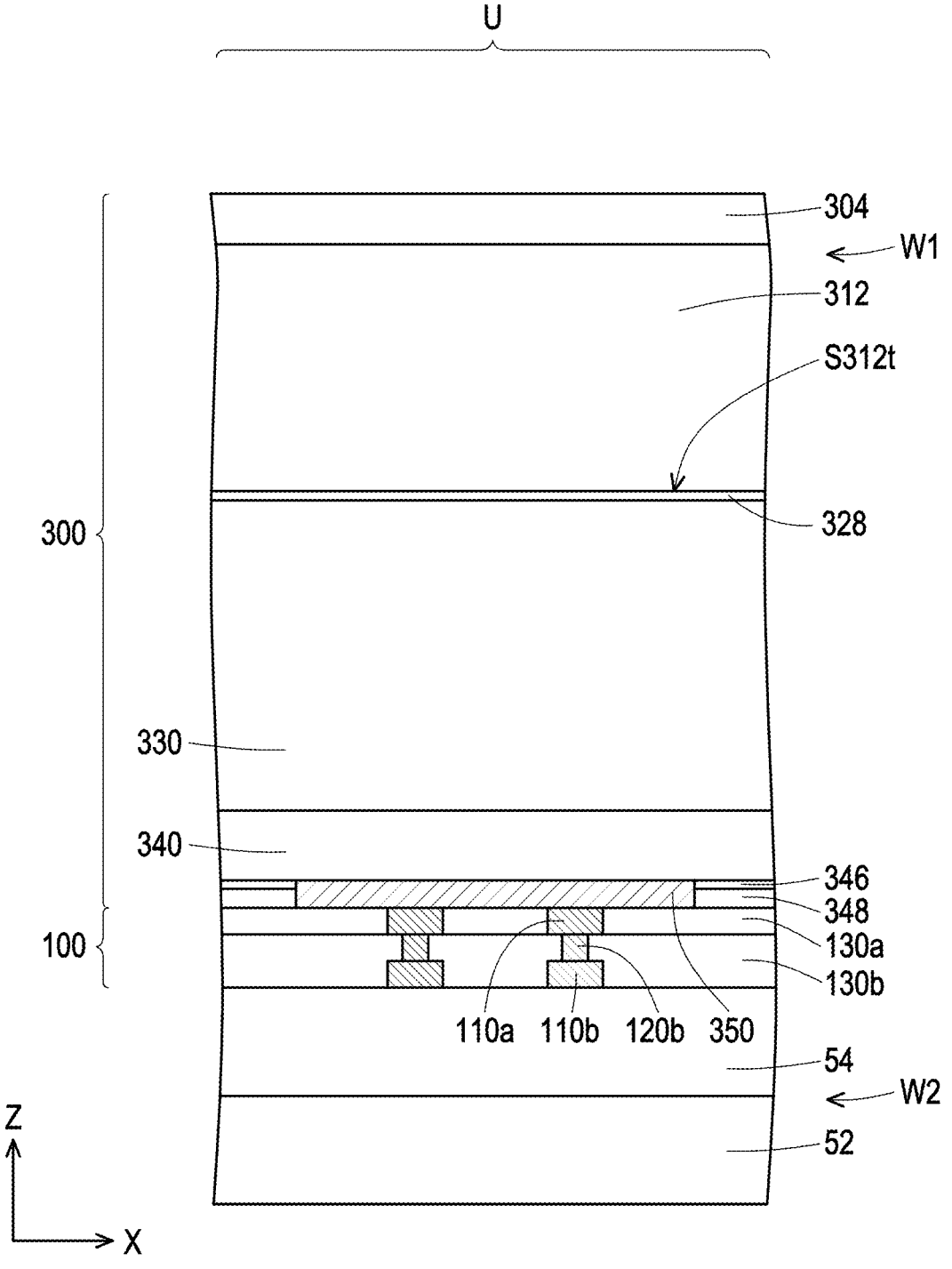

Referring to FIGS. 1D, 2D, and 3D, in some embodiments, the substrate of the initial structure is thinned, in accordance with a step S300 of the method depicted in FIG. 17. In some embodiments, a planarizing step is performed on the rear surface of the substrate 304 facing upwards. In some embodiments, a thinned thickness T304$n$ of the substrate 304 may approximately range from about 5 μm to about 500 μm. For example, the thinned thickness T304$n$ of the substrate is 50 μm. In some embodiments, the planarizing step may include a grinding process, a chemical mechanical polishing (CMP) process, an etching process, or combinations thereof. The etching process may include a dry etching, a wet etching, or a combination thereof. However, the disclosure is not limited thereto, and the planarizing step may be performed through any other suitable method. After the planarizing step, a cleaning step may be optionally performed, for example to clean and remove the residue generated from the planarizing step.

Figure 1E:
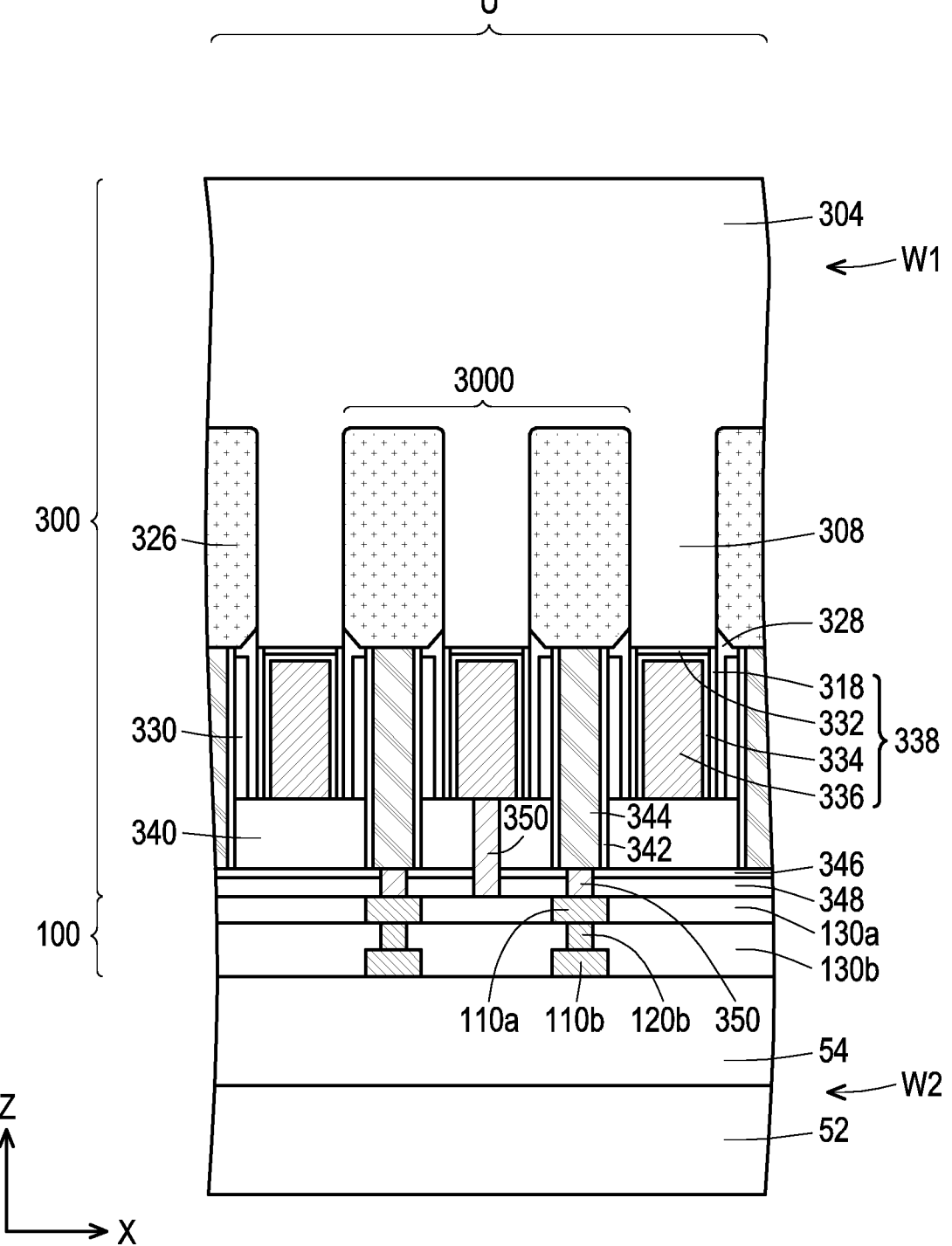
Figure 2E:
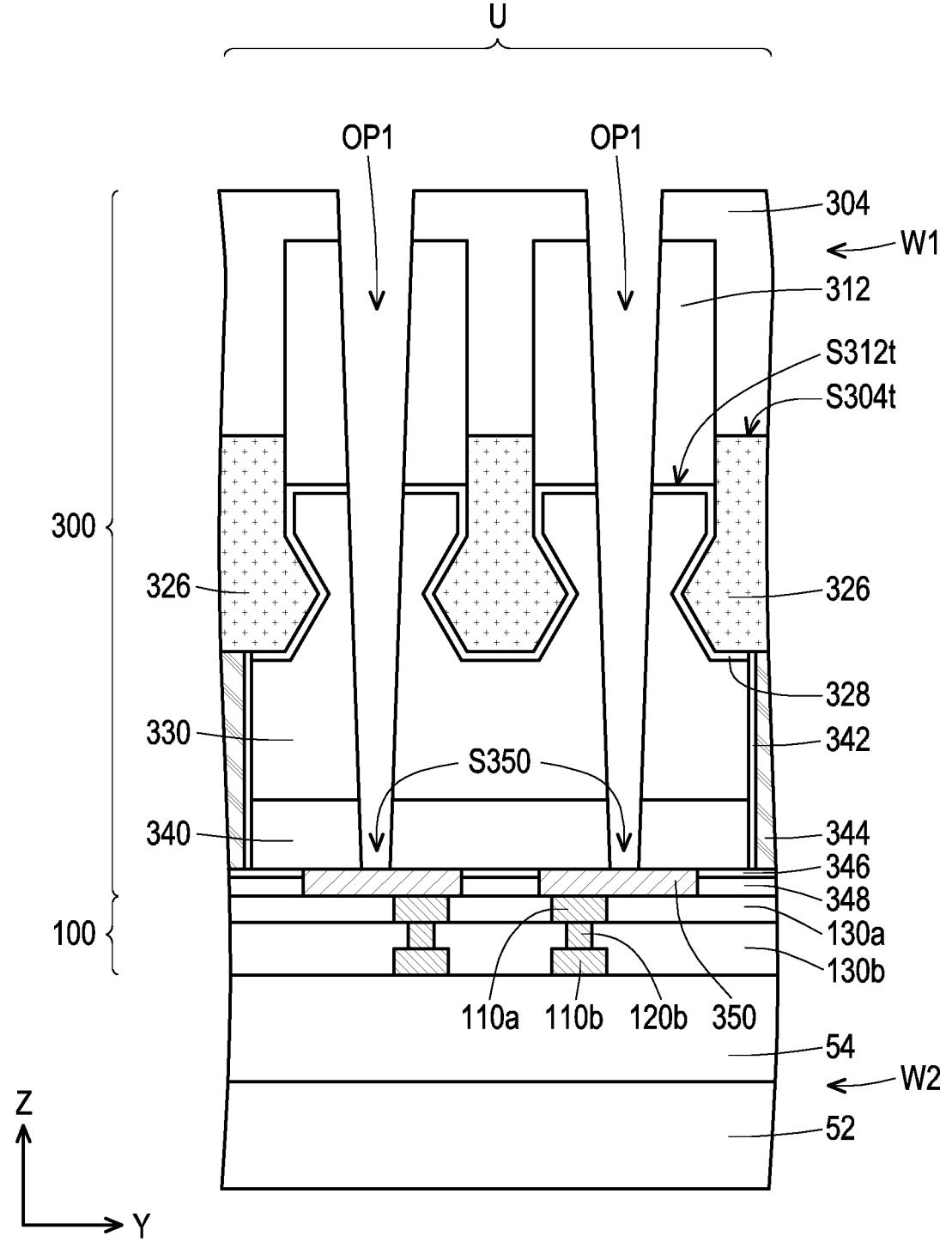
Figure 3E:
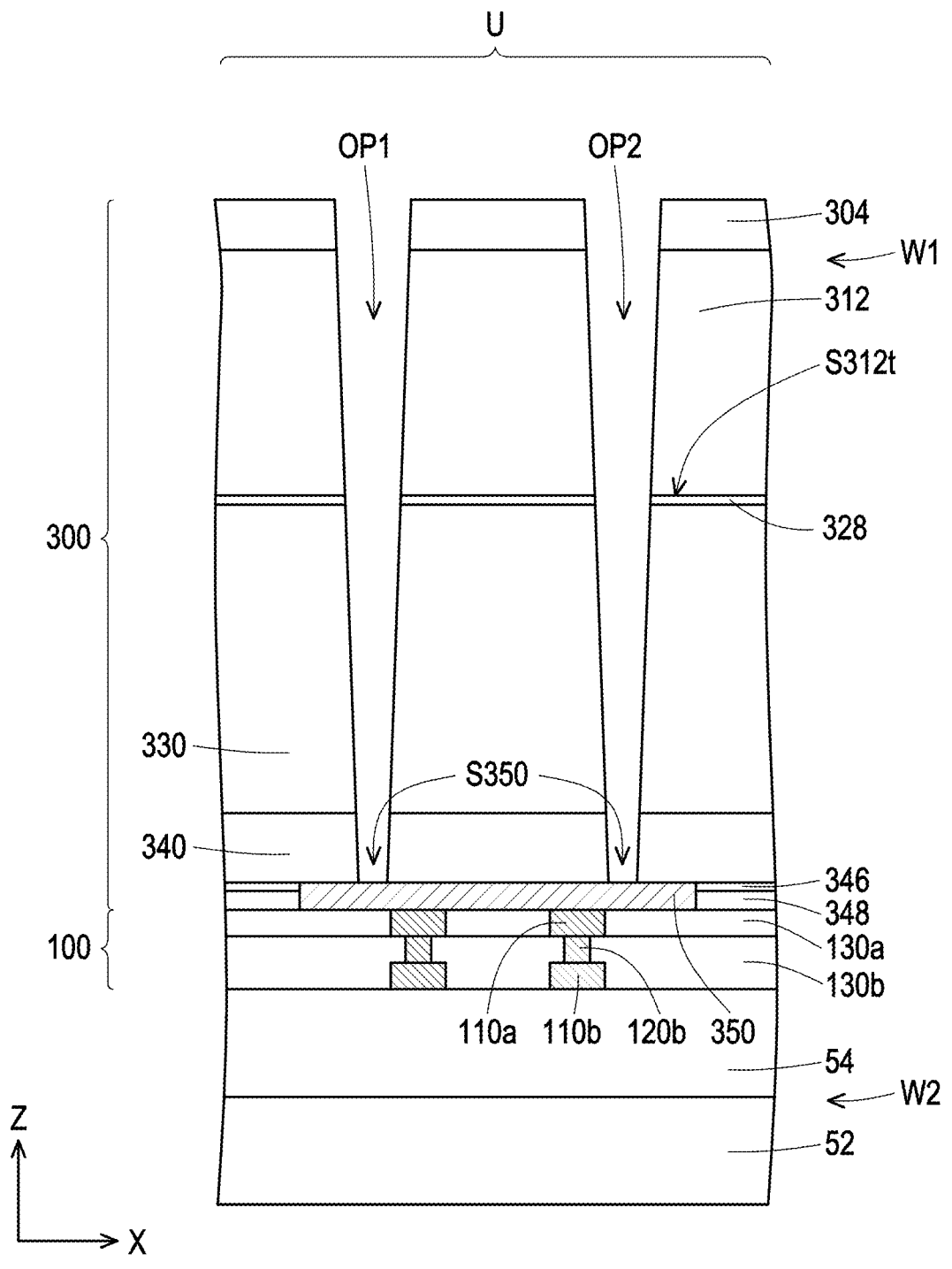

Referring to FIGS. 1E, 2E, and 3E, in some embodiments, a first through silicon via (TSV) opening and a second TSV opening are formed to penetrate through the substrate until reaching a conductor formed in the initial structure, in accordance with a step S400 of the method depicted in FIG. 17. In some embodiments, at least one first TSV opening OP1 and at least one second TSV opening OP2 are formed through the substrate 304 until reaching some of the conductors 350 that may or may not be connected to power or ground. For example, the at least one first TSV opening OP1 includes a plurality of first TSV openings OP1 and the at least one second TSV opening OP2 includes a plurality of second TSV openings OP2, as shown in FIGS. 2E and 3E in conjunction with FIG. 5A. The number of the first TSV openings OP1 and the number of the second TSV openings OP2 should not limited to the embodiments of the disclosure, and may be any number depending on the design requirement and demand.

In formations of the first TSV openings OP1 and the second TSV openings OP2, a hard mask layer (not shown) is formed over the rear surface of the substrate 304 followed by forming a patterned photoresist layer (not shown) thereon. The hard mask layer may be a silicon nitride layer, a silicon oxynitride layer or the like by way of example but not limitation. The photoresist layer is patterned by exposure, bake, developing, and/or other photolithography processes to provide a plurality of openings exposing the hard mask layer. The exposed hard mask layer is then etched, by a wet etch or dry etch process, using the patterned photoresist layer as a masking element to provide an opening. Using the hard mask layer and the patterned photoresist layer as mask elements (e.g., an etching mask), an etching process is performed to etch the exposed substrate 304, forming the first TSV openings OP1 and the second TSV openings OP2 passing through the substrate 304. The conductors 350 (depicted in FIGS. 2E and 3E) may also act as an etch stop layer for etching the substrate 304 until surface S350 of the conductors 350 (depicted in FIGS. 2E and 3E) are exposed. Because the first TSV openings OP1 and the second TSV openings OP2 are formed simultaneously, a bottom of each of the first TSV opening OP1 may be substantially leveled with a bottom of each of the second TSV openings OP2, and may be substantially leveled with the surfaces S350 of the conductors 350 exposing by the first TSV openings OP1 and the second TSV openings OP2, as shown in FIG. 2E and FIG. 3E, within process variations.

In some embodiments, the first TSV openings OP1 and the second TSV openings OP2 may be etched using any suitable etching method including, for example, a plasma etch, a chemical wet etch, a laser drill, and/or other processes. In some embodiments, the etching process includes a deep reactive ion etching (RIE) process to etch the substrate 304. The etching process may be such that the first TSV openings OP1 and the second TSV openings OP2 is etched from the rear surface of the substrate 304 of the wafer W1 to reach approximately from tens of micron to hundreds of micron in depth. In some embodiments, the etching process may result in a series of etched macro-scallops on the substrate 304 adjacent to a sidewall of the first TSV openings OP1 and the second TSV openings OP2. The micro-scallop sidewalls will be smoothened in subsequent process. The micro-scallop sidewalls may be smoothened in subsequent thermal oxidation process. For example, as shown in FIGS. 2E and 3E, the sidewalls of the first TSV openings OP1 and the second TSV openings OP2 are substantially planar, slant sidewalls. Alternatively, the sidewalls of the first TSV openings OP1 and the second TSV openings OP2 are substantially planar, vertical sidewalls.

By way of example but not limitation, the first TSV openings OP1 and the second TSV openings OP2 has a depth in a range from about 1 μm to about 500 μm, and a diameter in a range from about 0.1 μm to about 100 μm. By way of example but not limitation, the first TSV openings OP1 and the second TSV openings OP2 individually have an aspect ratio in a range from about 10 to about 1000. In some embodiments, the first TSV openings OP1 and the second TSV openings OP2 each have a square plan-view profile (or top-view profile) as shown in FIGS. 5A, 5B, 5C, and 5D, with a size less than the size of the conductors 350 exposed therefrom. Alternatively, the first TSV openings OP1 and the second TSV openings OP2 may have a circular plan-view profile, a rectangular plan-view profile, an elliptical plan-view profile, an oval plan-view profile, or a polygonal plan-view profile, etc. The disclosure is not limited thereto.

As shown in FIG. 5A, for example, the first TSV openings OP1 are arranged along the direction Y and separated from each other, and the second TSV openings OP2 are arranged along the direction Y and separated from each other, where a pair of one first TSV opening OP1 and one second TSV opening OP2 are arranged along the direction X and connected to a same conductor 350. In the case, two adjacent conductors 350 are separated from each other by one gate structure 338 covering one semiconductor fin 308, see FIG. 5A. However, the disclosure is not limited thereto; alternatively, in one cell unit U, two adjacent conductors 350 are separated from each other by one gate structure 338 covering two semiconductor fins 308 (FIG. 5B), one gate structure 338 covering three semiconductor fins 308 (FIG. 5C), one gate structure 338 covering fourth semiconductor fins 308 (FIG. 5D), or one gate structure 338 covering more than fourth semiconductor fins 308 (not shown).

In addition, a plurality of third TSV openings (not shown) are formed to penetrate through the substrate 304 to expose at least one of the source/drain regions 326 formed in the device layer 300, the conductors 350 formed in the device layer 300, or the conductive lines 110a formed in the interconnect 110 for further routing functions. The formation of the third TSV openings are similar to or substantially identical to the forming process of the first TSVs openings OP1 and/or the second TSVs openings OP2 as previously described, and thus are not repeated herein for brevity. In some embodiments, the third TSV openings are separated from each other.

Figure 1F:
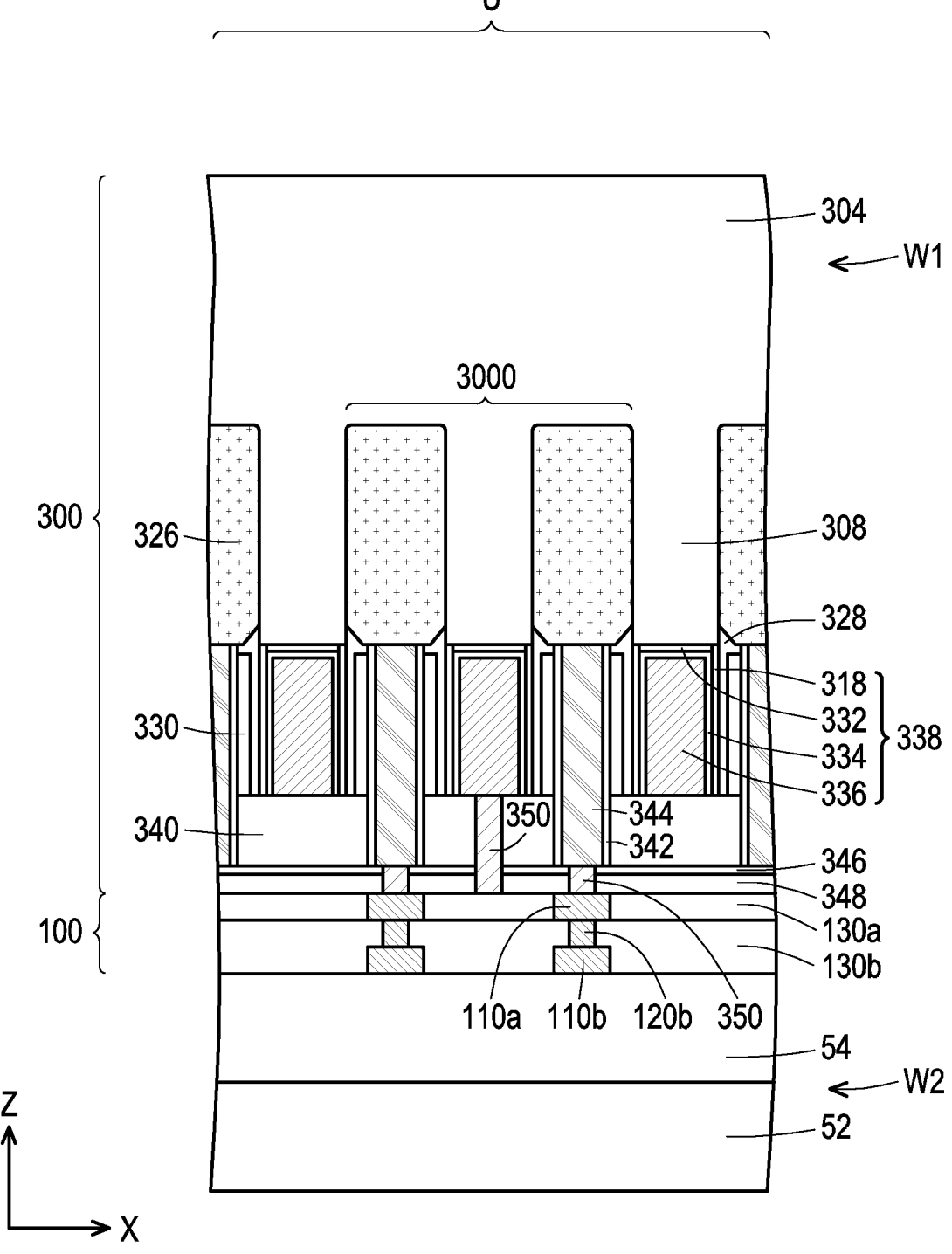
Figure 2F:
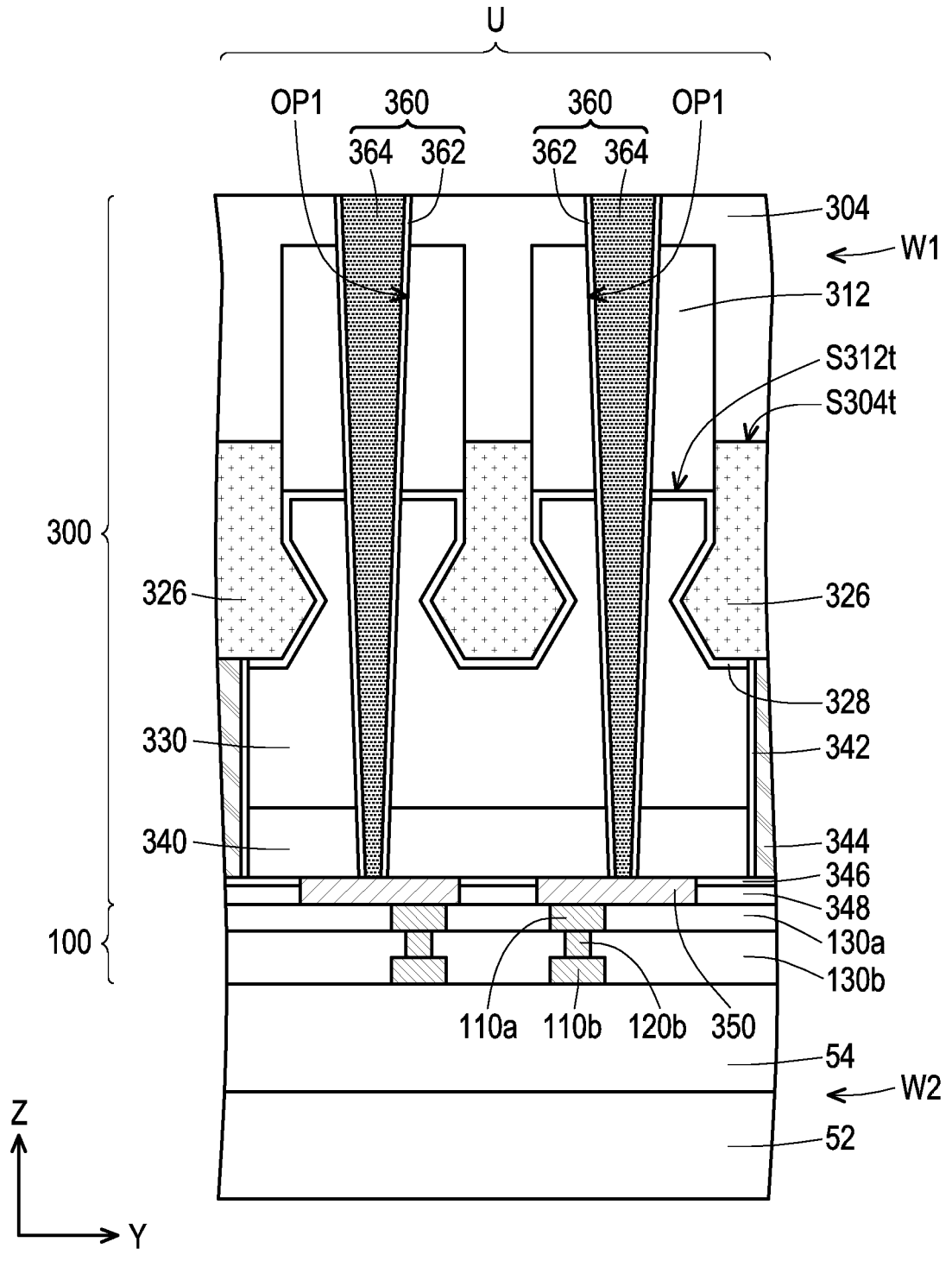
Figure 3F:
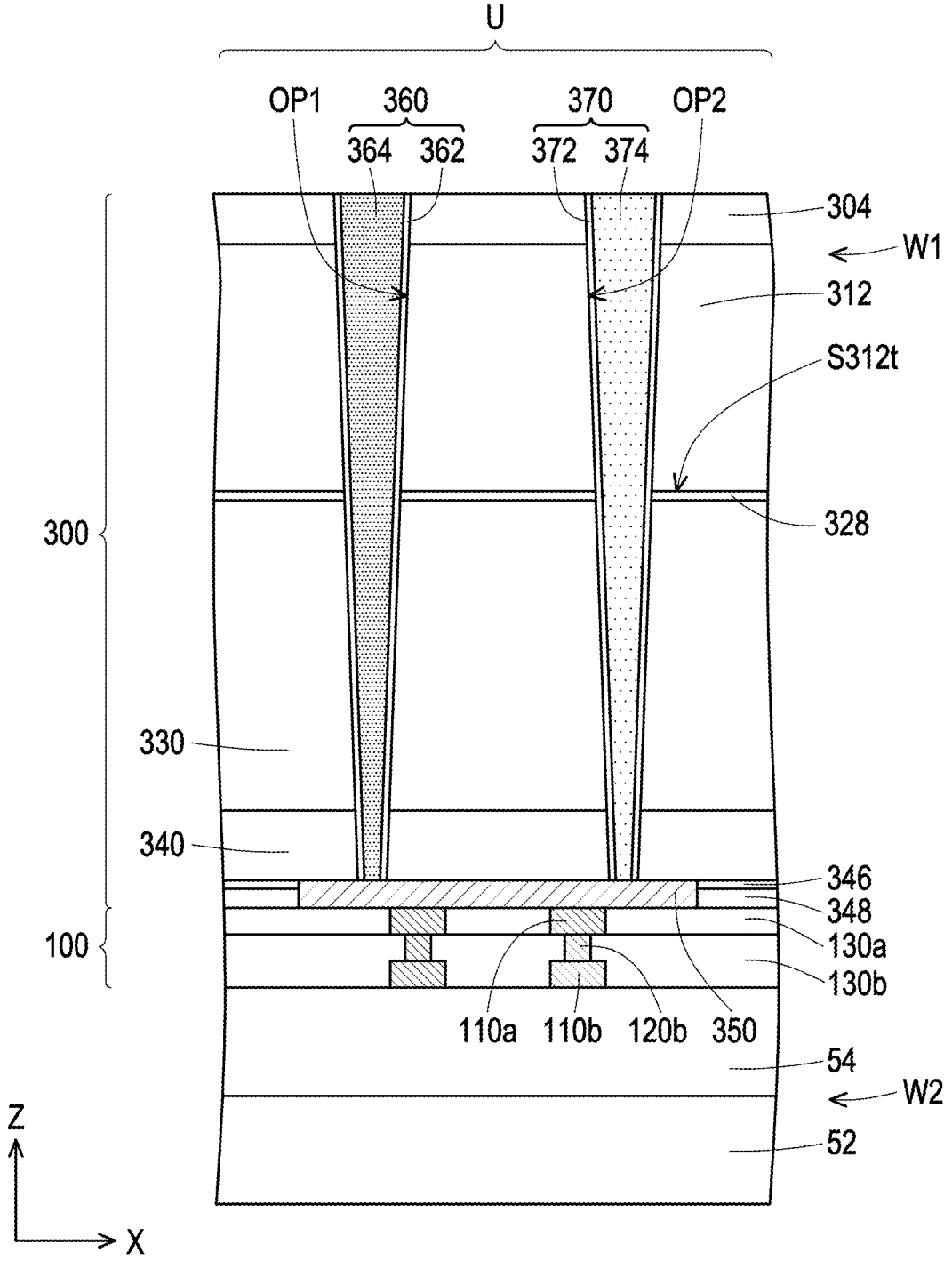

Referring to FIGS. 1F, 2F, and 3F, in some embodiments, a first-type TSV is formed in the first TSV opening and a second-type TSV is formed in the second TSV opening, in accordance with a step S500 of the method depicted in FIG. 17. In some embodiments, a plurality of first-type TSVs 360 are formed in the first TSV openings OP1 to extend from the rear surface of the substrate 304 straightly downward to the conductors 350 exposed by the first TSV openings OP1, and a plurality of second-type TSVs 370 are formed in the second TSV openings OP2 to extend from the rear surface of the substrate 304 straightly downward to the conductors 350 exposed by the second TSV openings OP2. For example, the first-type TSVs 360 each include a main body 364 formed in the form of bulk with a single material, and the second-type TSVs 370 each include a main body 374 formed in the form of bulk with a single material, as showed in FIG. 2F and FIG. 3F. However, the disclosure is not limited thereto; alternatively, the main bodies 364 and the main bodies 374 may be formed in the form of superlattices with a single material or multiple materials (e.g., superlattice quantum wall materials or superlattice structure thin films). In some embodiments, in order to avoid diffusion of metal from the first-type TSVs 360 and the second-type TSVs 370 into the substrate 304, the first-type TSVs 360 each may further include a barrier layer 362 that is disposed between the substrate 304 and the main body 364, and the second-type TSVs 370 each may further include a barrier layer 372 that is disposed between the substrate 304 and the main body 374. In the case, the barrier layers 362 line sidewalls of the first TSV openings OP1 and the main bodies 364 then fill up the first TSV openings OP1, while the barrier layers 372 line sidewalls of the second TSV openings OP2 and the main bodies 374 then fill up the second TSV openings OP2. The barrier layers 362, 372 individually functions as a diffusion barrier to prevent metal diffusion and as an adhesion layer between the first-type TSVs 360/the second-type TSVs 370 and the substrate 304. A material of the barrier layers 362 may be selected depending on a material of main bodies 364, and a material of the barrier layers 372 may be selected depending on a material of main bodies 374.

In some embodiments, the material of the main bodies 364 is different from the material of the main bodies 374. For example, the main bodies 364 are made of n-type semiconductor material (e.g., a thermoelectric material doped with a N-type dopant), while the main bodies 374 are made of p-type semiconductor material (e.g., a thermoelectric material doped with a P-type dopant). The disclosure is not limited thereto; alternatively, the main bodies 364 are made of p-type semiconductor material (e.g., a thermoelectric material doped with a P-type dopant), while the main bodies 374 are made of n-type semiconductor material (e.g., a thermoelectric material doped with a N-type dopant). In the embodiments of the thermoelectric material is a single bulk thermoelectric material, the bulk thermoelectric material may include bismuth (Bi), bismuth-telluride (e.g., $Bi_2Te_3$), antimony (Sb), antimony-telluride (e.g., $Sb_2Te_3$), lead telluride (PbTe), polysilicon, polysilicon-germanium (SiGe), $CsBi_4Te_6$, $CeFe_{3.5}Co_{0.5}Sb_{12}$, TeAgGeSb, and ZnAlGaO. For a non-limiting example, the n-type semiconductor material may include $Bi_2Te_3$ and $Sb_2Te_3$, while the p-type semiconductor material may include $Bi_2Te_{3-x}Se_x$ (where x>0). For another non-limiting example, the n-type semiconductor material may include SiGe doped with n-dopants (e.g., phosphorus or arsenic), while the p-type semiconductor material may include SiGe doped with p-dopants (e.g., boron, indium, aluminum, or gallium). In the embodiments of the thermoelectric material is the superlattice quantum well thermoelectric material, the superlattice quantum well thermoelectric material may include $ZnO/Al_2O_3$, SiGe layers of alternating p-type and -type nature, GaSb/InAs, $SrTiO_3/SrTiNbO$, and AlGaN/GaN.

Continued on FIG. 2F and FIG. 3F, for example, surfaces of the first-type TSVs 360 and surfaces of the second-type TSVs 370 are substantially leveled with (e.g., coplanar to) the rear surface of the substrate 304, within process variations. In other words, the first-type TSVs 360 and the second-type TSVs 370 are accessibly revealed by the rear surface of the substrate 304. In some embodiments, the first-type TSVs 360 and the second-type TSVs 370 each have a square plan-view profile (or top-view profile) as shown in FIGS. 6A, 6B, 6C, and 6D, with a size less than the size of the conductors 350 exposed therefrom. Alternatively, the first-type TSVs 360 and the second-type TSVs 370 may have a circular plan-view profile, a rectangular plan-view profile, an elliptical plan-view profile, an oval plan-view profile, or a polygonal plan-view profile, etc. The shapes of the first-type and second-type TSVs 360, 370 can be controlled by adjusting the shape of the first and second TSV openings OP1, OP2. The disclosure is not limited thereto.

As shown in FIG. 6A, for example, the first-type TSVs 360 are arranged along the direction Y and separated from each other, and the second-type TSVs 370 are arranged along the direction Y and separated from each other, where a pair of one first-type TSV 360 and one second-type TSV 370 are arranged along the direction X and connected to the same conductor 350. In the case, two adjacent conductors 350 are separated from each other by one gate structure 338 covering one semiconductor fin 308, see FIG. 6A. However, the disclosure is not limited thereto; alternatively, in one cell unit U, two adjacent conductors 350 are separated from each other by one gate structure 338 covering two semiconductor fins 308 (FIG. 6B), one gate structure 338 covering three semiconductor fins 308 (FIG. 6C), one gate structure 338 covering fourth semiconductor fins 308 (FIG. 6D), or one gate structure 338 covering more than fourth semiconductor fins 308 (not shown).

In addition, a plurality of third-type TSVs (not shown) are formed in the third TSV openings to extend from the rear surface of the substrate 304 straightly downward to the at least one of the source/drain regions 326 formed in the device layer 300, the conductors 350 formed in the device layer 300, or the conductive lines 110a formed in the interconnect 110 exposed by the respective third TSV openings for providing further routing functions to the devices 3000. The formation and material of the third-type TSVs are similar to or substantially identical to the forming process and material of the first-type TSVs 360 and/or the second-type TSVs openings 370 as previously described, and thus are not repeated herein for brevity. However, the disclosure is not limited thereto; alternatively, the third-type TSVs each may include a main body made of conductive materials such as copper, copper-based alloy, tungsten, ruthenium, aluminum, gold, silver, and the like that may be formed by a suitable forming method such as plating process and a barrier layer made of dielectric material such as TaN, Ta, Ti, TiN, TiSiN, WN, or combinations thereof that may be formed by a suitable forming method such as CVD, where the barrier layers line the third TSV openings prior to the formation of the main bodies of third-type TSVs. In addition, seed layers may be formed in the third TSV openings prior to the formation of the main bodies of third-type TSVs and after forming the barrier layers of the third-type TSVs to facilitates the formation of the main bodies of the third-type TSVs. In some embodiments, the third-type TSVs are separated from each other. For example, surfaces of the third-type TSVs are exposed by the rear surface of the substrate 304.

Figure 1G:
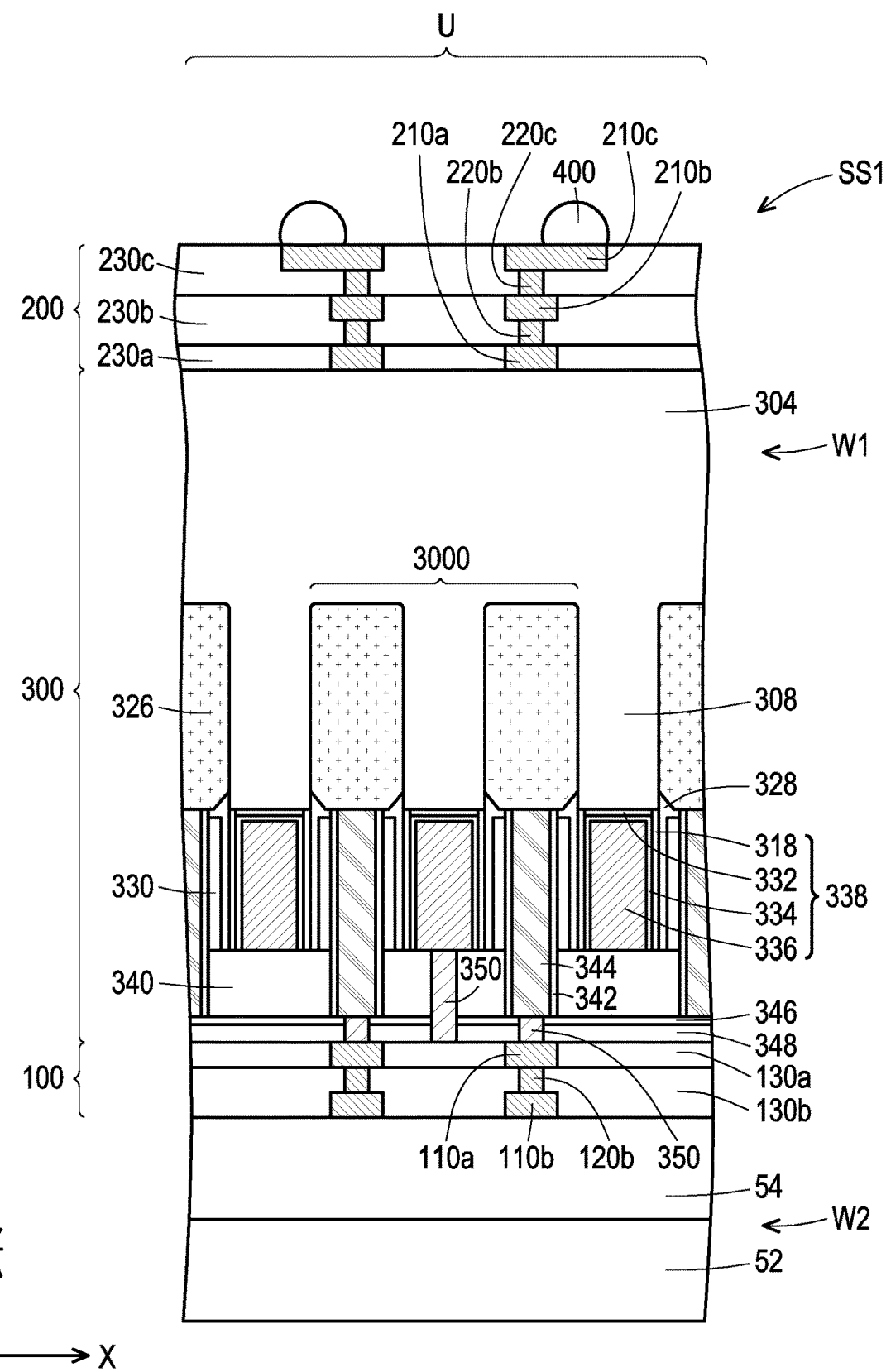
Figure 2G:
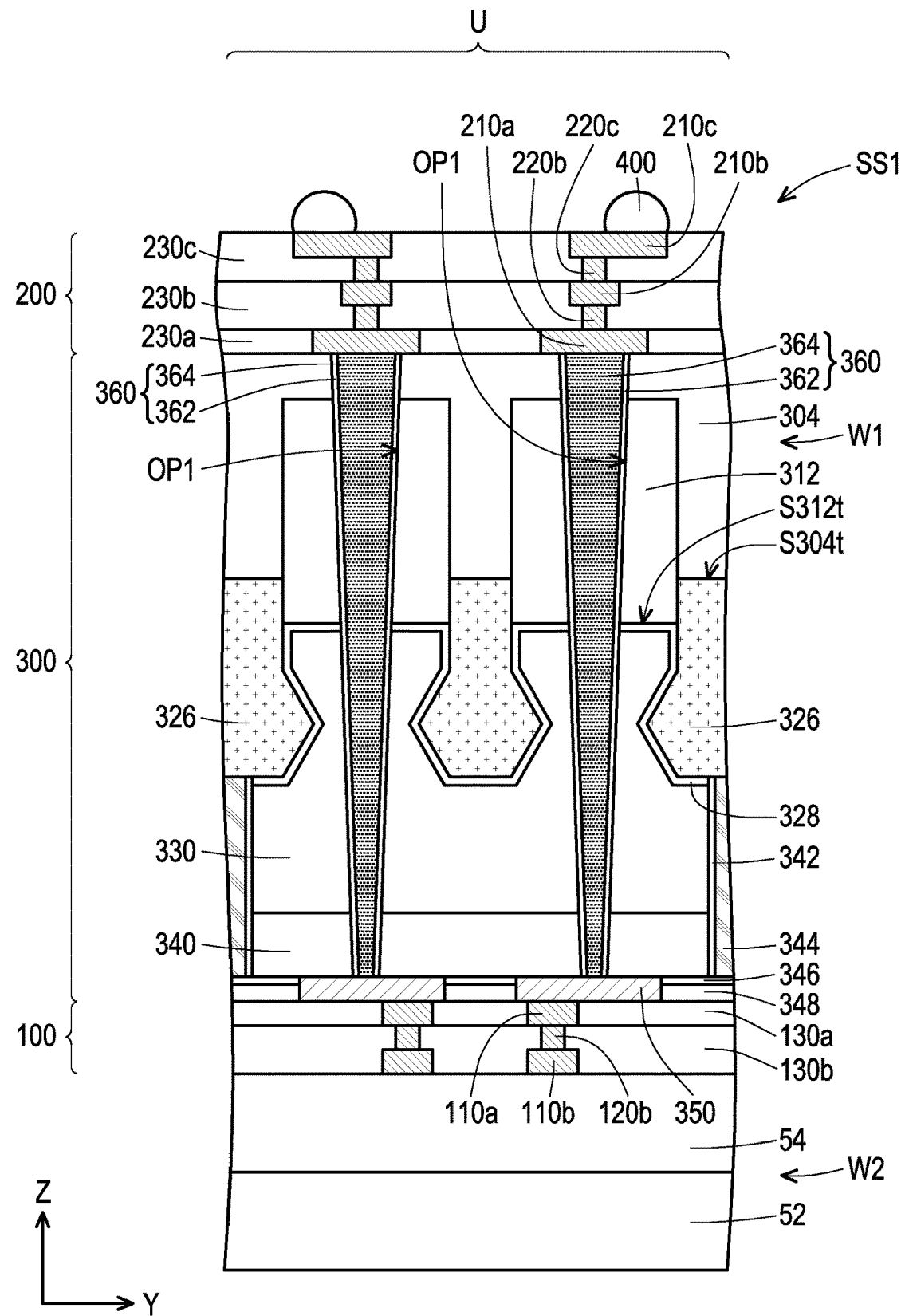
Figure 3G:
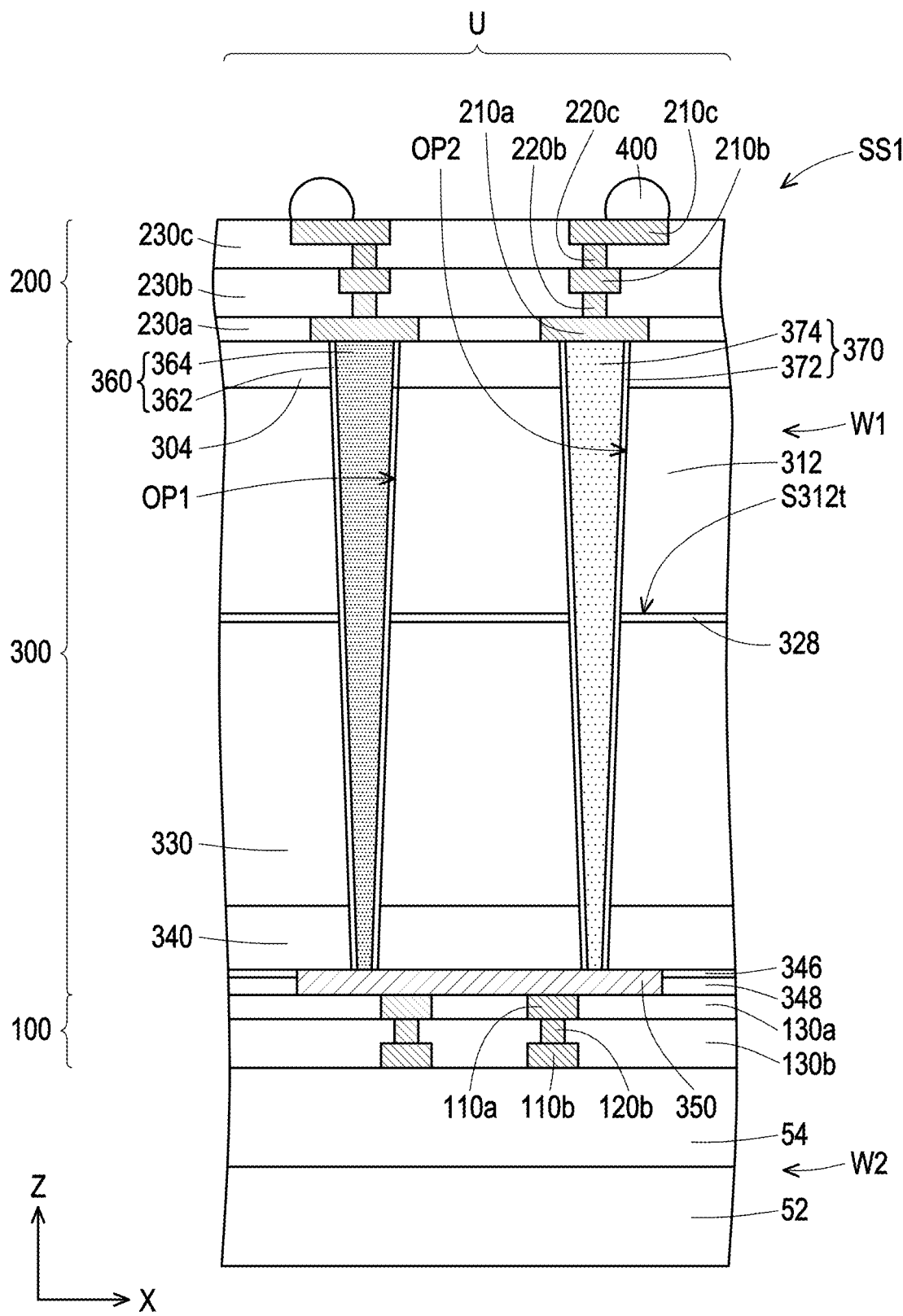

Referring to FIGS. 1G, 2G, and 3G, in some embodiments, a second interconnect is formed over the substrate to connect the first-type TSV and the second-type TSV to form a semiconductor structure with a thermoelectric generator, in accordance with a step S600 of the method depicted in FIG. 17. In some embodiments, an interconnect 200 is disposed on the device layer 300 (e.g., the rear surface of the substrate 304). As shown in FIGS. 1G, 2G and 3G, the interconnect 200 may include a plurality of conductive lines 210a, 210b, 210c, a plurality of conductive vias 220b, 220c, and a plurality of dielectric layers 230a, 230b, 230c. For example, the conductive lines 210b are disposed on (e.g. in physical contact with) and connected to the first-type TSVs 360, the second-type TSVs 370, and the third-type TSVs and laterally covered by the dielectric layer 230a to form a first build-up layer of the interconnect 200 disposed on the device layer 300; the conductive vias 220b are disposed on (e.g. in physical contact with) and connected to the conductive lines 210a, the conductive lines 210b are disposed on (e.g. in physical contact with) and connected to the conductive vias 220b, and the conductive lines 210b and the conductive vias 220b are laterally covered by the dielectric layer 230b to form a second build-up layer of the interconnect 200; then, the conductive vias 220c are disposed on (e.g. in physical contact with) and connected to the conductive lines 210b, the conductive lines 210c are disposed on (e.g. in physical contact with) and connected to the conductive vias 220c, and the conductive lines 210c and the conductive vias 220c are laterally covered by the dielectric layer 230c to form a third build-up layer of the interconnect 200. As shown in FIGS. 1G, 2G and 3G, illustrated top surface of the conductive lines 210c are substantially leveled with and coplanar to an illustrate top surface of the dielectric layer 230c for further electrical connection to later-formed features (e.g., terminals or another build-up layer) or external devices. The conductive lines 210a are physically and electrically connected to the first-type TSVs 360, the second-type TSVs 370, and the third-type TSVs, the conductive lines 210b are electrically coupled to the conductive lines 210a through the conductive vias 220b, and the conductive lines 210c are electrically coupled to the conductive lines 210b through the conductive vias 220c. In other words, the interconnect 200 provides routing function to the device layer 300 (e.g., the device 3000 or other devices (not shown) formed in/on the substrate 304). However, the disclosure is not specifically limited to the drawings of the embodiments; it is appreciated that build-up layers of the interconnect 200 may individually include a conductive horizontal (or line) portion extending along a direction X and/or a direction Y (e.g., routing lines/wire) laterally covering by a dielectric (e.g., a dielectric layer), a conductive vertical (or via)

portion extending along a direction Z (e.g., routing vias) together laterally covering by a dielectric (e.g., a dielectric layer), or a conductive horizontal (or line) portion extending along the direction X and/or the direction Y (e.g., routing lines/wire) and a conductive vertical (or via) portion extending along the direction Z (e.g., routing vias) together laterally covering by a dielectric (e.g., a dielectric layer), depending on the design requirement and demand. In addition, the conductive lines 210a, 210b, 210c and the conductive vias 220b, 220c are referred to as redistribution lines or wires. The number of the build-layers of the interconnect 200 may be one, two, three or more than three, depending on the design requirement and demand. In some embodiments, the interconnect 200 is formed during the BEOL processes of the wafer W1. The formation and materials of the interconnect 200 may be similar to or substantially identical to the forming processes and materials of the interconnect 100 as described in FIGS. 1A, 2A, 3A. The interconnect 200 may be referred to as a backside interconnect, a backside interconnect structure, or a second interconnect of the wafer W1.

For example, as shown in FIGS. 2G and 3G, the interconnect 200 is connected to (e.g., in physical contact with) the first-type TSVs 360 and the second-type TSVs 370, where one of the conductors 350, one first-type TSV 360 connected to and standing on this conductor 350, one second-type TSV 370 connected to and standing on this conductor 350, and the metallization layers (e.g., the conductive lines 210a) connected to this first-type TSV 360 and this second-type TSV 370 together constitute a thermoelectric generator (TEG). Each unit cell U of the wafer W1 may include one or more than one TEG, in the disclosure. Owing to the TEG, the heat generated from the devices 3000 can be converted to electric energy for re-use, such as refreshing the embedded RAM(s) or pre-charging the embedded capacitor (s). The TEG may be referred to as through-silicon TEG. On the other hand, due to the third-type TSVs, the interconnect 200 is electrically coupled to the devices 3000 formed in the device layer 300, for example. Additionally, the interconnect 200 may be electrically coupled to the interconnect 100 through the third-type TSVs. Up to here, the semiconductor structure SS1 embedded with TEG(s) is manufactured, where the semiconductor structure SS1 include the interconnect 100, the interconnect 200, the device layer 300 including the devices 3000 interposed between and electrically connected to the interconnect 100 and the interconnect 200, and the TEG(s) interposed between and electrically connected to the interconnect 100 and the interconnect 200.

Continued on FIGS. 2G and 3G, in some embodiments, a plurality of conductive terminals 400 are optionally formed on the interconnects 200 to be electrically connect to the interconnects 200. For example, the conductive terminals 400 includes micro-bumps, metal pillars, electroless nickel-electroless palladium-immersion gold (ENEPIG) formed bumps, controlled collapse chip connection (C4) bumps (for example, which may have, but not limited to, a size of about 80 μm), a ball grid array (BGA) bumps or balls (for example, which may have, but not limited to, a size of about 400 μm), solder balls, or the like. The disclosure is not limited thereto. The numbers of the conductive terminals 400 is not limited to the drawings of the embodiments, and may be selected and designated based on the demand and design requirements. When solder is used, the solder may include either eutectic solder or non-eutectic solder. The solder may include lead or be lead-free, and may include Sn—Ag, Sn—Cu, Sn—Ag—Cu, or the like. The conductive terminals 400 may be referred to as conductive input/output terminals of the semiconductor structure SS1 for electrical connection with external components or elements, such as a power source, a capacitor, or the like. The conductive terminals 400 may be omitted.

Figure 1H:
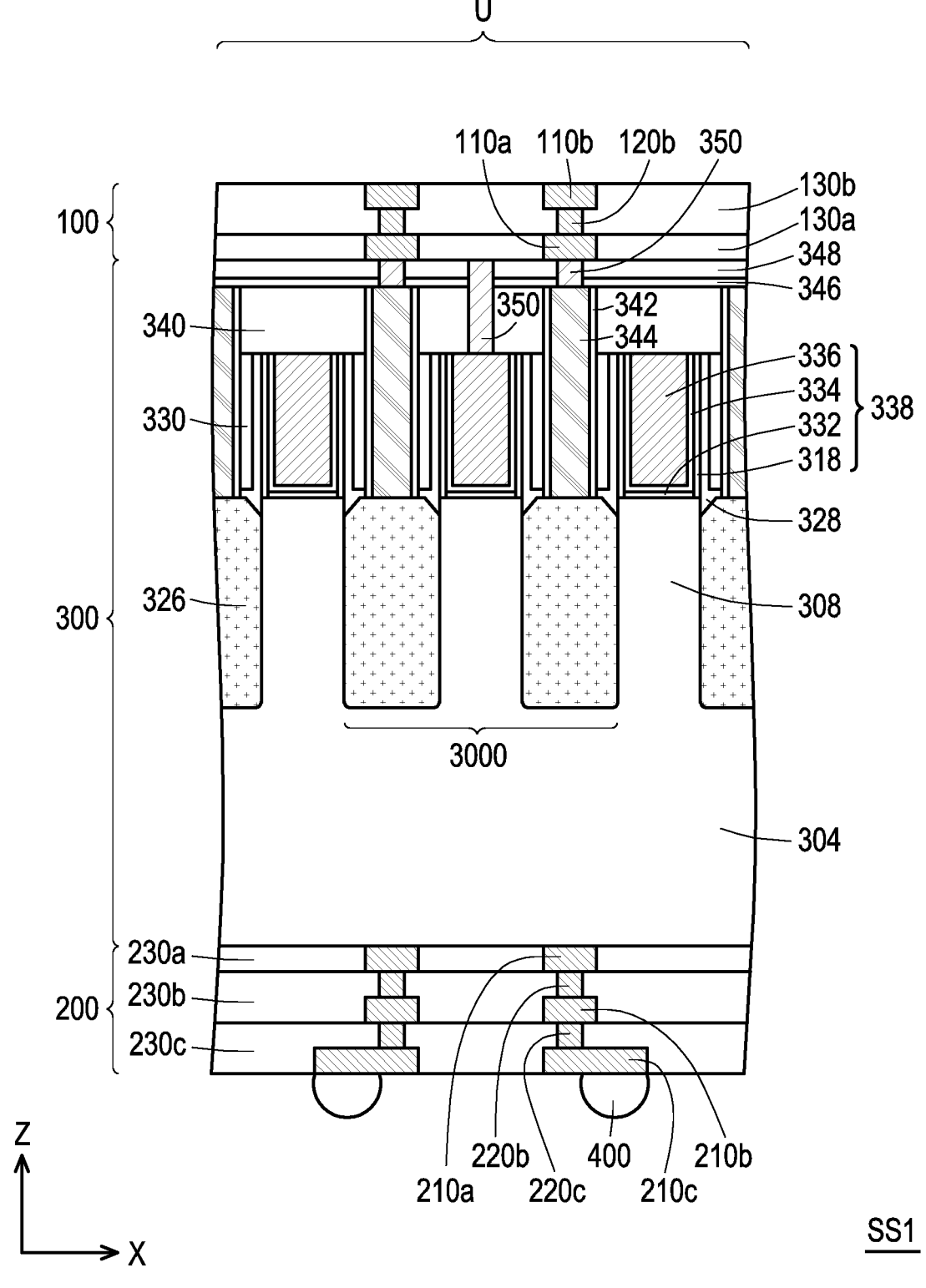
Figure 2H:
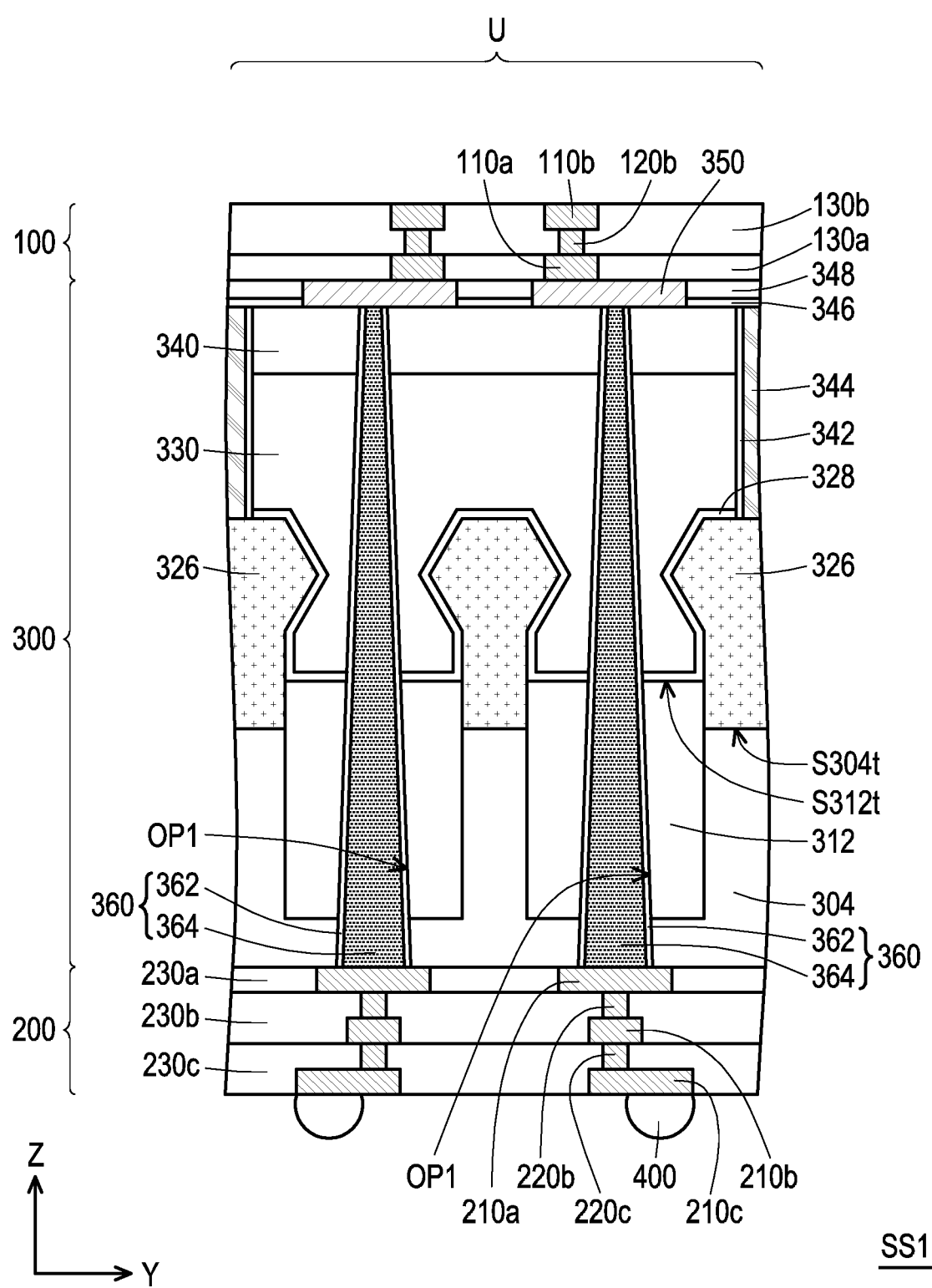
Figure 3H:
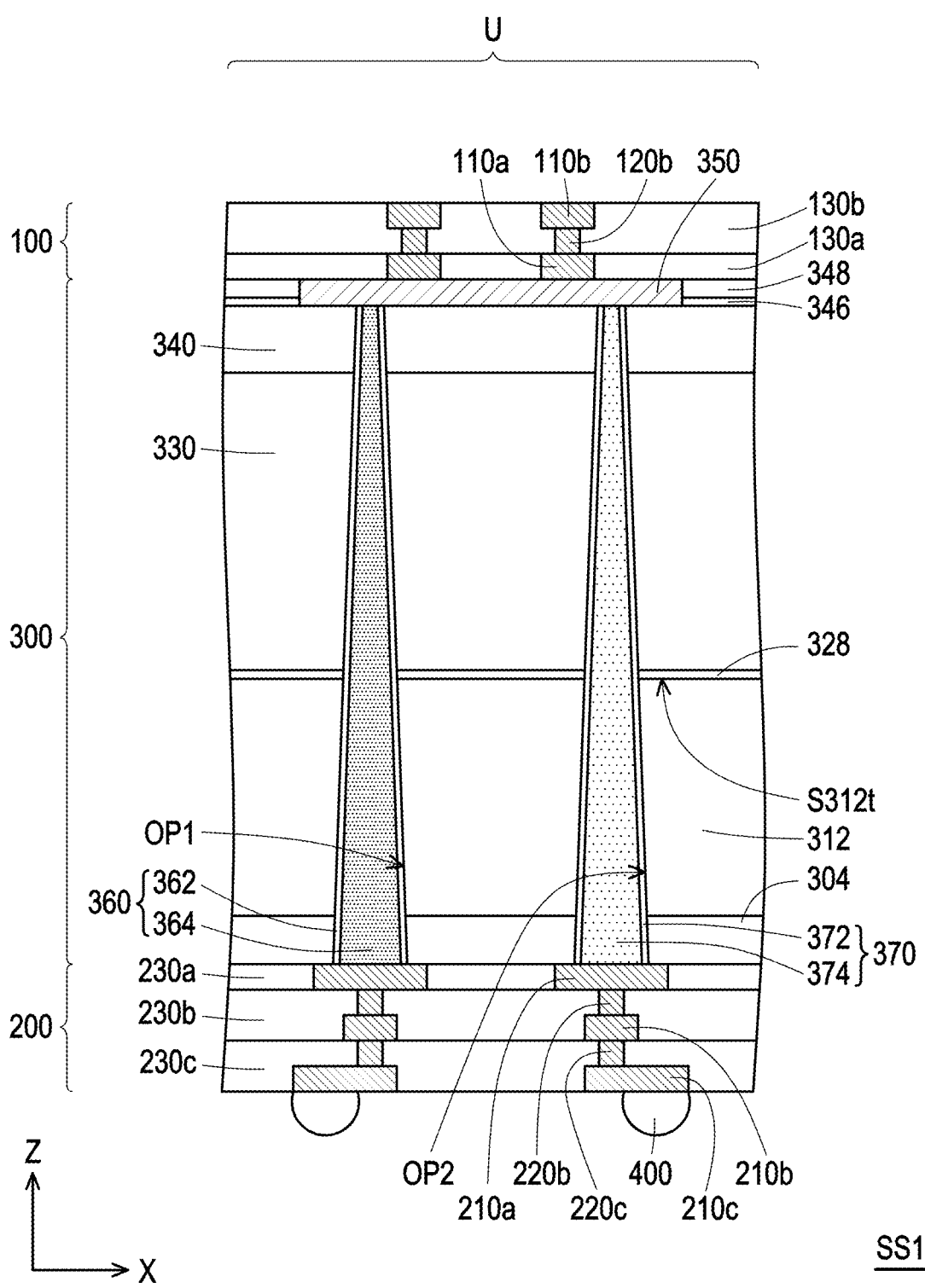

Referring to FIGS. 1H, 2H, and 3H, in some embodiments, the temporary carrier 52 is deboned from the interconnect 100 of the semiconductor structure SS1. In some embodiments, the interconnect 100 is easily separated from the temporary carrier 102 due to the debond layer 104, where the interconnect 100 (e.g., a surface of the dielectric layer 130*b* and surfaces of the conductive lines 110*b*) is exposed. In some embodiments, the temporary carrier 102 is detached from the interconnect 100 through a debonding process, and the temporary carrier 102 and the debond layer 104 are removed. In one embodiment, the debonding process is a laser debonding process.

In addition, the semiconductor structure SS1 may further include additional conductive terminals (not shown) disposed on and electrically coupled o the interconnect 100. The formation and material of the additional conductive terminals are similar to or substantially identical to the forming process and material of the conductive terminals 400, and thus are not repeated herein for brevity. The additional conductive terminals may be optional.

Figure 7A:
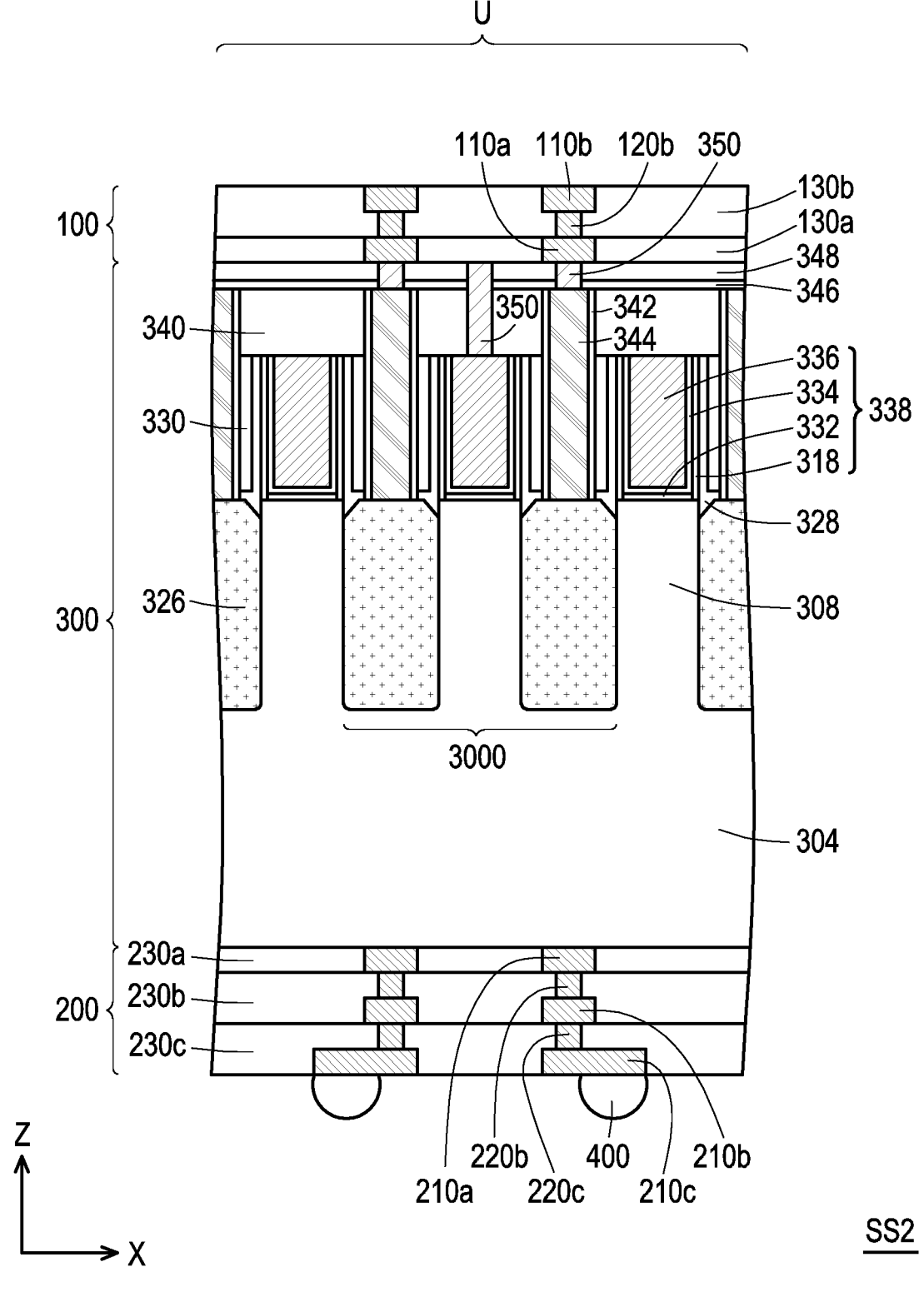
FIGS. 7A, 7B, and 7C are schematic vertical cross-sectional views of a semiconductor structure in accordance with some alternative embodiments of the disclosure.
Figure 7B:
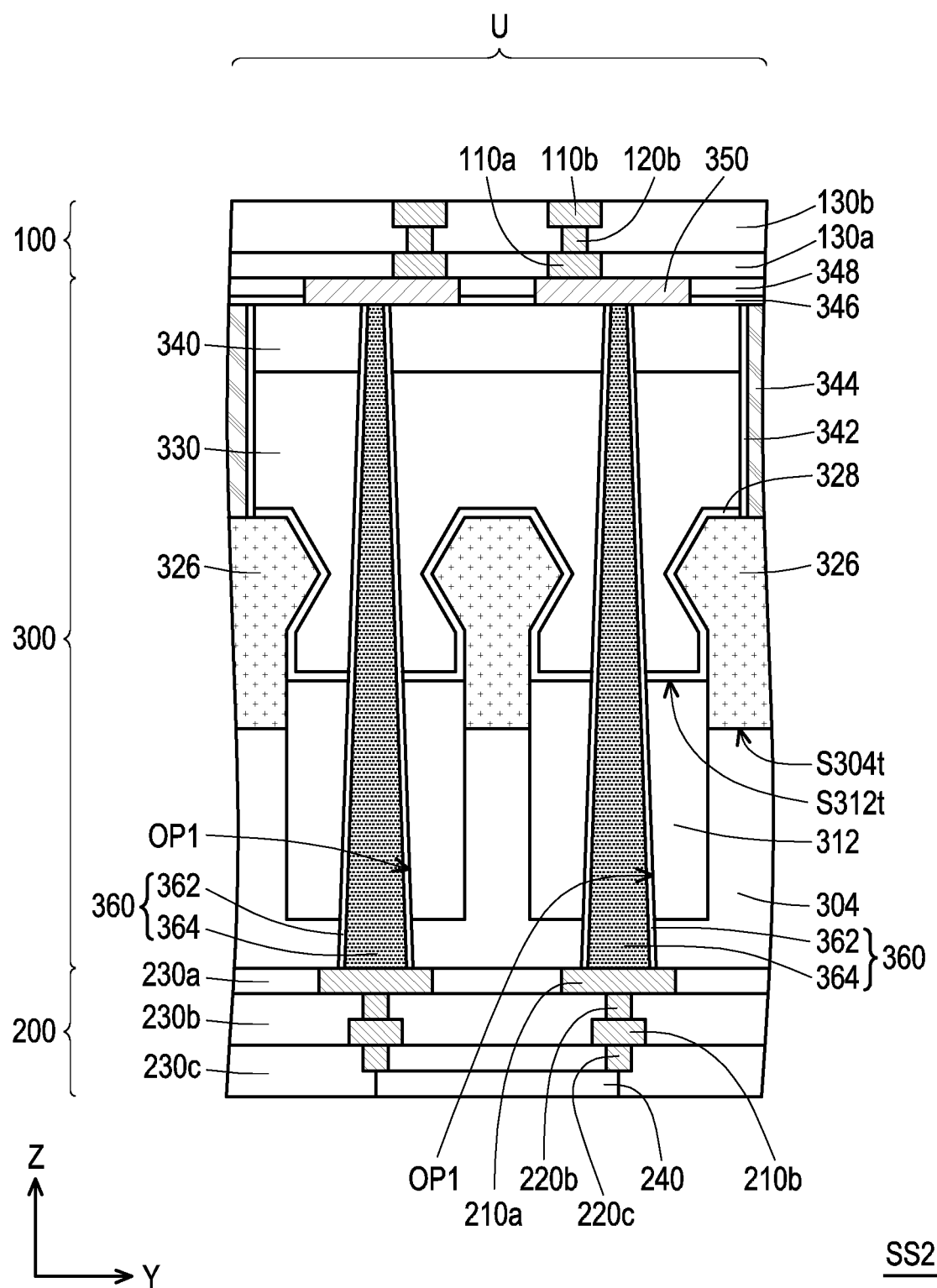
Figure 7C:
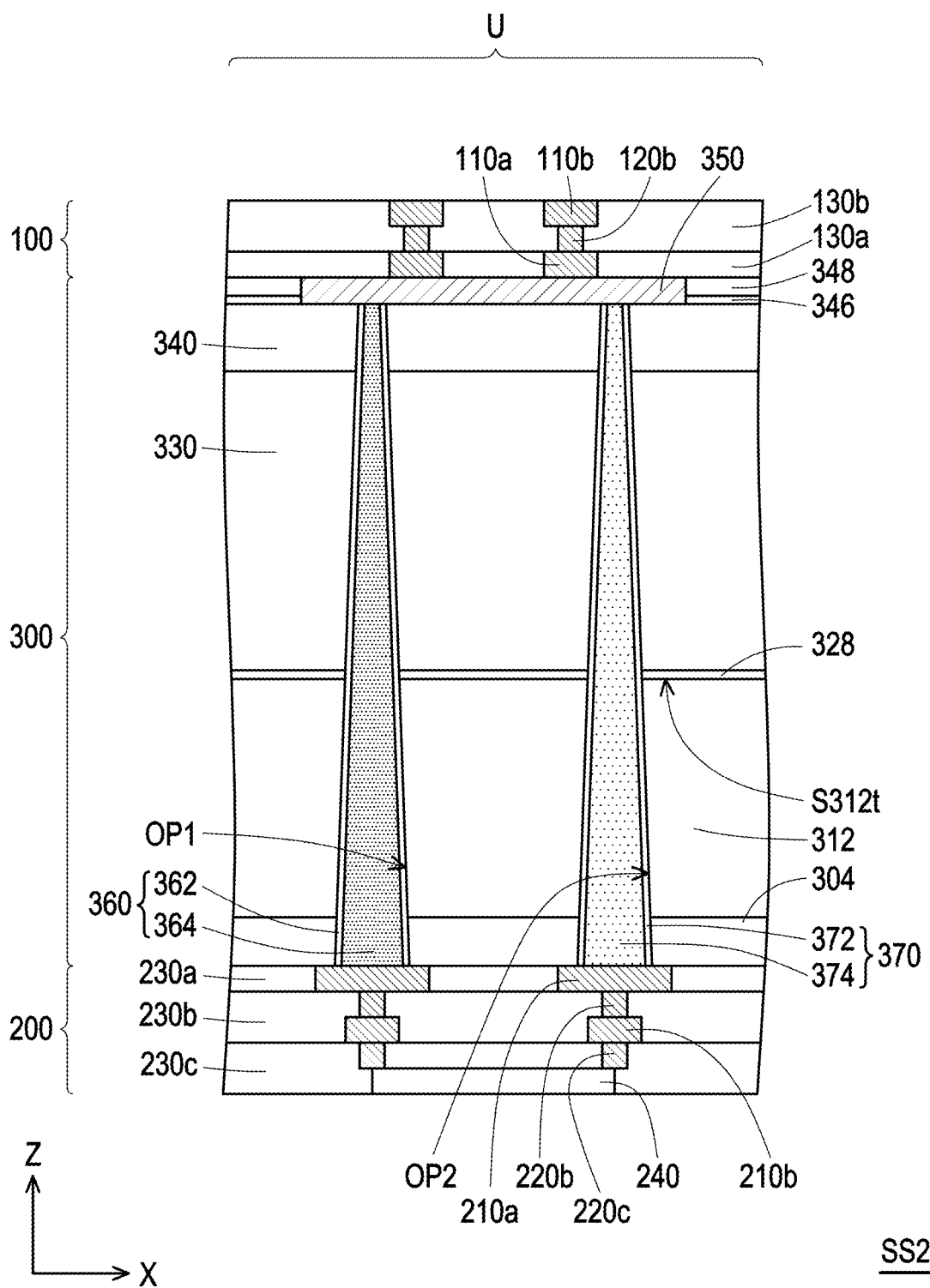

Alternatively, the conductive terminals 400 may be omitted, and a battery may be embedded in a semiconductor structure embedded with TEG(s). FIGS. 7A, 7B, and 7C are schematic vertical cross-sectional views of a semiconductor structure SS2 in accordance with some alternative embodiments of the disclosure. The elements similar to or substantially the same as the elements described above will use the same reference numbers, and certain details or descriptions of the same elements (e.g., the formations and materials) and the relationship thereof (e.g., the relative positioning configuration and electrical connection) will not be repeated herein. Referring to FIGS. 1H, 2H, and 3H and FIGS. 7A, 7B, and 7C together, the semiconductor structure SS1 depicted in FIGS. 1H, 2H, and 3H and the semiconductor structure SS2 depicted in FIGS. 7A, 7B, and 7C are similar; the difference is that, the semiconductor structure SS2 excludes the conductive terminals 400 and further include a battery 240 embedded inside the interconnect 200. With this embedded battery 240, more amount of the electric energy which being converted from the heat energy (generated in the operation of the devices 3000) via the TEG(s) embedded in the semiconductor structure SS2 may be stored in the battery 240 for later-use.

Figure 8A:
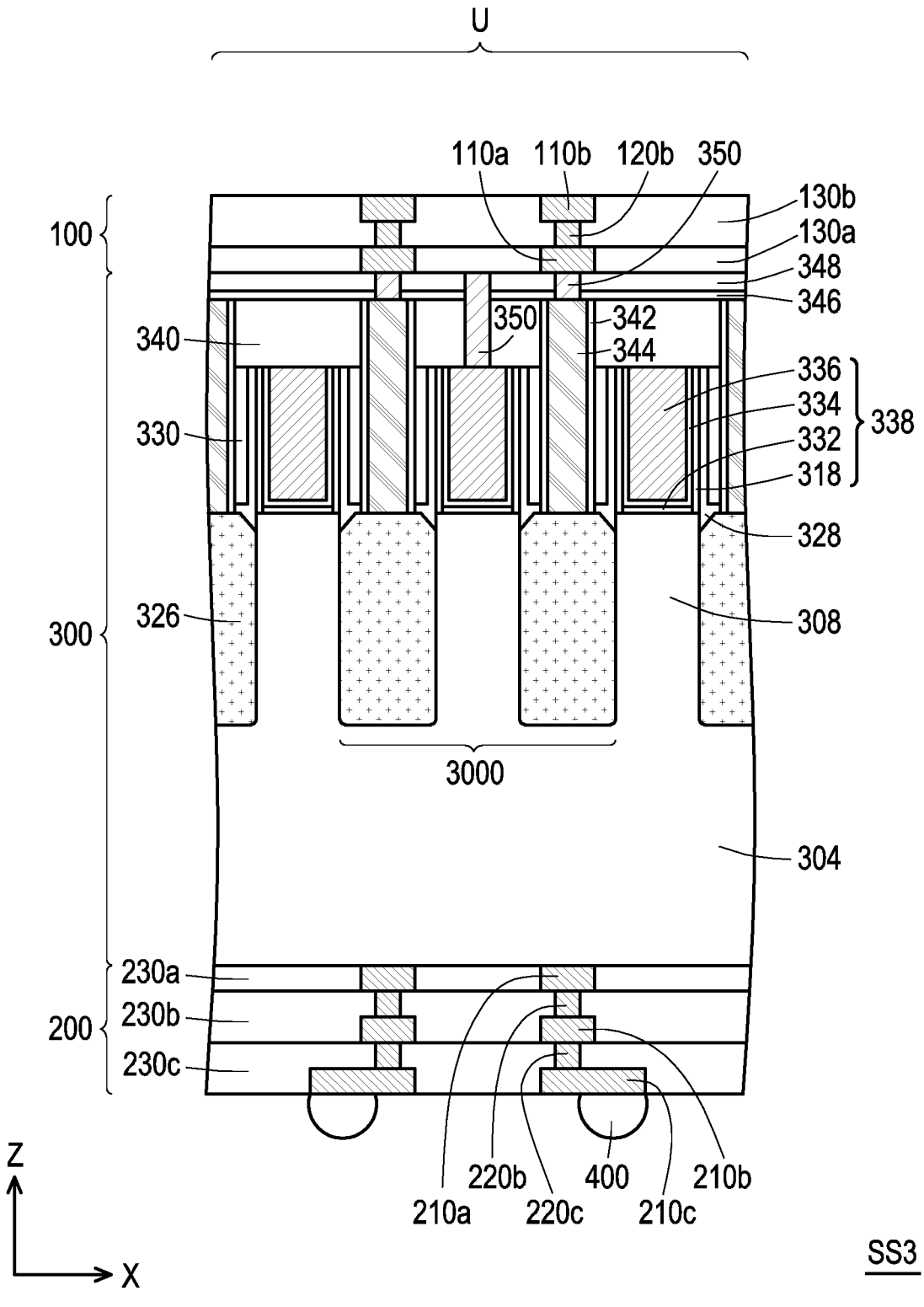
FIGS. 8A, 8B, and 8C are schematic vertical cross-sectional views of a semiconductor structure in accordance with some embodiments of the disclosure.
Figure 8B:
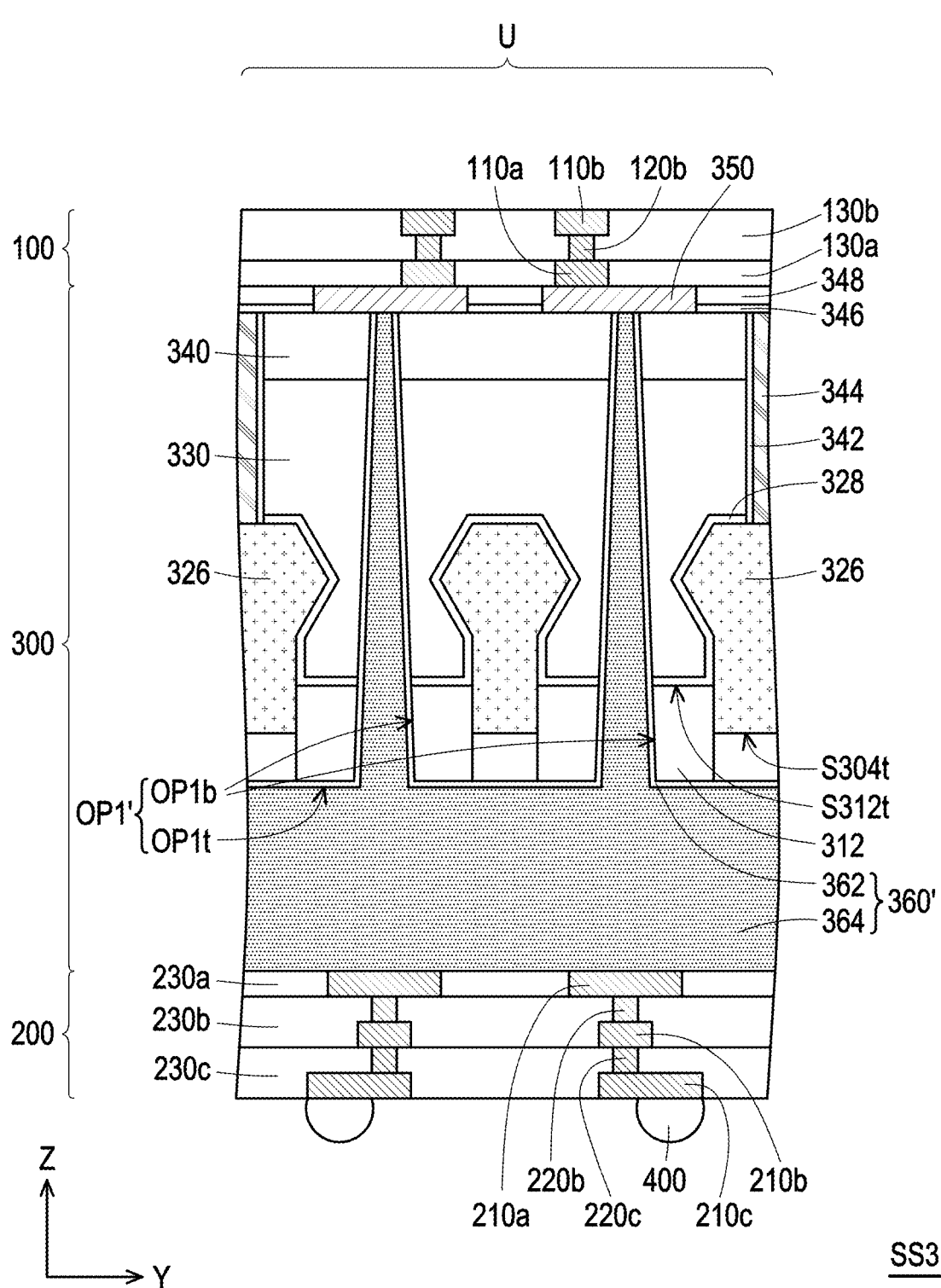
Figure 8C:
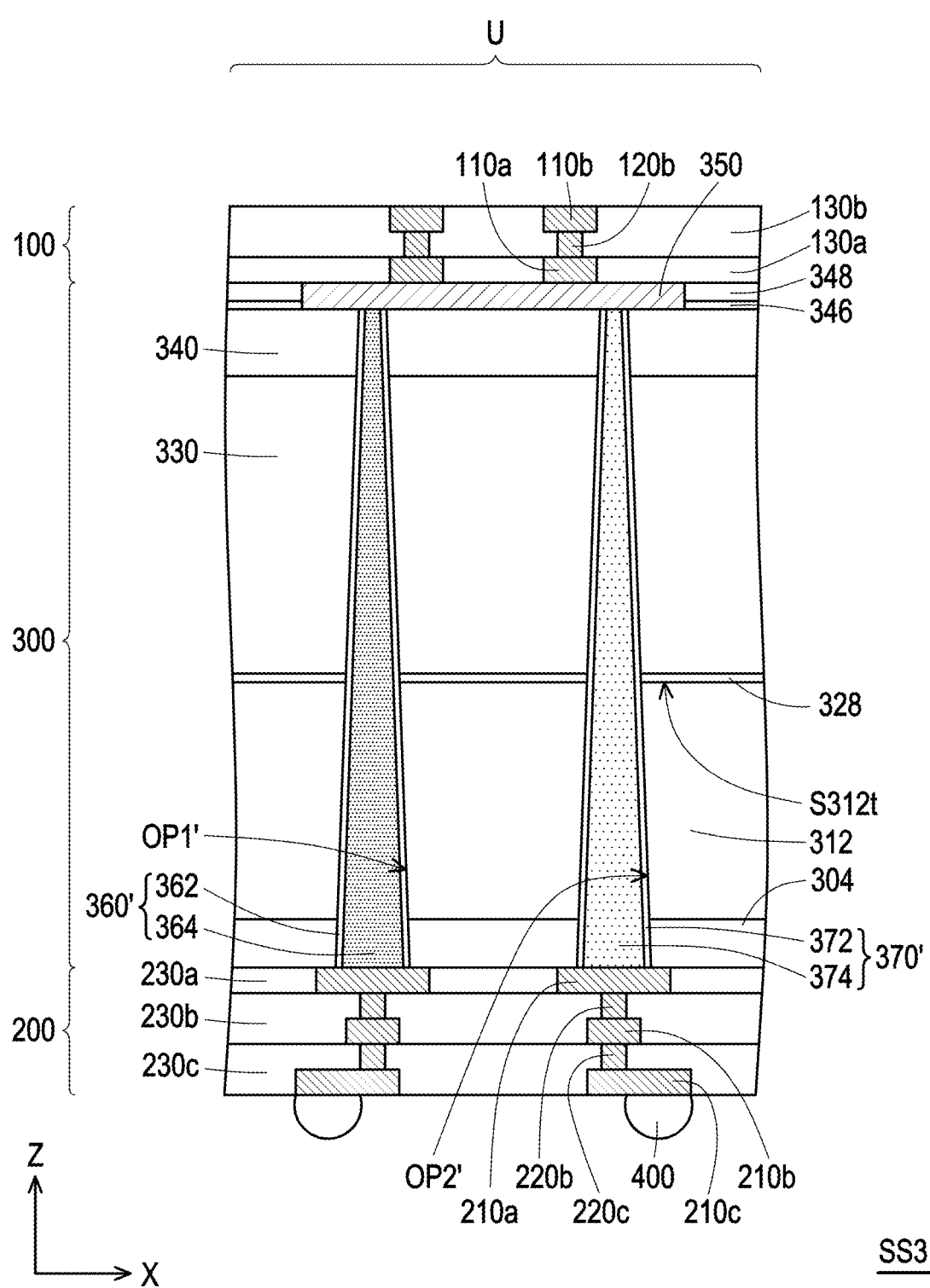
Figure 9B:
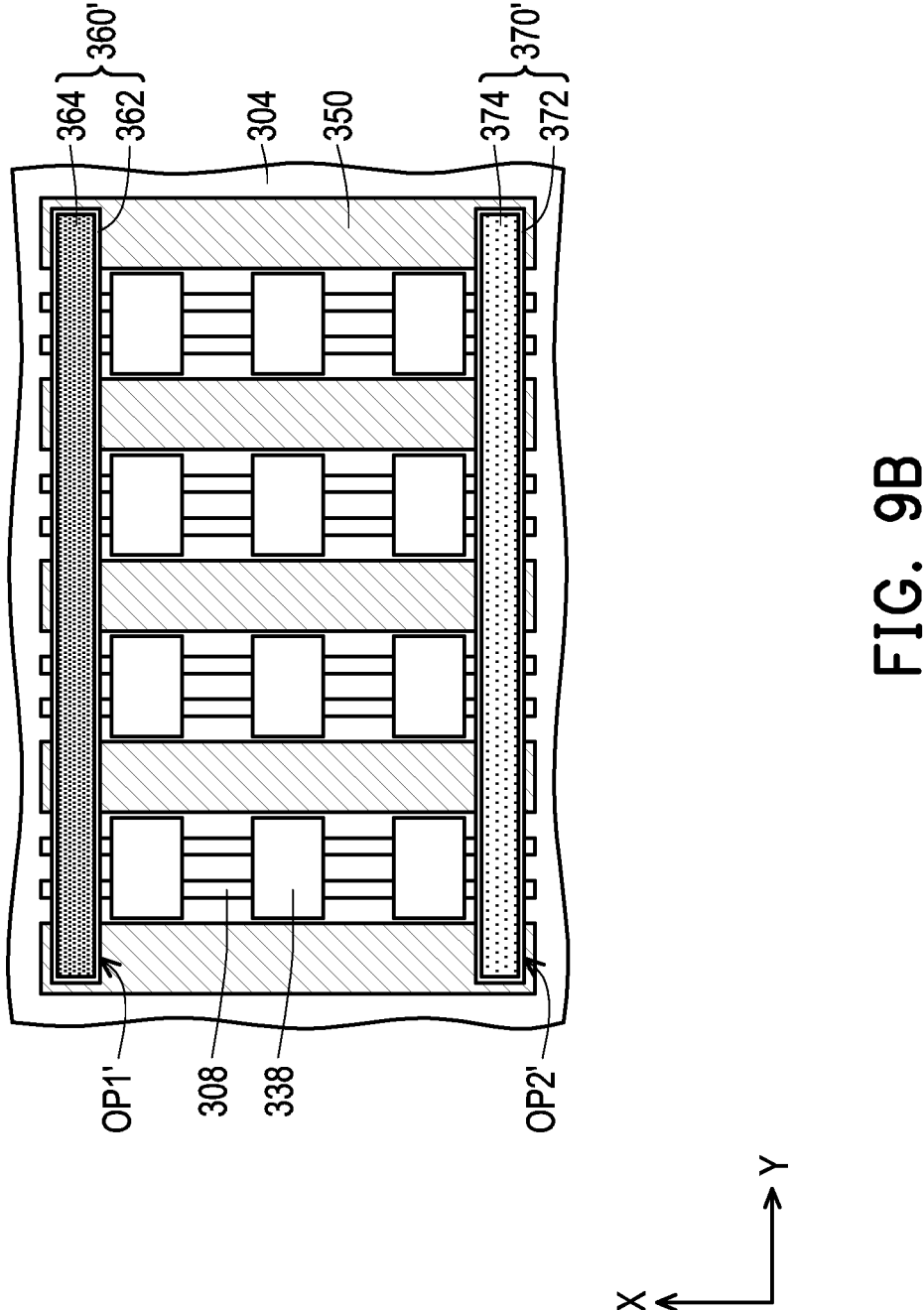
Figure 9C:
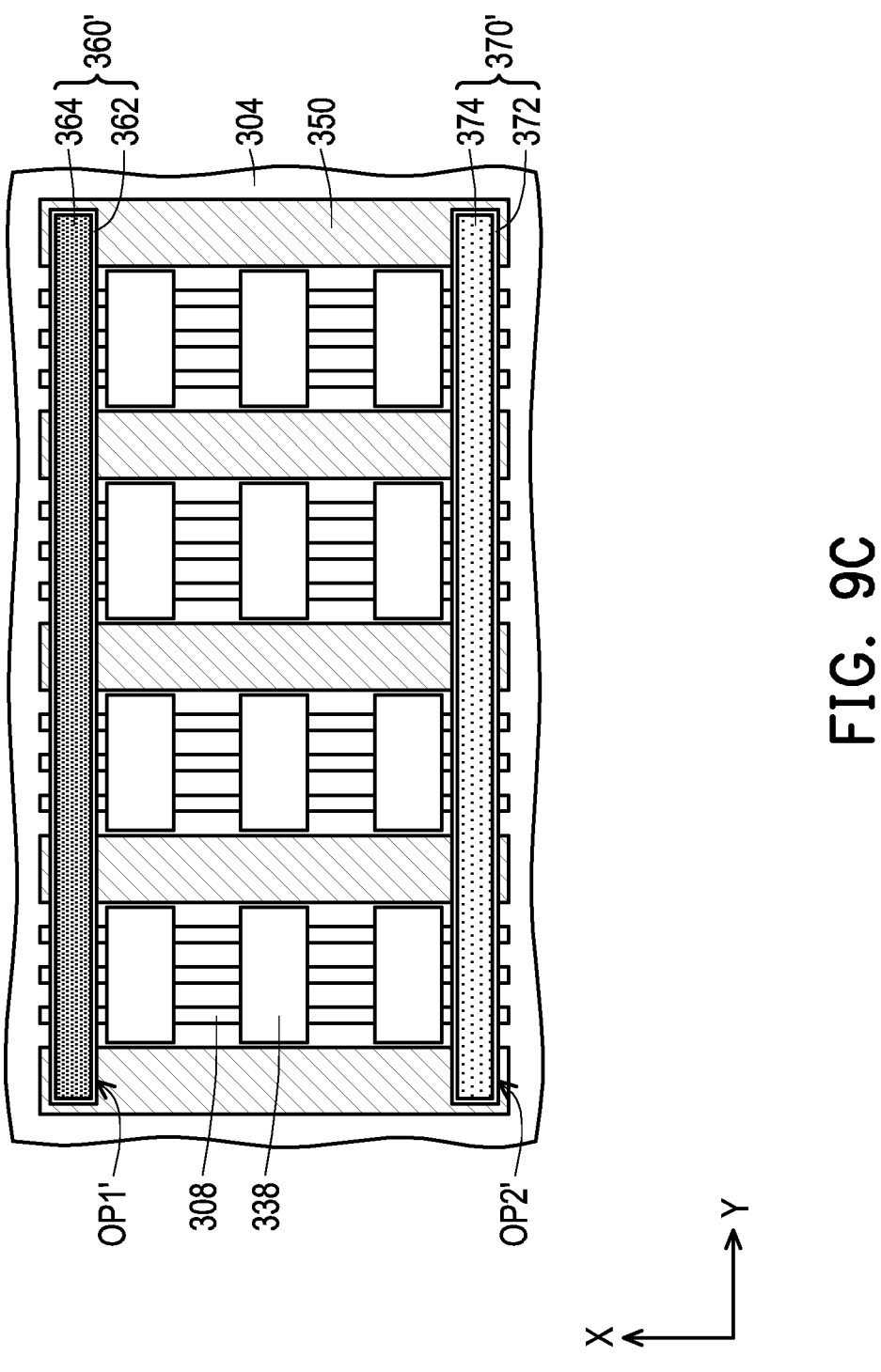
Figure 9D:
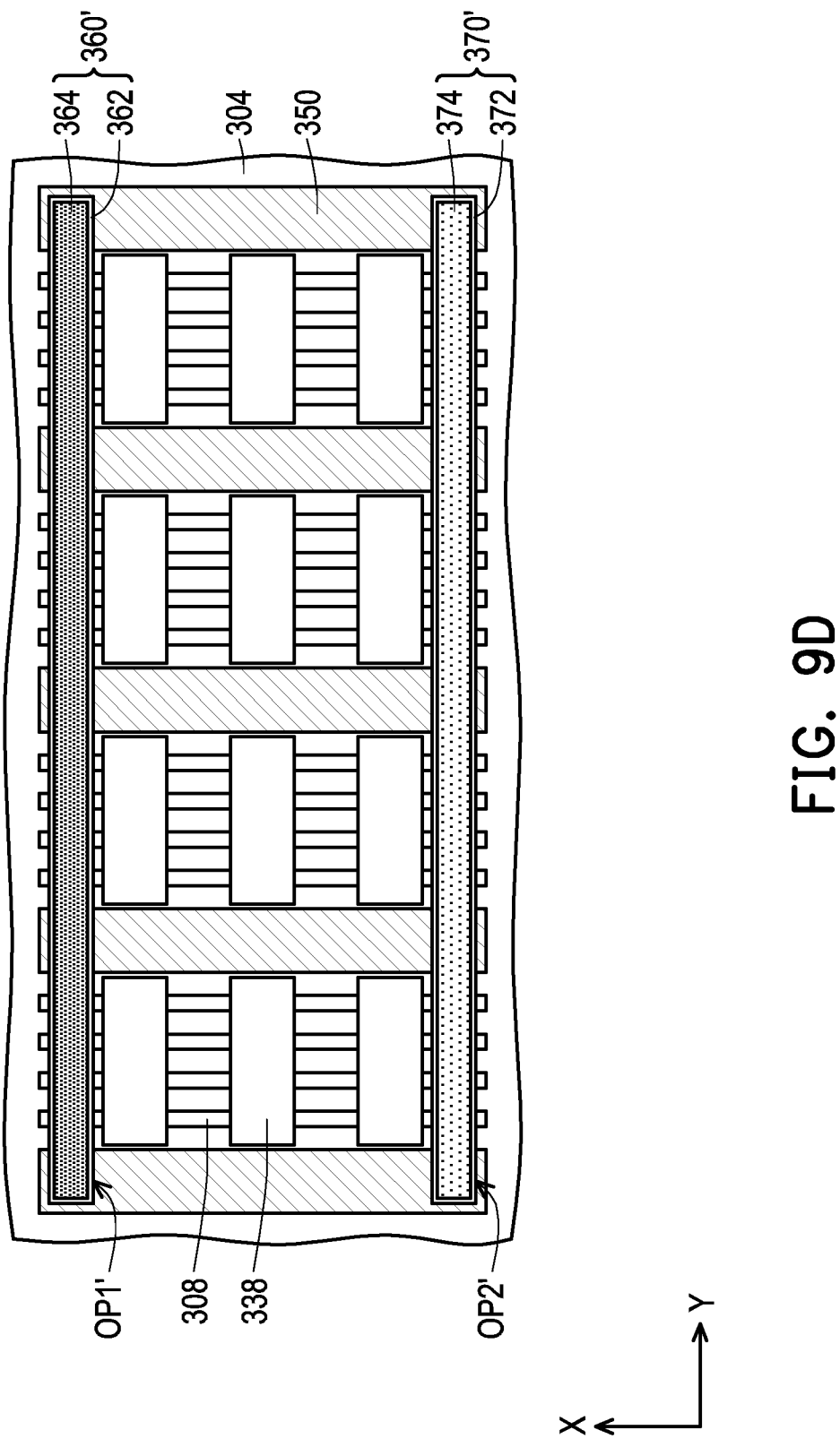
Figure 10A:
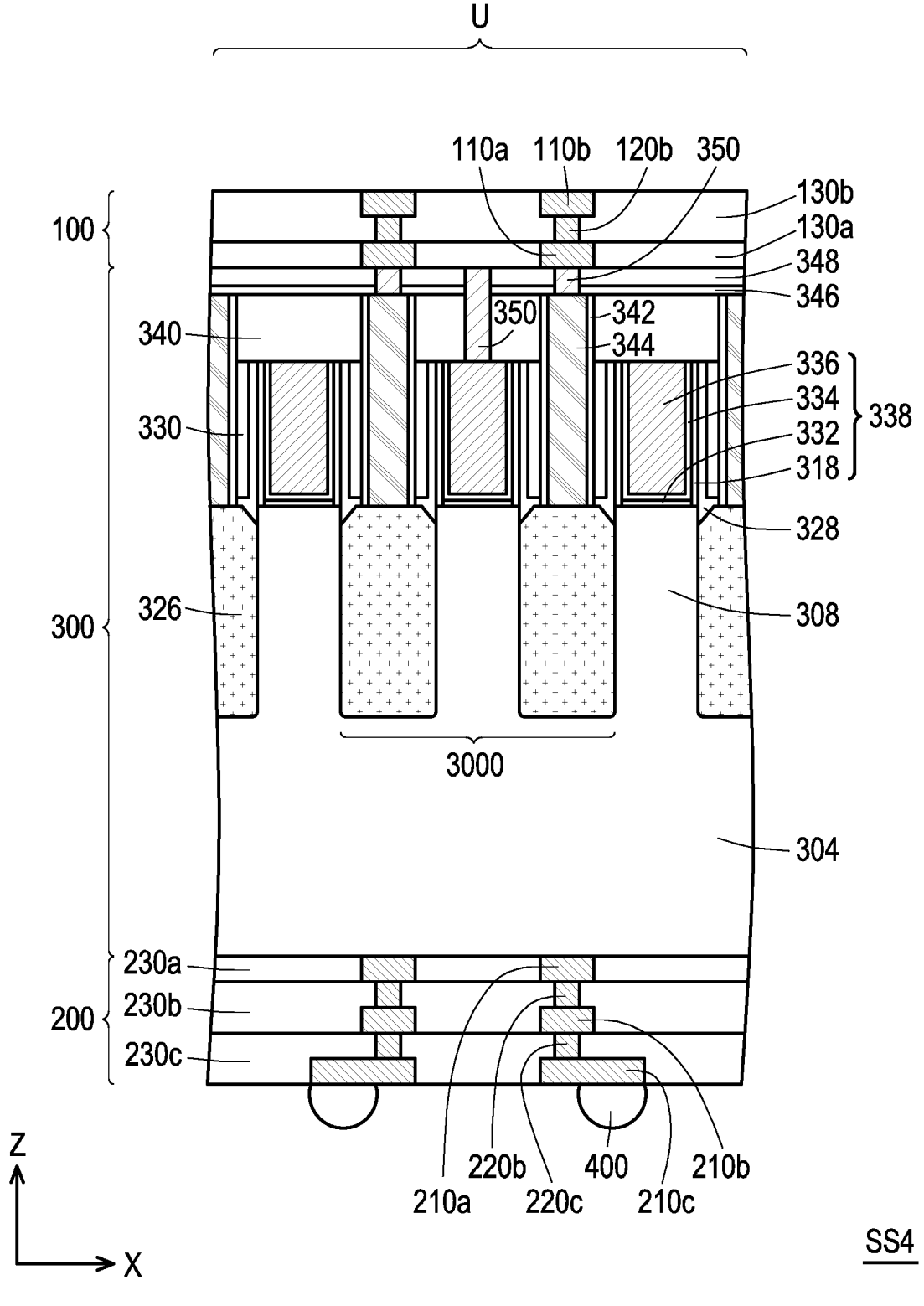
FIGS. 10A, 10B, and 10C are schematic vertical cross-sectional views of a semiconductor structure in accordance with some alternative embodiments of the disclosure.
Figure 10B:
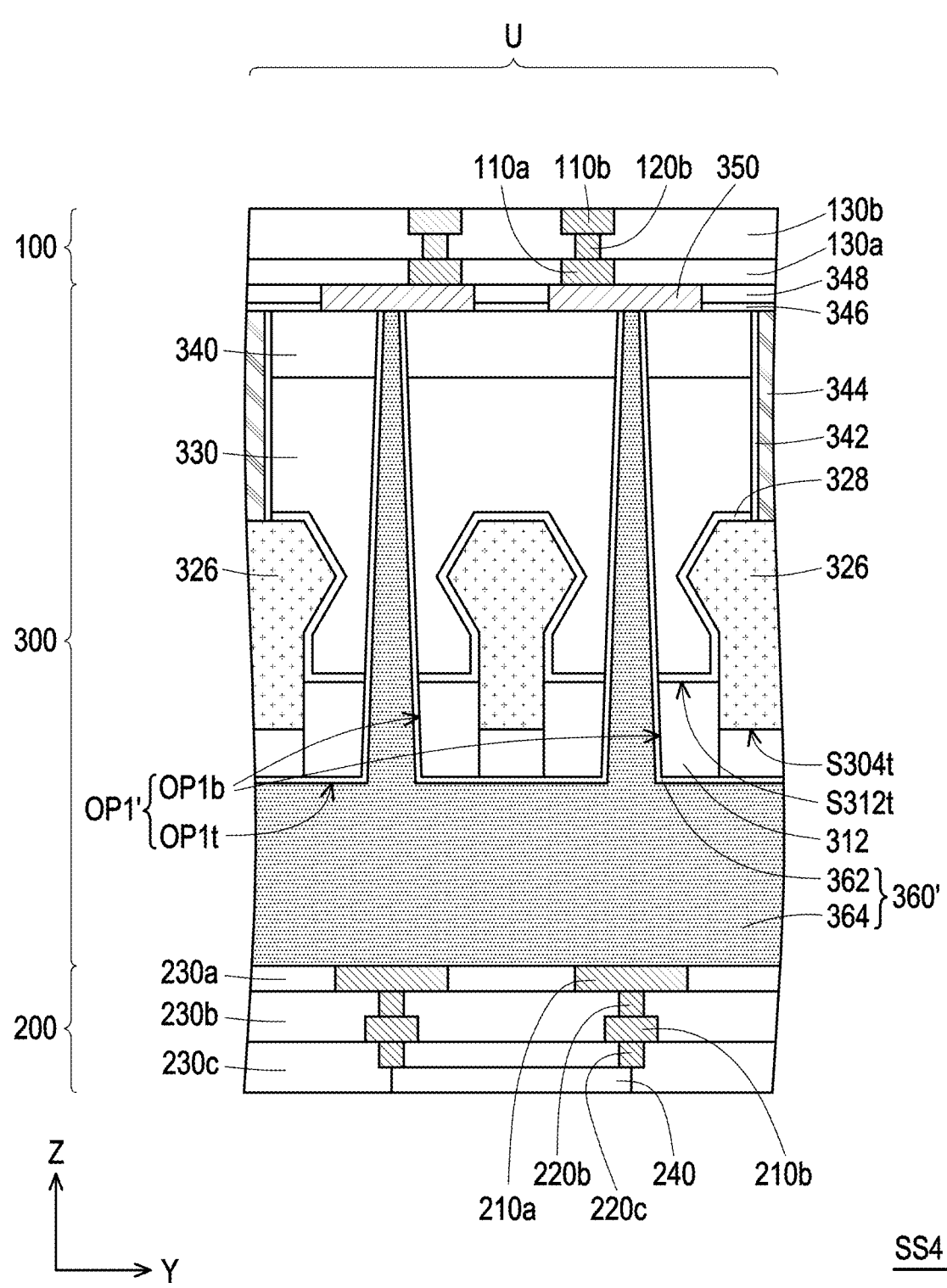
Figure 10C:
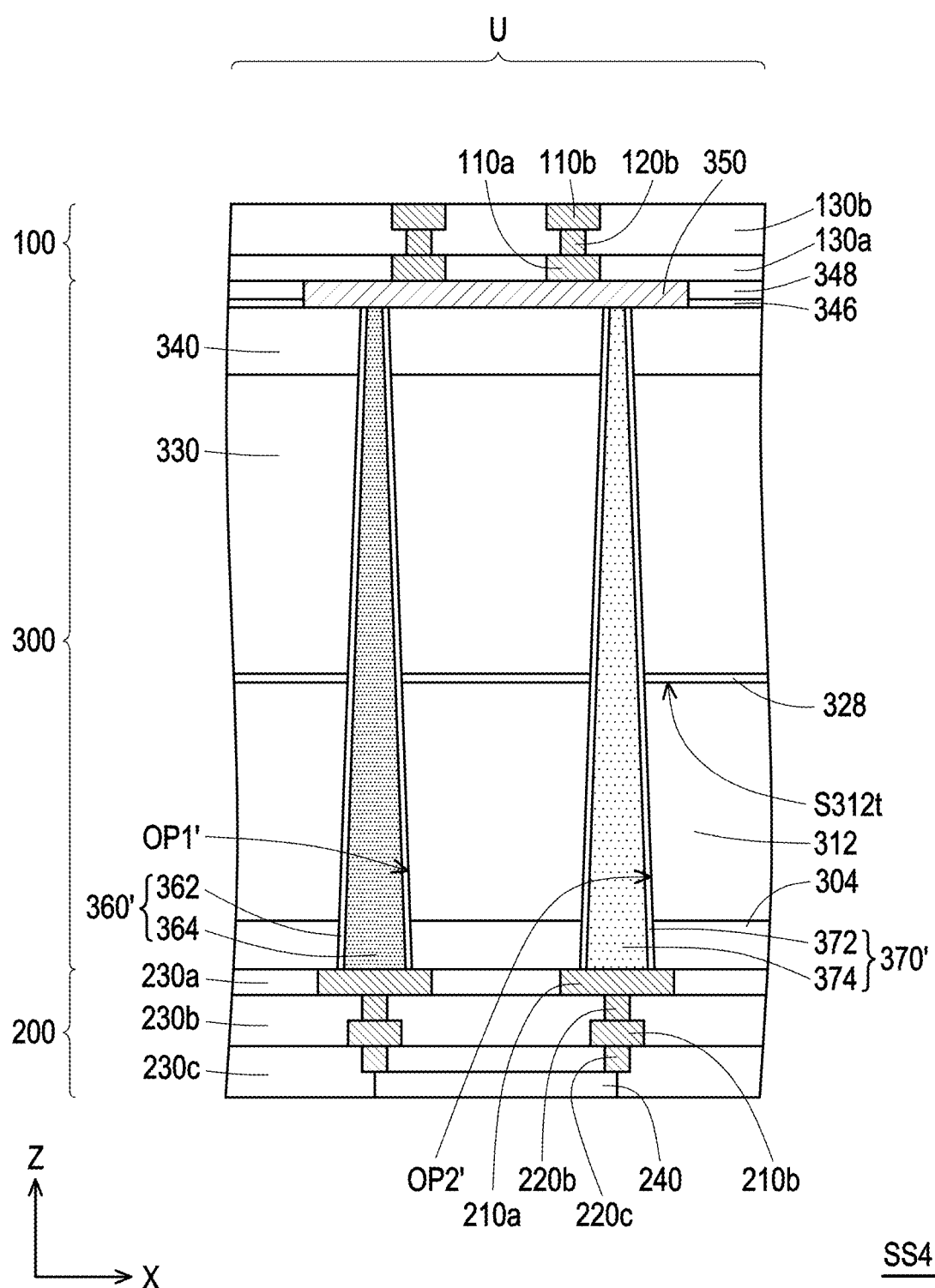

Alternatively, the first-type TSVs 360 each having a quadrilateral-shaped cross section (such as the cross section of a columnar shape or trapezoidal shape) may be replaced with one first-type TSV having a comb-shaped cross section, and the second-type TSVs 370 each having a quadrilateral-shaped cross section (such as the cross section of a columnar shape or trapezoidal shape) may be replaced with one second-type TSV having a comb-shaped cross section, within one, some, or all of the unit cells U. FIGS. 8A, 8B, and 8C are schematic vertical cross-sectional views of a semiconductor structure SS3 in accordance with some alternative embodiments of the disclosure. FIG. 9A is a schematic horizontal cross-sectional view of the semiconductor structure SS3 along the X-Y plane corresponding to FIGS. 8A, 8B, and 8C, where FIGS. 9B, 9C, and 9C are schematic horizontal cross-sectional views illustrating other possible non-limiting embodiments of the semiconductor structure SS3. For example, FIG. 8A is a schematic first vertical cross-sectional view in the Z-X plane taken along a cross-sectional line CL1 depicted in FIG. 9A, FIG. 8B is a schematic second vertical cross-sectional view in the Z-Y plane taken alone a cross-sectional line CL2 depicted in FIG. 9A, and FIG. 8C is a schematic third vertical cross-sectional views in the Z-X plane taken alone a cross-sectional line CL3 depicted in FIG. 9A. FIGS. 10A, 10B, and 10C are schematic vertical cross-sectional views of a semiconductor structure SS4 in accordance with some alternative embodiments of the disclosure. The elements similar to or substantially the same as the elements described above will use the same reference numbers, and certain details or descriptions of the same elements (e.g., the formations and materials) and the relationship thereof (e.g., the relative positioning configuration and electrical connection) will not be repeated herein. Referring to FIGS. 1H, 2H, and 3H and FIGS. 8A, 8B, and 8C together, the semiconductor structure SS1 depicted in FIGS. 1H, 2H, and 3H and the semiconductor structure SS3 depicted in FIGS. 8A, 8B, and 8C are similar; the difference is that, the semiconductor structure SS3 includes a first-type TSV 360' and a second-type TSV 370', instead of the discrete and independent first-type TSVs 360 and the discrete and independent second-type TSVs 370.

In some embodiments, in the semiconductor substrate SS3, the first-type TSV 360' is formed in a first TSV opening OP1' formed in the substrate 304 to be connected to one of the conductors 350 exposed by the first TSV opening OP1', and the second-type TSV 370' is formed in a second TSV opening OP2' formed in the substrate 304 to be connected to the one of the conductors 350 exposed by the second TSV opening OP2'. For example, the first TSV opening OP1' include a first top cavity OP1*t* and a plurality of first bottom cavities OP1*b* spatially communicated with the first top cavity OP1*t*, where the first bottom cavities OP1*b* at least penetrate through a portion of the device layer 300, the first top cavity OP1*t* penetrates through the rest of the device layer 300, and an interface of the first bottom cavities OP1*b* and the first top cavity OP1*t* is offset from the source/drain regions 326 in the direction Z. As shown in FIGS. 8B and 8C, the interface of the first bottom cavities OP1*b* and the first top cavity OP1*t* may be overlapped with the isolation structure 312 and the substrate 304 and be offset from the source/drain regions 326 in the direction Z. Alternatively, the interface of the first bottom cavities OP1*b* and the first top cavity OP1*t* may be only overlapped with the substrate 304 and be offset from the source/drain regions 326 and the isolation structure 312 in the direction Z. In the case, the first-type TSV 360' (including a barrier layer 362 and a main body 364) formed in the first TSV opening OP1' has a comb-shaped cross section, as shown in FIG. 8B, where more than one conductor 350 is connected to the first TSV 360'.

On the other hand, for example, the second TSV opening OP2' include a second top cavity OP2*t* and a plurality of second bottom cavities OP2*b* spatially communicated with the second top cavity OP2*t*, where the second bottom cavities OP2*b* at least penetrate through a portion of the device layer 300, the second top cavity OP2*t* penetrates through the rest of the device layer 300, and an interface of the second bottom cavities OP2*b* and the second top cavity OP2*t* is offset from the source/drain regions 326 in the direction Z. Similar to the configuration of the first TSV openings OP1', the interface of the second bottom cavities OP2*b* and the second top cavity OP2*t* may be overlapped with the isolation structure 312 and the substrate 304 and be offset from the source/drain regions 326 in the direction Z. Alternatively, the interface of the second bottom cavities OP2*b* and the second top cavity OP2*t* may be only overlapped with the substrate 304 and be offset from the source/drain regions 326 and the isolation structure 312 in the direction Z. In the case, the second-type TSV 370' (including a barrier layer 372 and a main body 374) formed in the second TSV opening OP2' has a comb-shaped cross section, where more than one conductor 350 is connected to the second TSV 370'.

As shown in FIG. 9A through FIG. 9D, for example, the first-type TSV 360' is continuously extended along the direction Y and across over multiple conductors 350, and the second-type TSV 370' is continuously extended along the direction Y and across over the same multiple conductors 350, where a pair of first-type TSV 360' and second-type TSV 370' are arranged along the direction X and connected to the same conductors 350. In some embodiments, as shown in FIGS. 8B and 8C in conjunction with FIG. 9A, the interconnect 200 is connected to (e.g., in physical contact with) the first-type TSV 360' and the second-type TSV 370', where some of the conductors 350, the first-type TSV 360' connected to and standing on these conductors 350, the second-type TSV 370' connected to and standing on these conductors 350, and the metallization layers (e.g., the conductive lines 210a) connected to the first-type TSV 360' and the second-type TSV 370' together constitute an integrated thermoelectric generator (TEG) in one, some, or all of the unit cells U of the semiconductor structure SS3. The integrated TEG may be referred to as through-silicon integrated TEG. In other words, the semiconductor structure SS3 may include one or more integrated TEGs. Owing to such integrated TEG(s) formed in the semiconductor structure SS3, the electric potential, the electric energy being converted from the heat energy through the integrated TEG(s), can be greatly increased. In some embodiments, two adjacent conductors 350 are separated from each other by one gate structure 338 covering one semiconductor fin 308, see FIG. 9A. However, the disclosure is not limited thereto; alternatively, in one cell unit U, two adjacent conductors 350 are separated from each other by one gate structure 338 covering two semiconductor fins 308 (FIG. 9B), one gate structure 338 covering three semiconductor fins 308 (FIG. 9C), one gate structure 338 covering fourth semiconductor fins 308 (FIG. 9D), or one gate structure 338 covering more than fourth semiconductor fins 308 (not shown).

Similarly, in alternative embodiments, the conductive terminals 400 may be omitted and a battery 240 may be further included to be embedded inside the interconnect 200, see the semiconductor structure SS4 in FIGS. 10A, 10B, and 10C. With this embedded battery 240, more amount of the electric energy which being converted from the heat energy (generated in the operation of the devices 3000) via the TEG(s) embedded in the semiconductor structure SS4 may be stored in the battery 240 for later-use.

In the above embodiments, the semiconductor structures SS1, SS2, SS3, and SS4 are in a wafer or panel form. In other words, the semiconductor structures SS1, SS2, SS3, and SS4 may be processed in the form of a reconstructed wafer/panel. The semiconductor structures SS1, SS2, SS3, and SS4 may be in a form of wafer-size having a diameter of about 4 inches or more. The semiconductor structures SS1, SS2, SS3, and SS4 may be in a form of wafer-size having a diameter of about 6 inches or more. The semiconductor structures SS1, SS2, SS3, and SS4 may be in a form of wafer-size having a diameter of about 8 inches or more. Or alternatively, the semiconductor structures SS1, SS2, SS3, and SS4 may be in a form of wafer-size having a diameter of about 12 inches or more. Alternatively, a semiconductor structure may be in a die or chip form, see semiconductor structures SS5, SS6, SS7, and/or SS8.

Figure 11A:
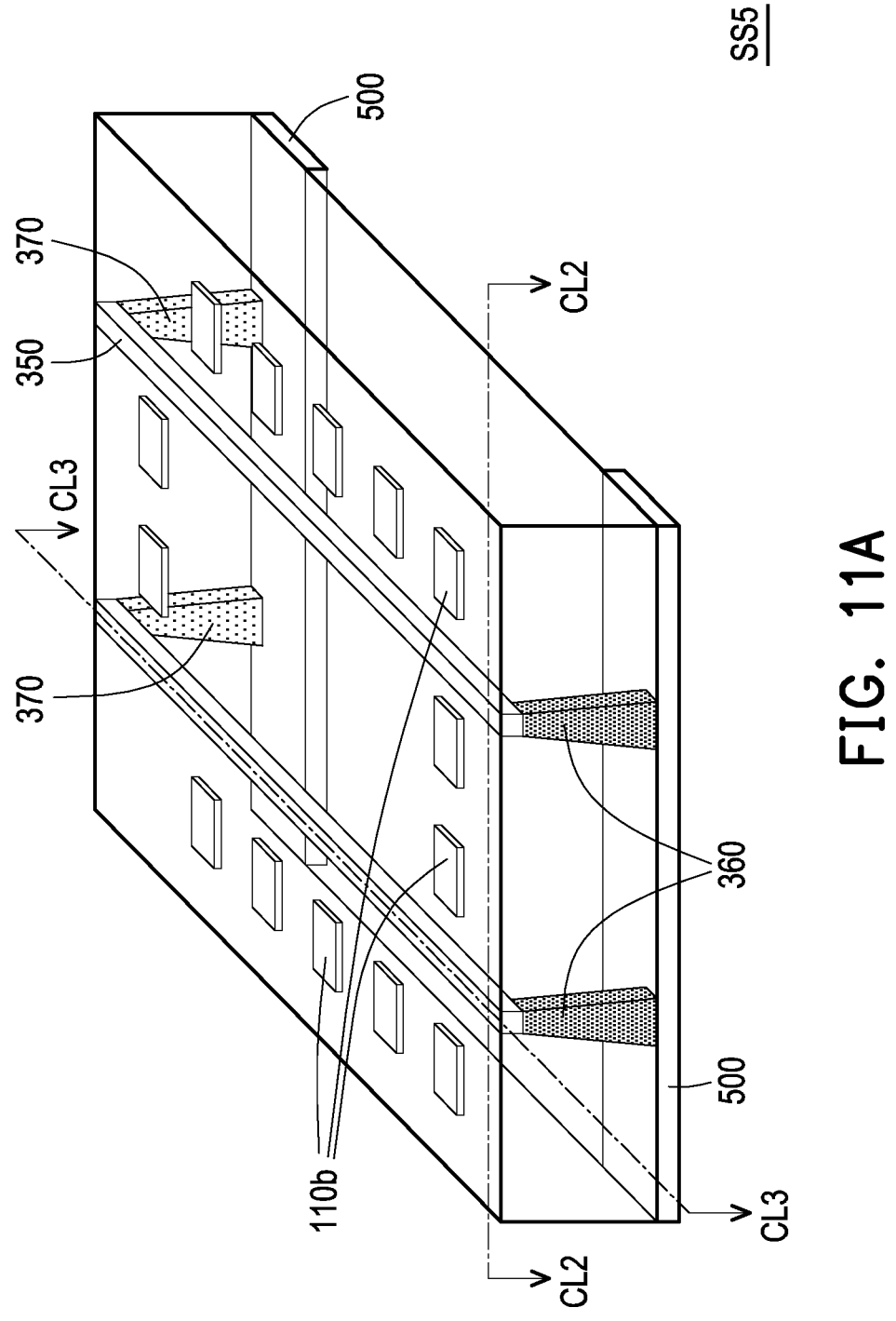
FIGS. 11A, 11B, and 11C are schematic three-dimensional perspective and vertical cross-sectional views of a semiconductor structure in accordance with some embodiments of the disclosure.
Figure 11B:
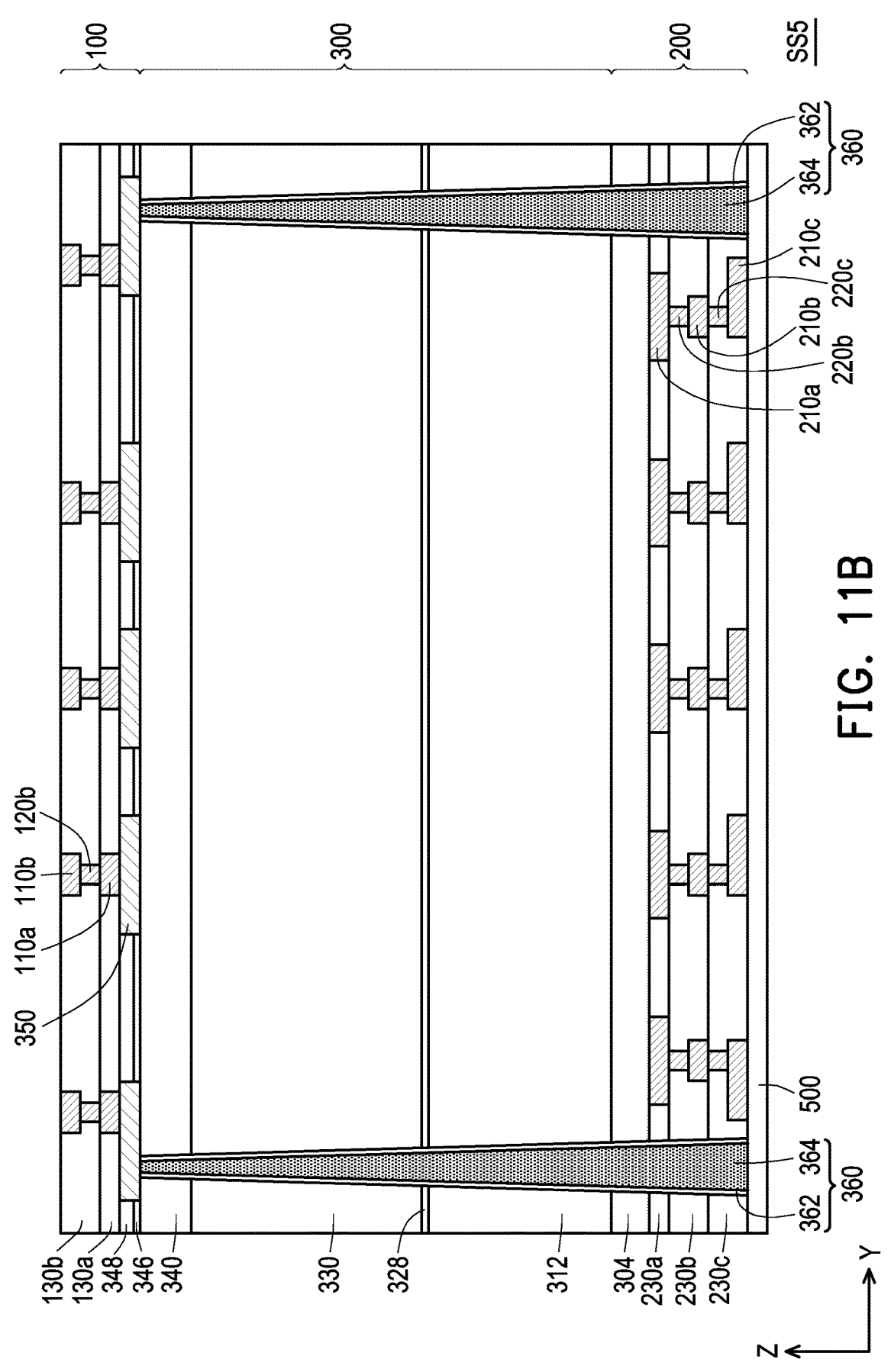
Figure 11C:
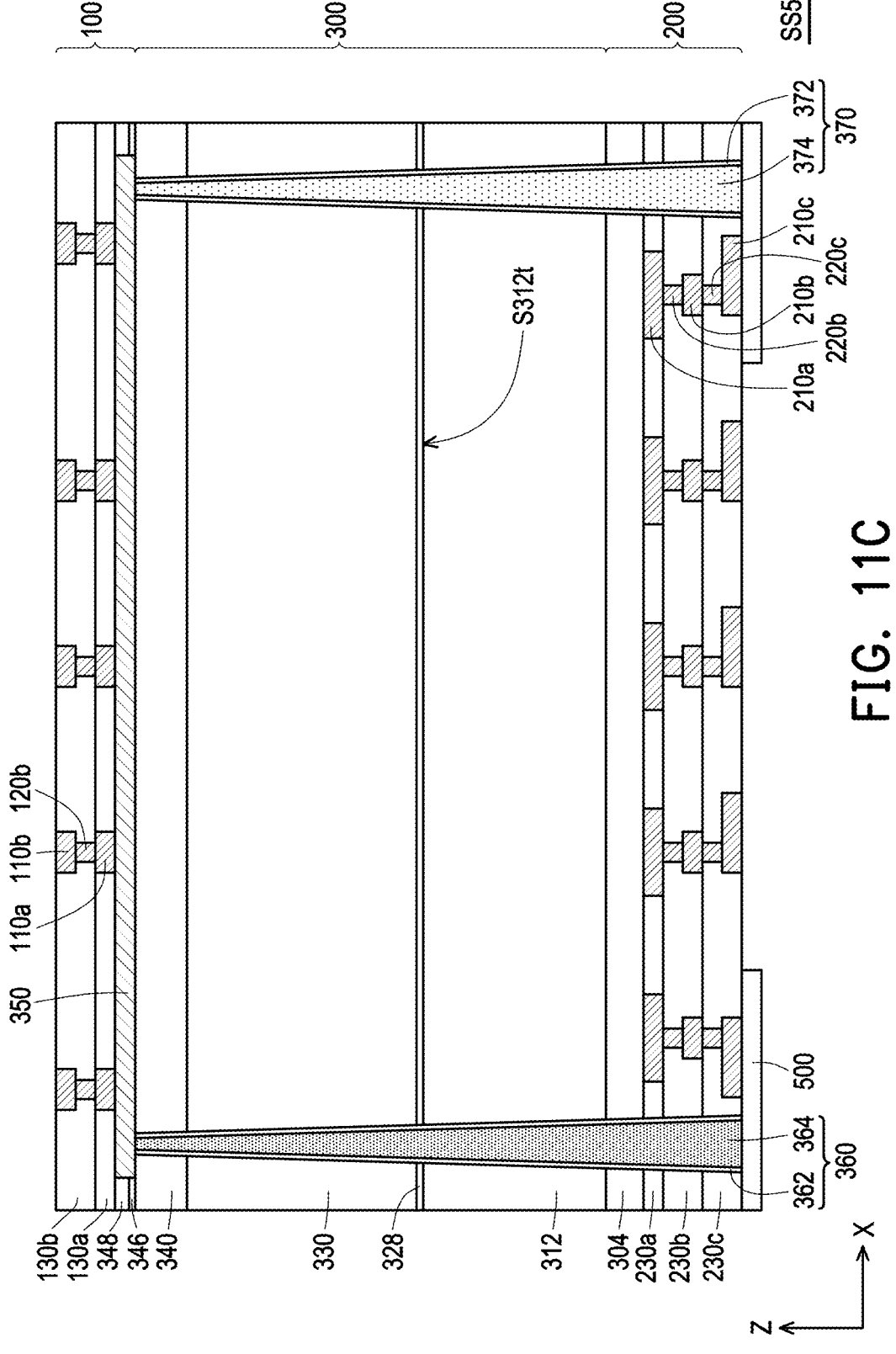
Figure 12B:
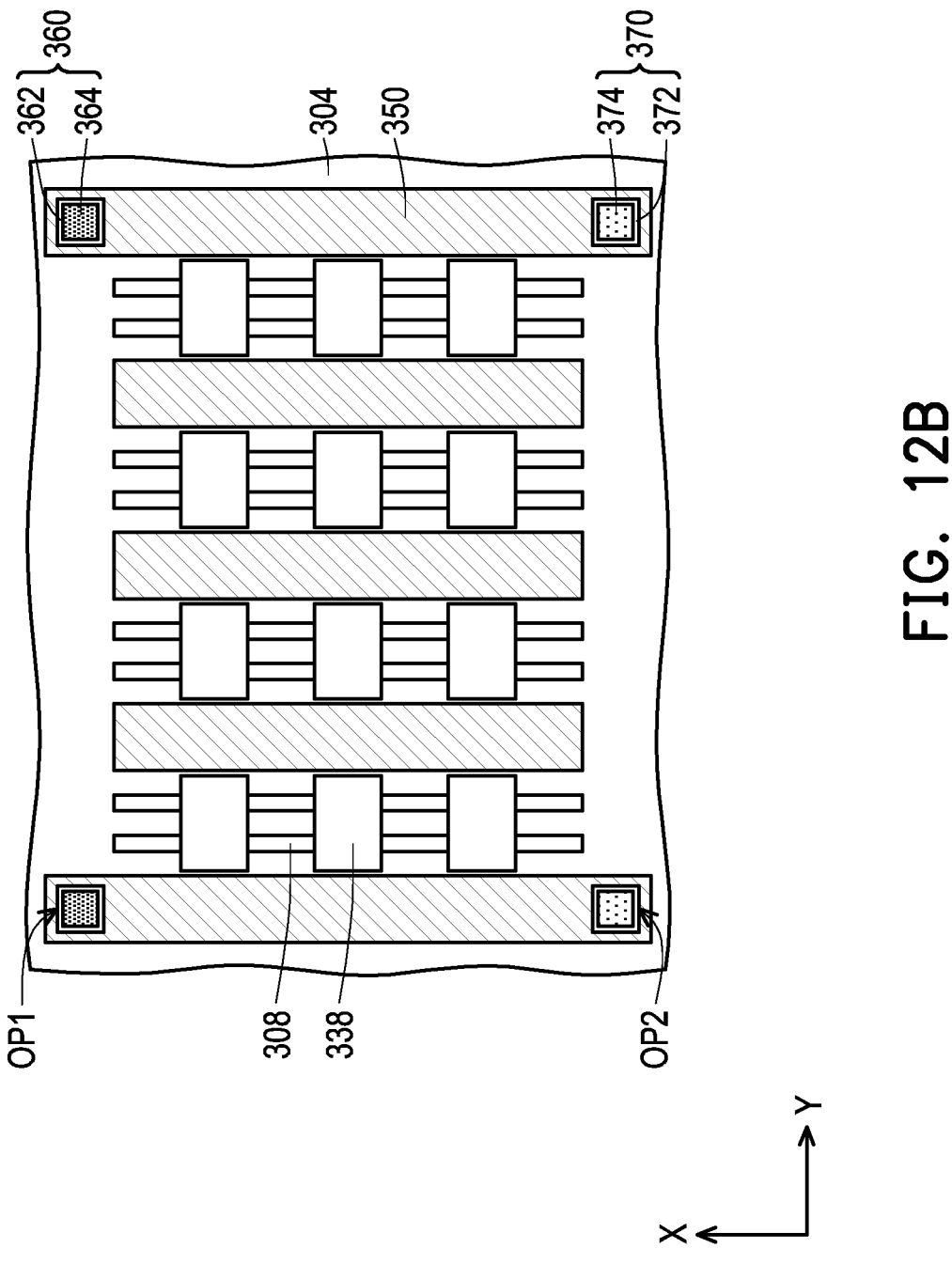
Figure 12C:
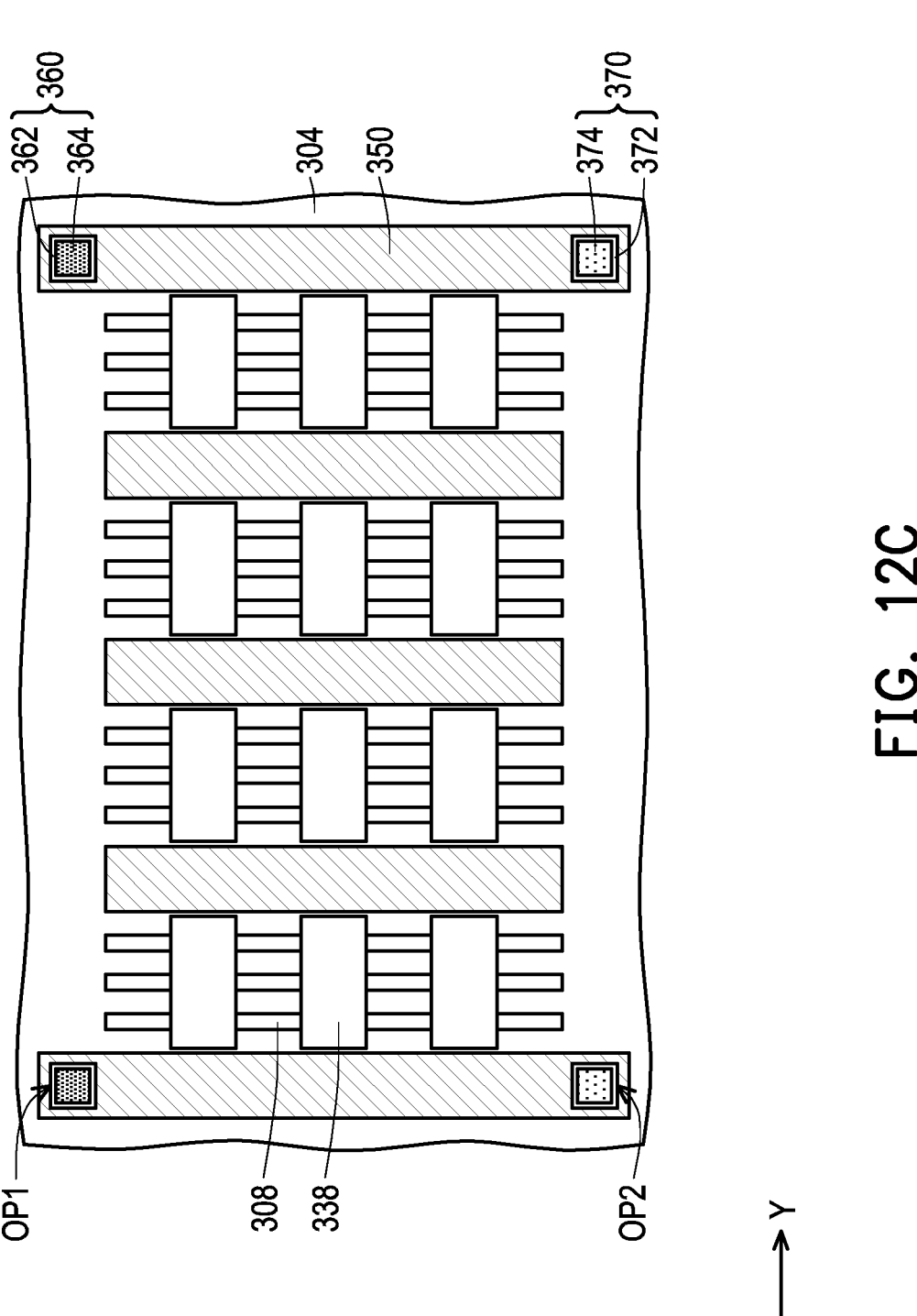
Figure 12D:
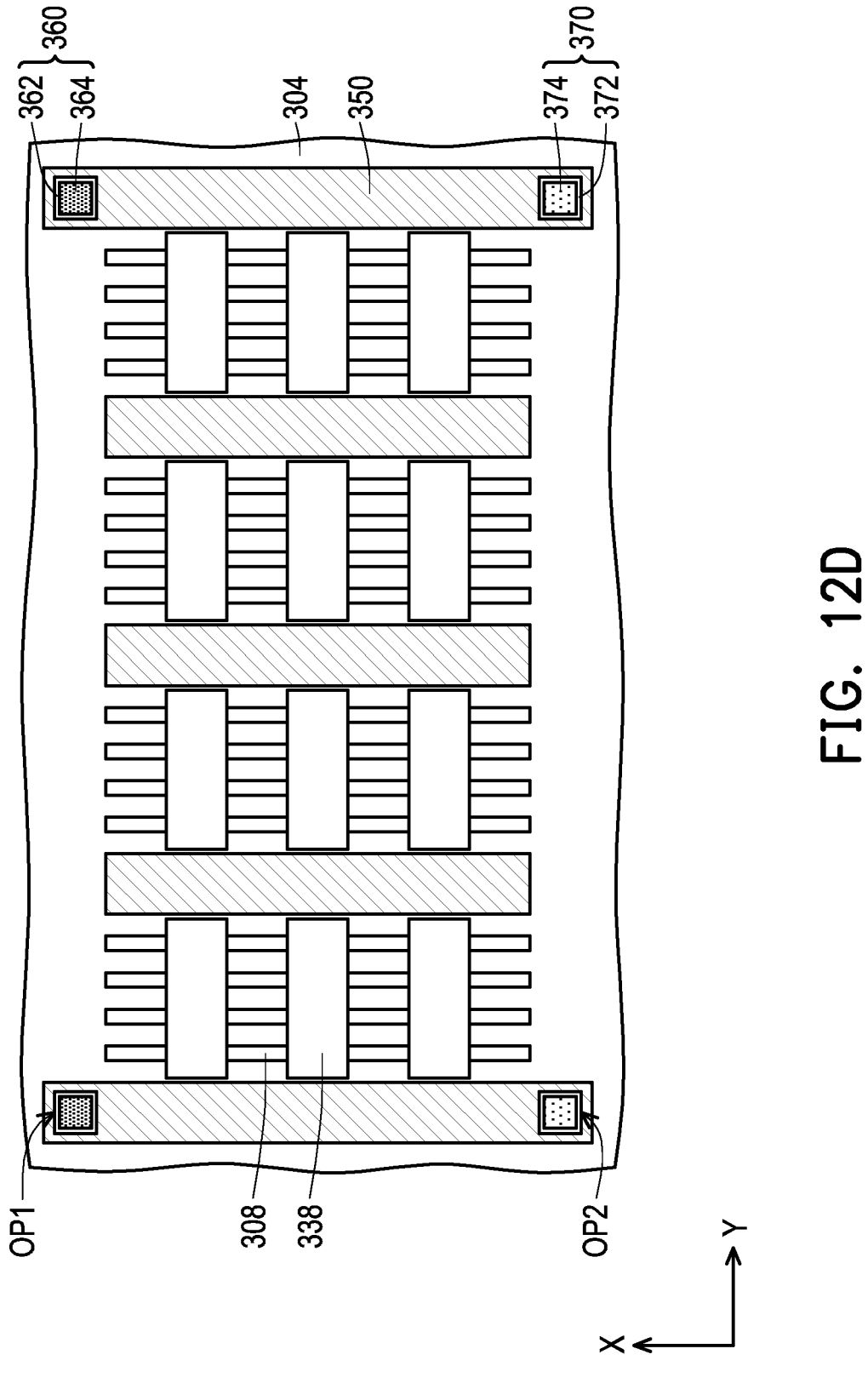
Figure 13A:
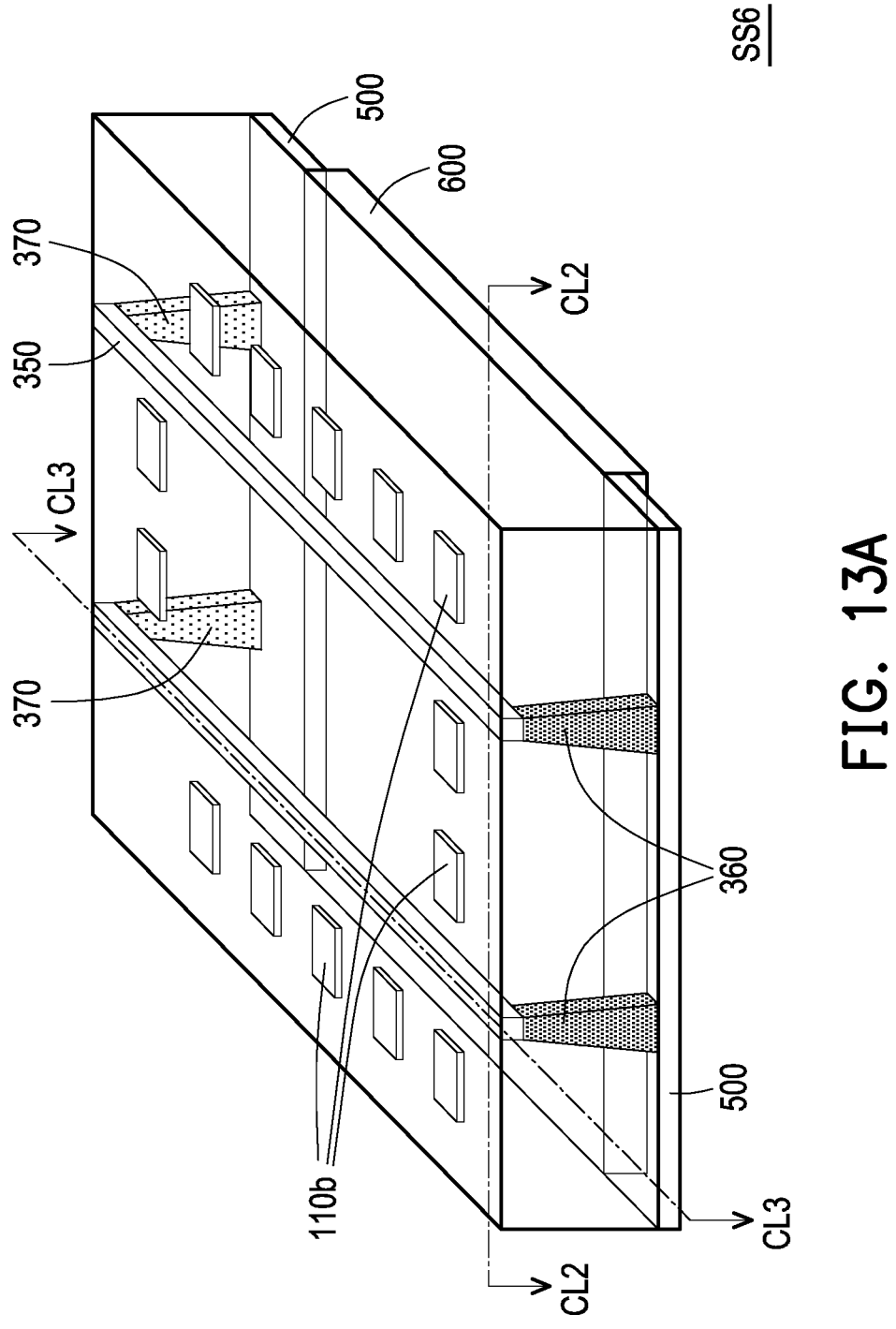
Figure 13B:
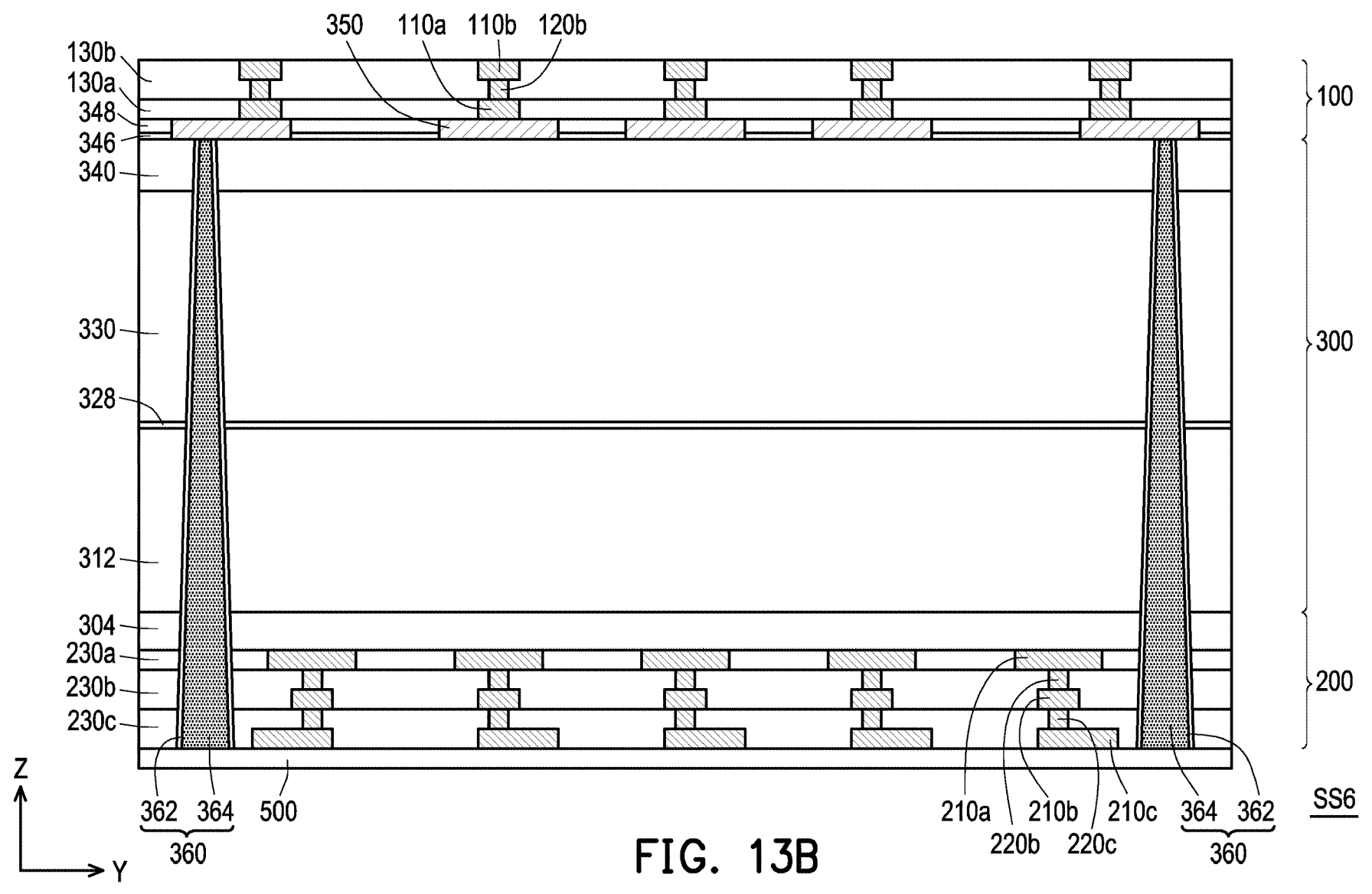
Figure 13C:
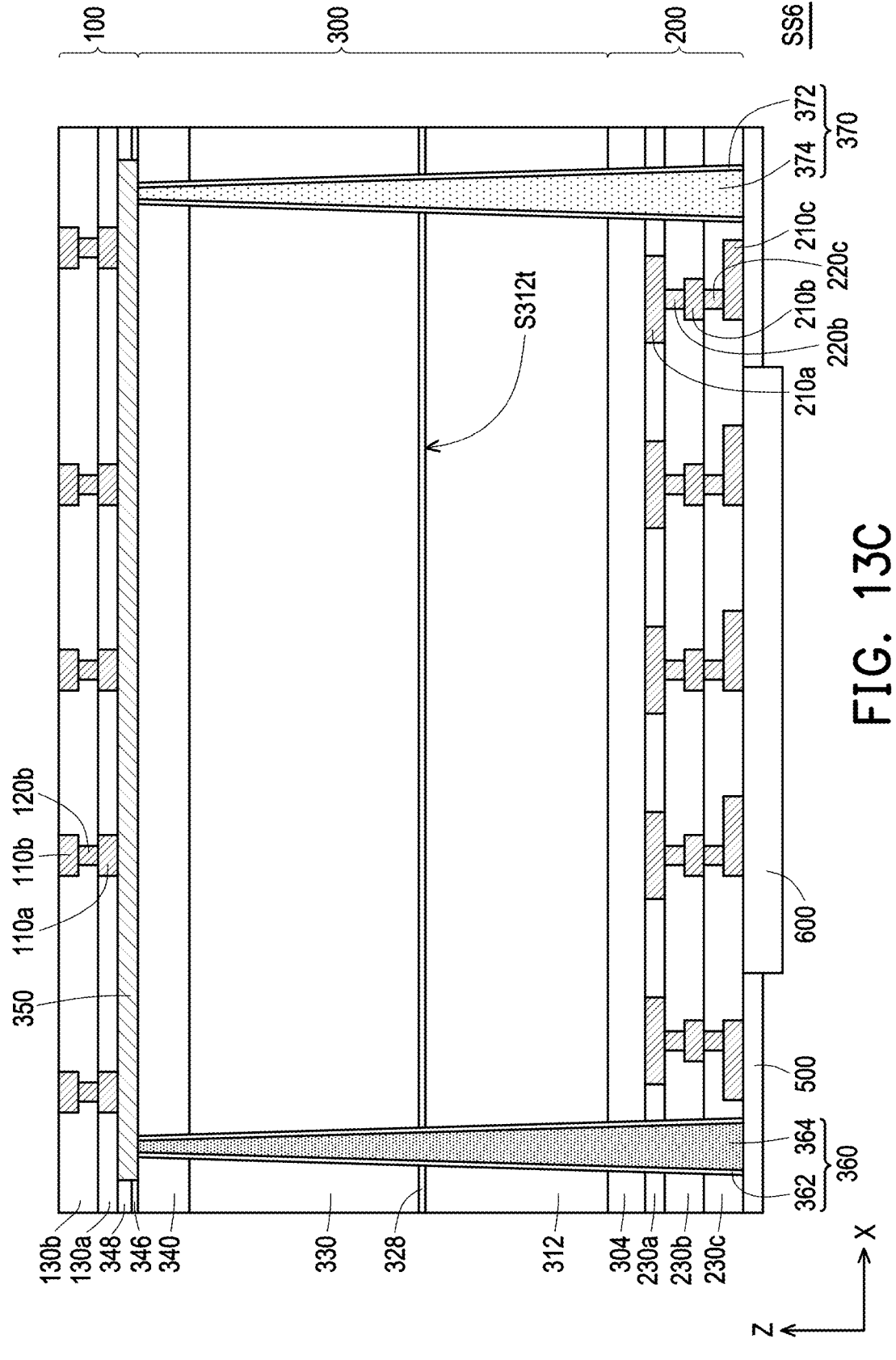

FIGS. 11A, 11B, and 11C are schematic three-dimensional perspective and vertical cross-sectional views of the semiconductor structure SS5 in accordance with some embodiments of the disclosure. FIG. 12A is a schematic horizontal cross-sectional view of the semiconductor structure SS5 along the X-Y plane corresponding to FIGS. 11B and 11C, where FIGS. 12B, 12C, and 12D are schematic horizontal cross-sectional views illustrating other possible non-limiting embodiments of the semiconductor structure SS5. For example, FIG. 11A is the schematic three-dimensional perspective view of the semiconductor structure SS5, FIG. 11B is a schematic second vertical cross-sectional view in the Z-Y plane taken alone a cross-sectional line CL2 depicted in FIG. 11A and FIG. 12A, and FIG. 11C is a schematic third vertical cross-sectional views in the Z-X plane taken alone a cross-sectional line CL3 depicted in FIG. 11A and FIG. 12A. FIGS. 13A, 13B, and 13C are schematic three-dimensional perspective and vertical cross-sectional views of a semiconductor structure SS6 in accordance with some alternative embodiments of the disclosure. The elements similar to or substantially the same as the elements described above will use the same reference numbers, and certain details or descriptions of the same elements (e.g., the formations and materials) and the relationship thereof (e.g., the relative positioning configuration and electrical connection) will not be repeated herein.

Referring to FIGS. 11A, 11B, and 11C, in some embodiments, the semiconductor structure SS5 includes an interconnect 100, an interconnect 200, a device layer 300 including the devices 3000 interposed between and electrically connected to the interconnect 100 and the interconnect 200, a plurality of conductors 500 disposed on and electrically coupled to the interconnect 200, and at least one TEG extending between and electrically connected to the interconnect 100 and the interconnect 200. For example, the semiconductor structure SS5 includes one or multiple unit cells U interconnected therebetween. The details of the interconnect 100, the interconnect 200, the device layer 300, the devices 3000, and the unit cells U are previously described in FIGS. 1A-1H, 2A-2H, 3A-3H in conjunction with FIGS. 4A-4D, 5A-5D, and 6A-6D, and thus are not repeated herein for brevity. For example, the at least one TEG include a plurality of TEGs each including a pair of a first-type TSV 360 and a second-type TSV 370 connected to a single conductor 350, where the first-type TSVs 360 are arranged along a first side (or edge) of the semiconductor structure SS5, and the second-type TSVs 370 are arranged along a second side (or edge) of the semiconductor structure SS5, as shown in FIG. 11A. In the case, the first side (or edge) is opposite to the second side (or edge). That is, for example, the first-type TSVs 360 and the second-type TSVs 370 are disposed at the peripherical region of the semiconductor structure SS5, where the peripherical region surrounds a device region (disposed with the unit cells U/devices 300) of the semiconductor structure SS5. The details of the first-type TSVs 360 and the second-type TSVs 370 are previously described in FIGS. 1F, 2F, and 3F, and thus are not repeated herein for brevity. As illustrated in FIGS. 11A, 11B, and 11C, the interconnect 200 is disposed between and electrically coupled to the conductors 500 and the device layer 300, for example. The formation and material of the conductors 500 may be similar to or substantially identical to the forming process and material of the conductive lines 210a, 210b, 210c of the interconnect 200, and thus are omitted herein. The conductors 500 may be referred to as conductive lines, conductive wires. In some embodiments, the conductors 500 are considered as outermost conductive lines or wires of the interconnect 200.

As shown in FIG. 12A through FIG. 12D, for example, the first-type TSVs 360 are arranged along the direction Y and separated from each other, and the second-type TSVs 370 are arranged along the direction Y and separated from each other, where a pair of one first-type TSV 360 and one second-type TSV 370 are arranged along the direction X and connected to the same conductors 350. In some embodiments, as shown in FIGS. 11B and 11C in conjunction with FIG. 12A, the interconnect 200 is connected to the first-type TSVs 360 and the second-type TSV 370 through the conductors 500, where one conductor 350, one first-type TSV 360 connected to and standing on this conductor 350, one second-type TSV 370 connected to and standing on this conductor 350, and the conductors 500 connected to the first-type TSV 360 and the second-type TSV 370 together constitute an thermoelectric generator (TEG) in the semiconductor structure SS5. Owing to the TEG, the heat generated from the devices 3000 can be converted to electric energy for re-use, such as refreshing the embedded RAM(s) or pre-charging the embedded capacitor(s). The TEG may be referred to as through-silicon TEG. The number of the first-type TSVs 360 and the number of the second-type TSVs 370 may not limited to the drawings of the embodiments, and may be selected and designated based on the demand and design requirements. In other words, the semiconductor structure SS5 may include one or more TEGs. In some embodiments, two adjacent conductors 350 are separated from each other by one gate structure 338 covering one semiconductor fin 308, see FIG. 12A. However, the disclosure is not limited thereto; alternatively, two adjacent conductors 350 are separated from each other by one gate structure 338 covering two semiconductor fins 308 (FIG. 12B), one gate structure 338 covering three semiconductor fins 308 (FIG. 12C), one gate structure 338 covering fourth semiconductor fins 308 (FIG. 12D), or one gate structure 338 covering more than fourth semiconductor fins 308 (not shown).

In alternative embodiments, a battery 600 may be further included to be disposed on an outermost surface of the interconnect 200 and electrically coupled to the interconnect 200 through the conductors 500, see the semiconductor structure SS6 in FIGS. 13A, 13B, and 13C. With this external battery 600, more amount of the electric energy which being converted from the heat energy (generated in the operation of the devices 3000) via the TEG(s) embedded in the semiconductor structure SS6 may be stored in the battery 600 for later-use.

Figure 14A:
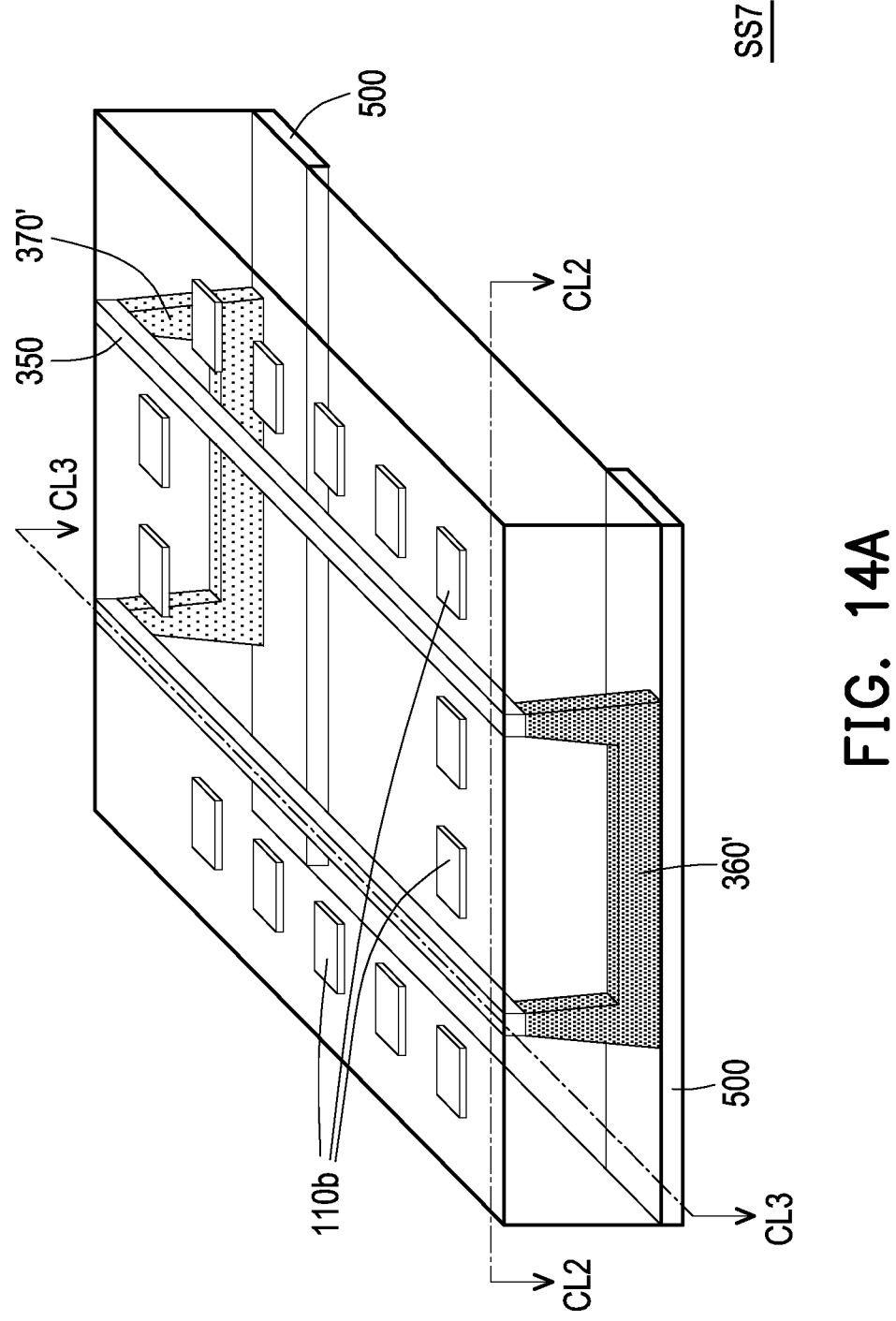
FIGS. 14A, 14B, and 14C are schematic three-dimensional perspective and vertical cross-sectional views of a semiconductor structure in accordance with some embodiments of the disclosure.
Figure 14B:
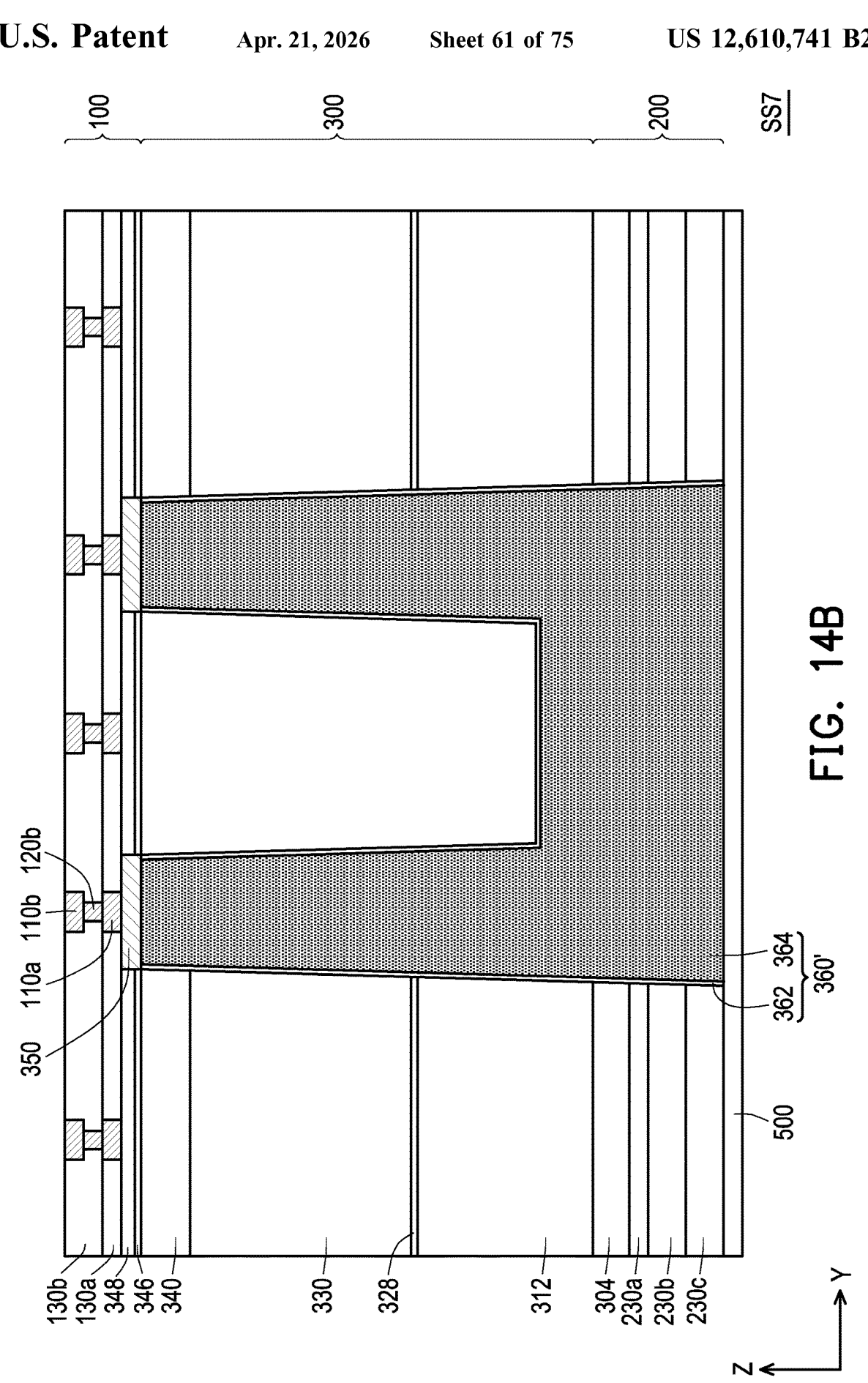
Figure 14C:
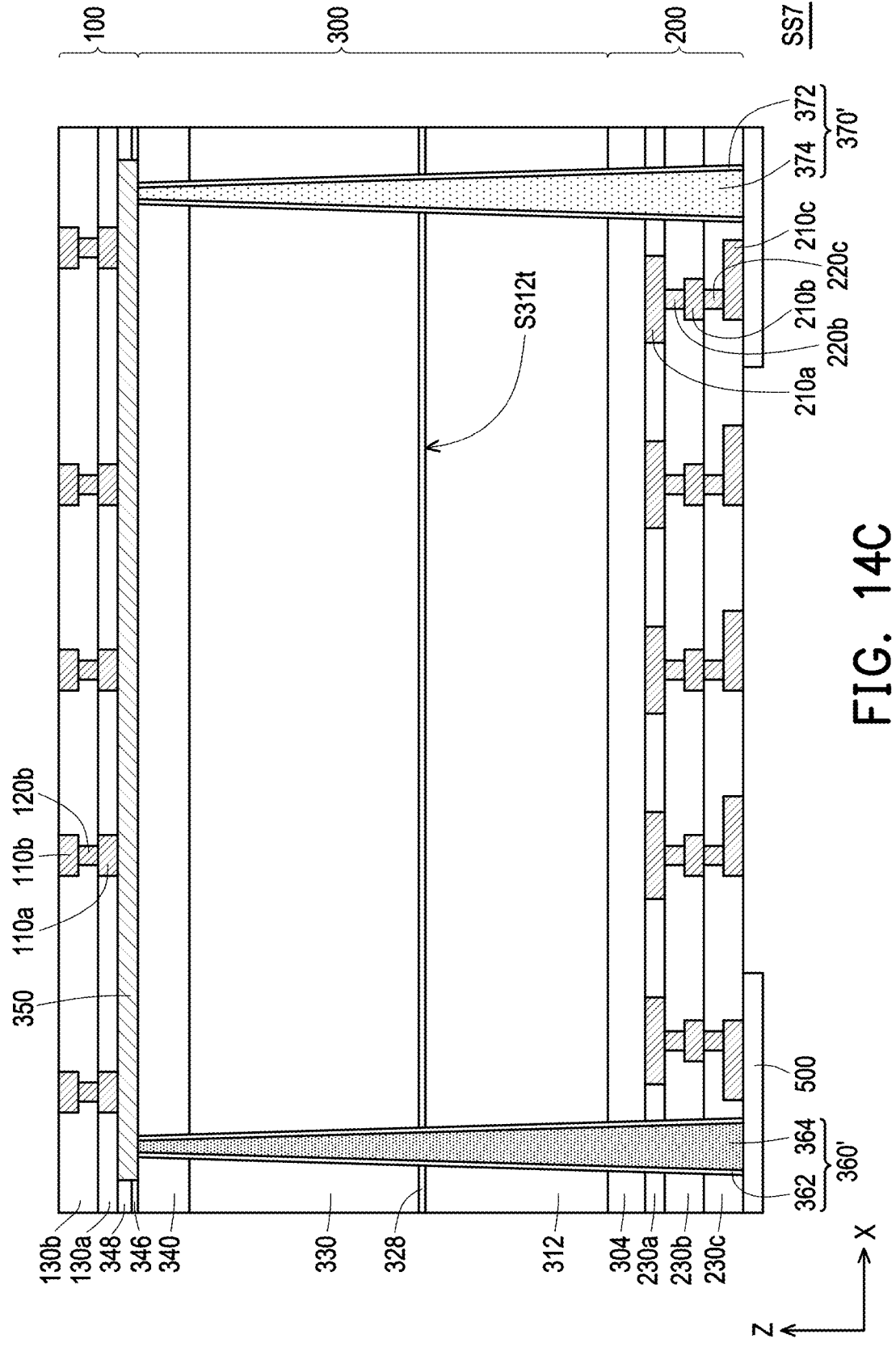
Figure 15B:
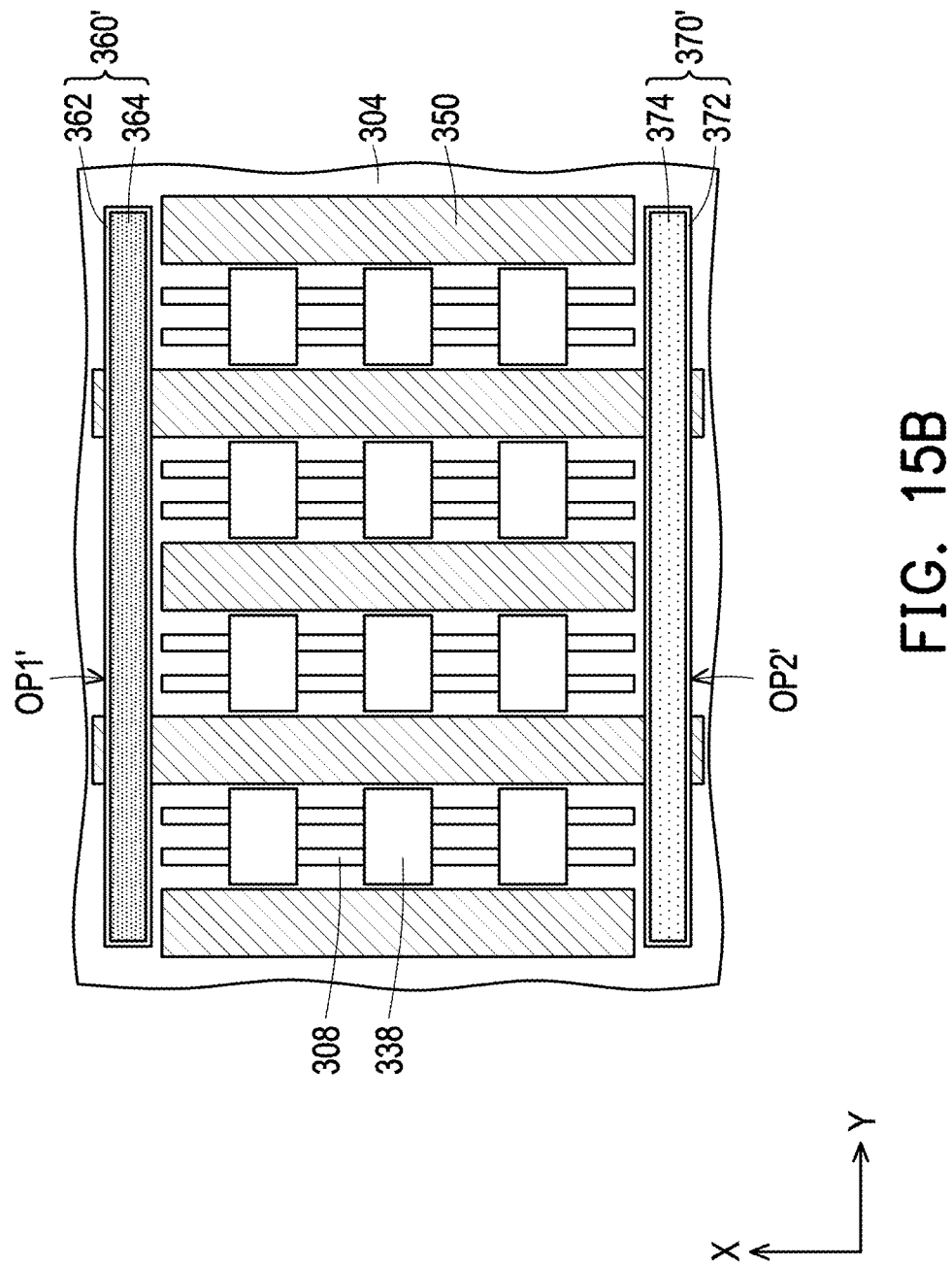
Figure 15C:
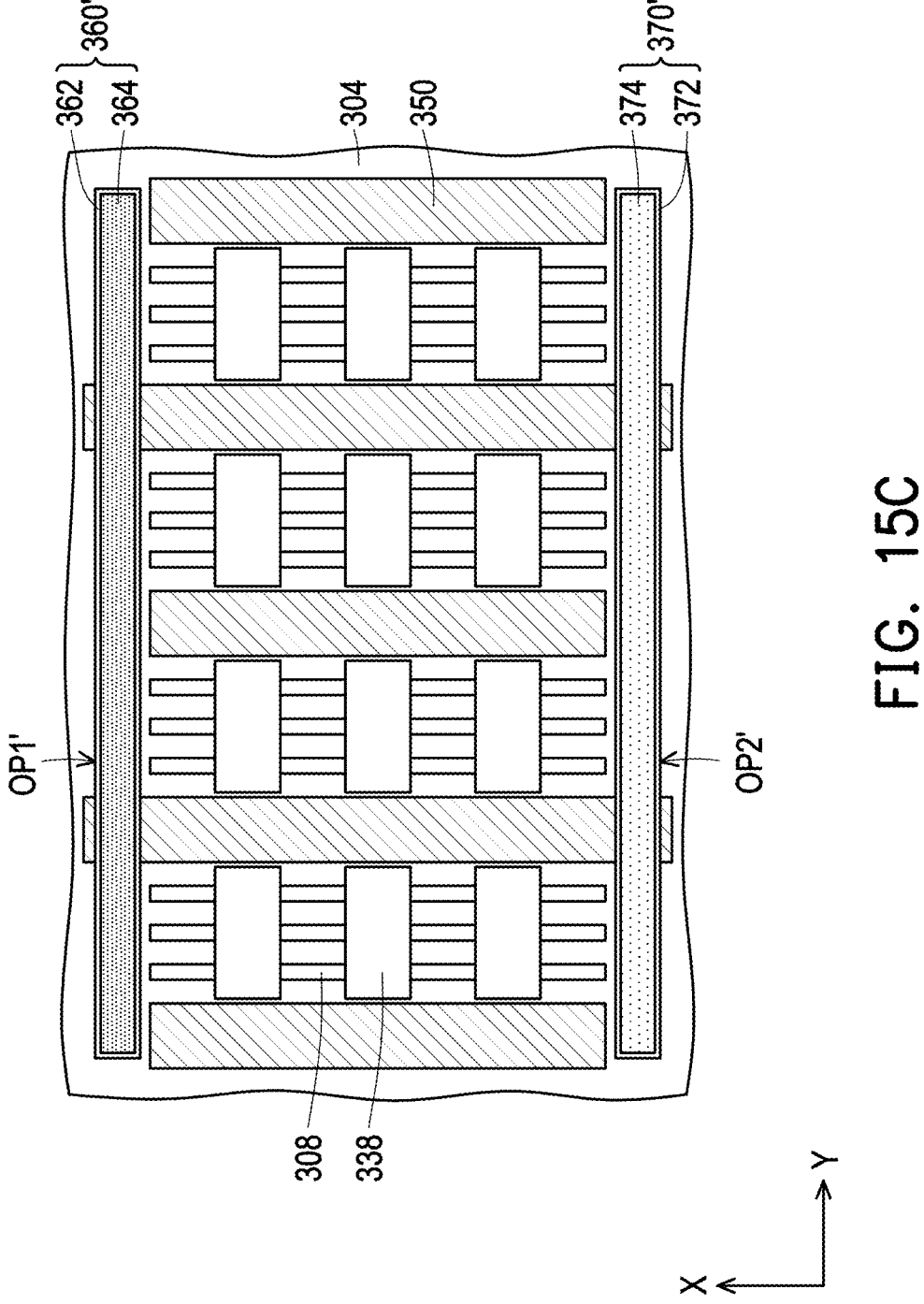
Figure 15D:
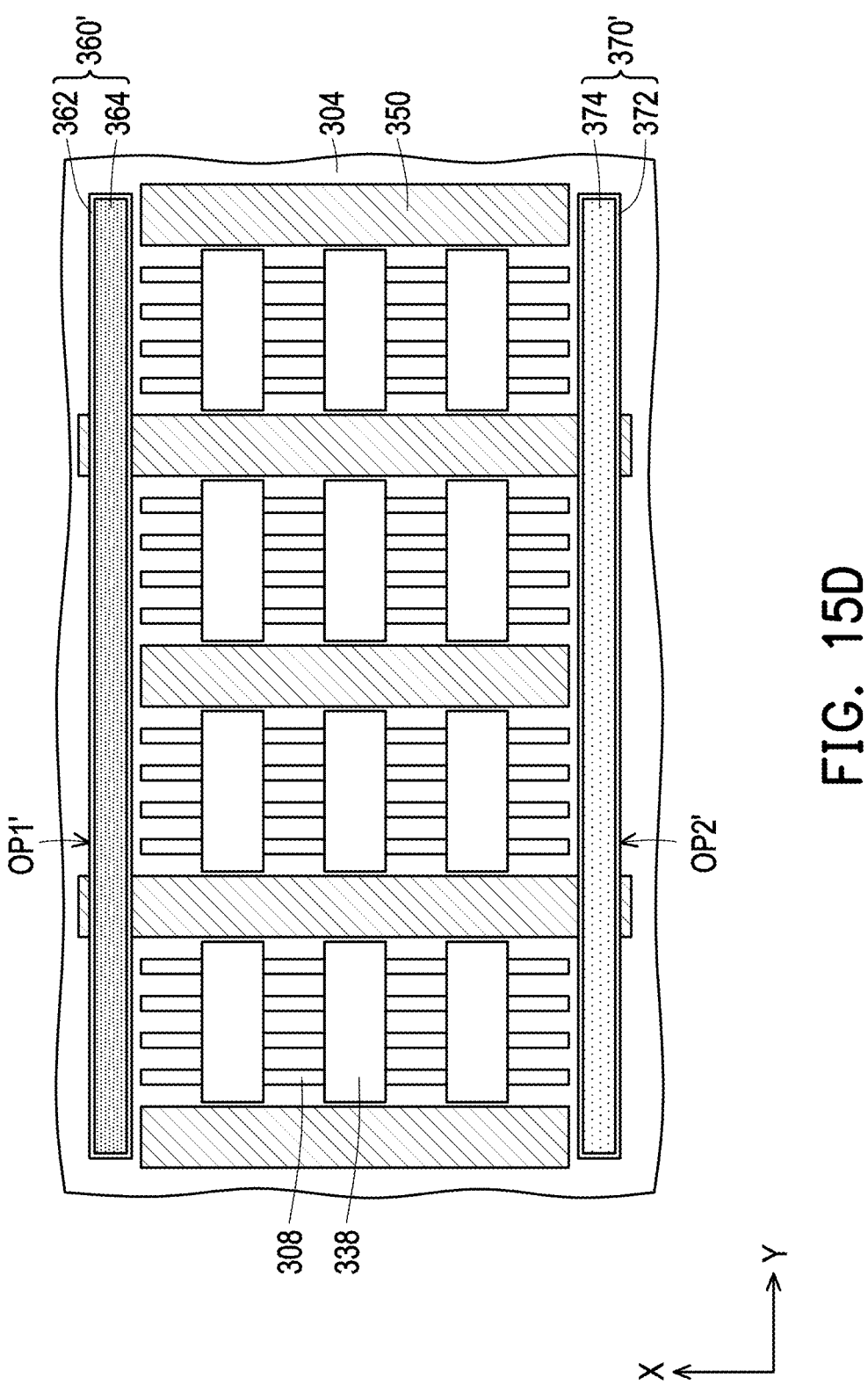
Figure 16A:
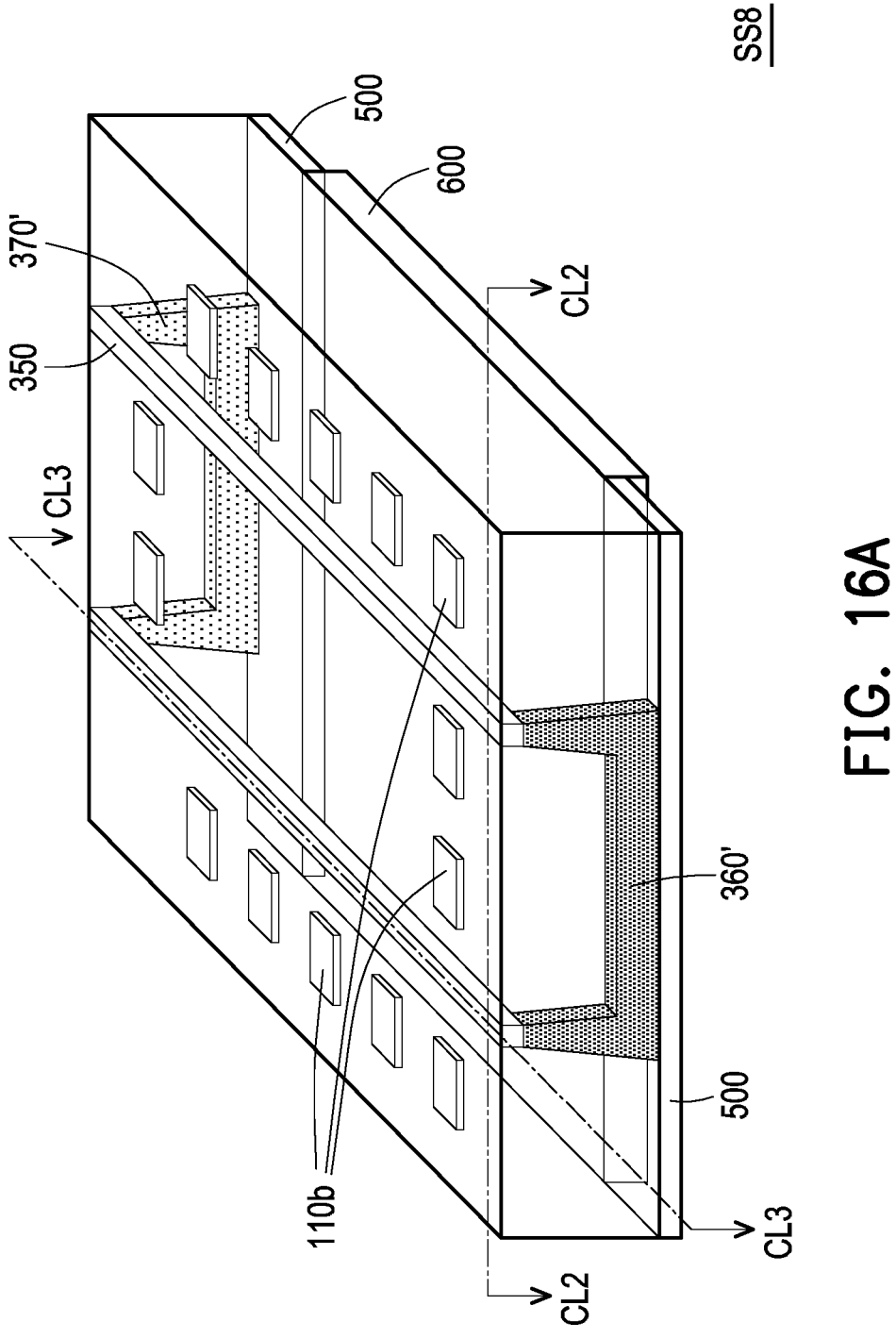
FIGS. 16A, 16B, and 16C are schematic three-dimensional perspective and vertical cross-sectional views of a semiconductor structure in accordance with some alternative embodiments of the disclosure.
Figure 16B:
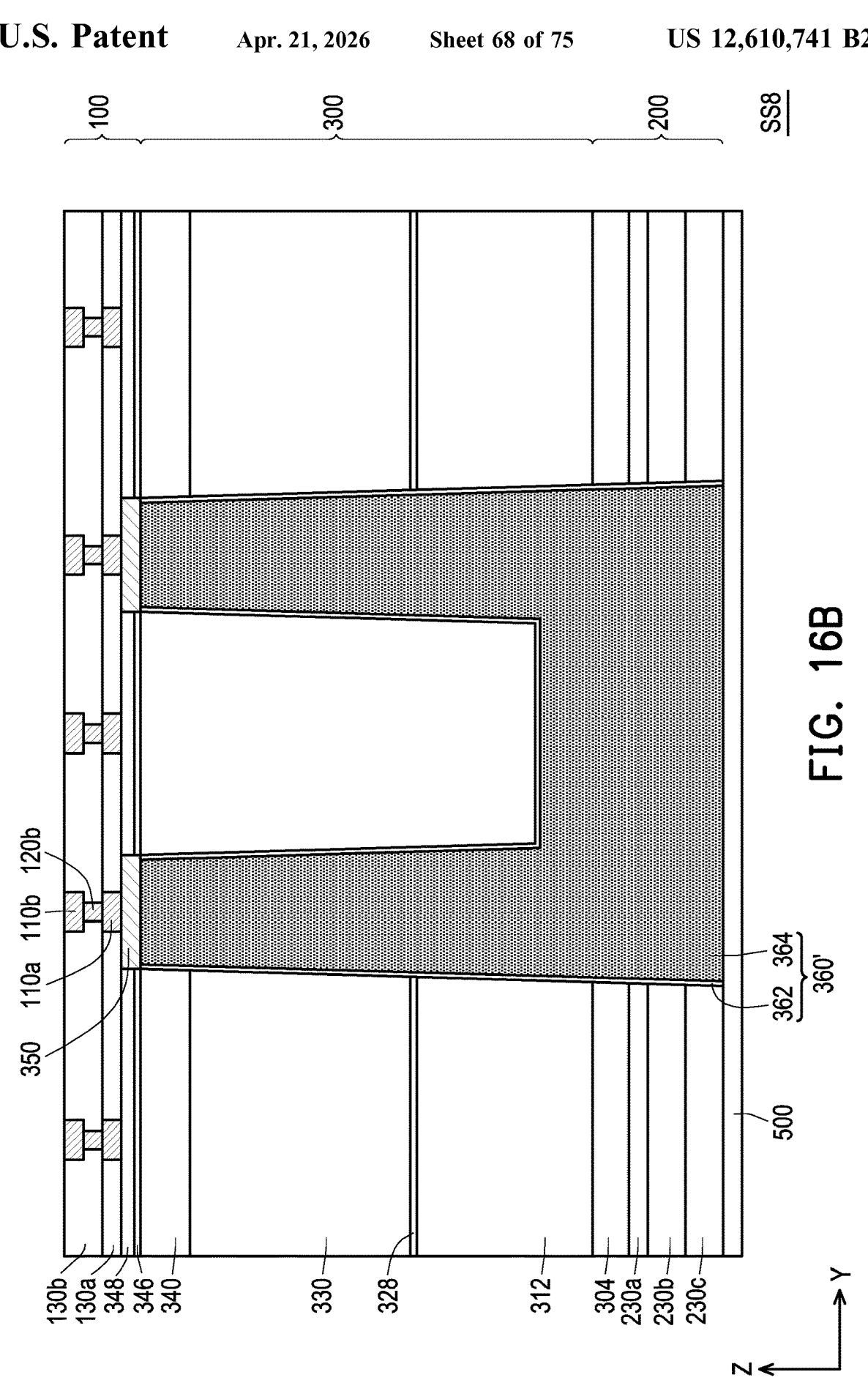
Figure 16C:
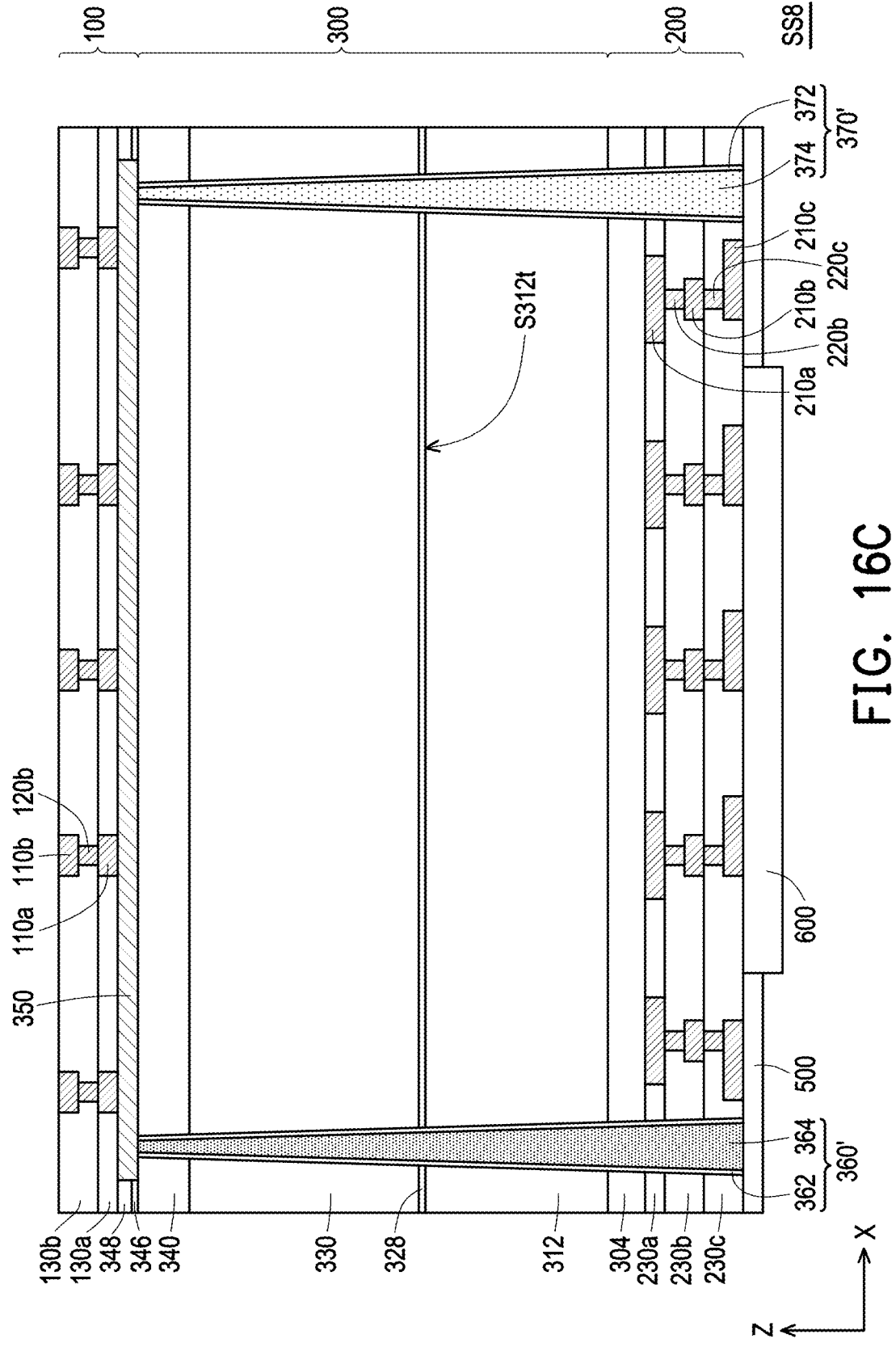

Alternatively, the first-type TSVs 360 each having a quadrilateral-shaped cross section (such as the cross section of a columnar shape or trapezoidal shape) may be replaced with one first-type TSV having a comb-shaped cross section, and the second-type TSVs 370 each having a quadrilateral-shaped cross section (such as the cross section of a columnar shape or trapezoidal shape) may be replaced with one second-type TSV having a comb-shaped cross section, within a semiconductor structure. FIGS. 14A, 14B, and 14C are schematic three-dimensional perspective and vertical cross-sectional views of the semiconductor structure SS7 in accordance with some embodiments of the disclosure. FIG. 15A is a schematic horizontal cross-sectional view of the semiconductor structure SS7 along the X-Y plane corresponding to FIGS. 14B and 14C, where FIGS. 15B, 15C, and 15D are schematic horizontal cross-sectional views illustrating other possible non-limiting embodiments of the semiconductor structure SS7. For example, FIG. 14A is the schematic three-dimensional perspective view of the semiconductor structure SS7, FIG. 14B is a schematic second vertical cross-sectional view in the Z-Y plane taken alone a cross-sectional line CL2 depicted in FIG. 14A and FIG. 15A, and FIG. 14C is a schematic third vertical cross-sectional views in the Z-X plane taken alone a cross-sectional line CL3 depicted in FIG. 14A and FIG. 15A. FIGS. 16A, 16B, and 16C are schematic three-dimensional perspective and vertical cross-sectional views of a semiconductor structure SS8 in accordance with some alternative embodiments of the disclosure. The elements similar to or substantially the same as the elements described above will use the same reference numbers, and certain details or descriptions of the same elements (e.g., the formations and materials) and the relationship thereof (e.g., the relative positioning configuration and electrical connection) will not be repeated herein.

Referring to FIGS. 11A, 11B, and 11C and FIGS. 14A, 14B, and 14C together, the semiconductor structure SS5 depicted in FIGS. 11A, 11B, and 11C and the semiconductor structure SS7 depicted in FIGS. 14A, 14B, and 14C are similar; the difference is that, the semiconductor structure SS7 includes a first-type TSV 360' and a second-type TSV 370', instead of the discrete and independent first-type TSVs 360 and the discrete and independent second-type TSVs 370. The details of the first-type TSV 360' and the second-type TSV 370' are previously described in FIGS. 8A, 8B, and 8C, and thus are not repeated herein for brevity. The semiconductor structure SS7 may include one integrated TEG or multiple integrated TEGs. Owing to such integrated TEG(s) formed in the semiconductor structure SS7, the electric potential, the electric energy being converted from the heat energy through the integrated TEG(s), can be greatly increased. In some embodiments, two adjacent conductors 350 are separated from each other by one gate structure 338 covering one semiconductor fin 308, see FIG. 15A. However, the disclosure is not limited thereto; alternatively, two adjacent conductors 350 are separated from each other by one gate structure 338 covering two semiconductor fins 308 (FIG. 15B), one gate structure 338 covering three semiconductor fins 308 (FIG. 15C), one gate structure 338 covering fourth semiconductor fins 308 (FIG. 15D), or one gate structure 338 covering more than fourth semiconductor fins 308 (not shown).

Similarly, in alternative embodiments, a battery 600 may be further included to be disposed on an outermost surface of the interconnect 200 and electrically coupled to the interconnect 200 through the conductors 500, see the semiconductor structure SS8 in FIGS. 16A, 16B, and 16C. With this external battery 600, more amount of the electric energy which being converted from the heat energy (generated in the operation of the devices 3000) via the TEG(s) embedded in the semiconductor structure SS8 may be stored in the battery 600 for later-use.

In other alternative embodiments, the first-type TSV 360' may include a wall-shaped cross section (not shown) instead of the comb-like cross section and be connected to multiple conductors 350, and a second-type TSV 370' may include a wall-shaped cross section (not shown) instead of the comb-like cross section and be connected to multiple conductors 350. The disclosure is not limited thereto.

In the above embodiments, the semiconductor structures SS1 through SS8 include a TEG composed of one first-type TSV 360, one second-type TSV 370, one conductor 350 of the device layer 300 connected to the first-type TSV 360 and the second-type TSV 370, and the conductive features (e.g., 210*a* or 500) of the interconnect 200 to the first-type TSV 360 and the second-type TSV 370 or an integrated TEG composed of one first-type TSV 360', one second-type TSV 370', multiple conductors 350 of the device layer 300 connected to the first-type TSV 360' and the second-type TSV 370', and the conductive features (e.g., 210a or 500) of the interconnect 200 connected to the first-type TSV 360' and the second-type TSV 370'. However, the disclosure is not limited thereto; alternatively, in a semiconductor structure of the disclosure, a TEG may be composed of one first-type TSV 360, one second-type TSV 370, one buried power tail of the device layer 300 connected to the first-type TSV 360 and the second-type TSV 370, and the conductive features (e.g., 210a or 500) of the interconnect 200 to the first-type TSV 360 and the second-type TSV 370 or an integrated TEG may be composed of one first-type TSV 360', one second-type TSV 370', multiple buried power tails of the device layer 300 connected to the first-type TSV 360' and the second-type TSV 370', and the conductive features (e.g., 210a or 500) of the interconnect 200 connected to the first-type TSV 360' and the second-type TSV 370', see FIGS. 18A through 18C. Or alternatively, in a semiconductor structure of the disclosure, a TEG may be composed of one first-type TSV 360, one second-type TSV 370, one conductive feature (e.g., 110a, 120b, 110b) of the interconnect 100 connected to the first-type TSV 360 and the second-type TSV 370, and the conductive features (e.g., 210a or 500) of the interconnect 200 to the first-type TSV 360 and the second-type TSV 370 or an integrated TEG may be composed of one first-type TSV 360', one second-type TSV 370', multiple conductive feature (e.g., 110a, 120b, 110b) of the interconnect 100 connected to the first-type TSV 360' and the second-type TSV 370', and the conductive features (e.g., 210a or 500) of the interconnect 200 connected to the first-type TSV 360' and the second-type TSV 370', not shown.

Figure 18A:
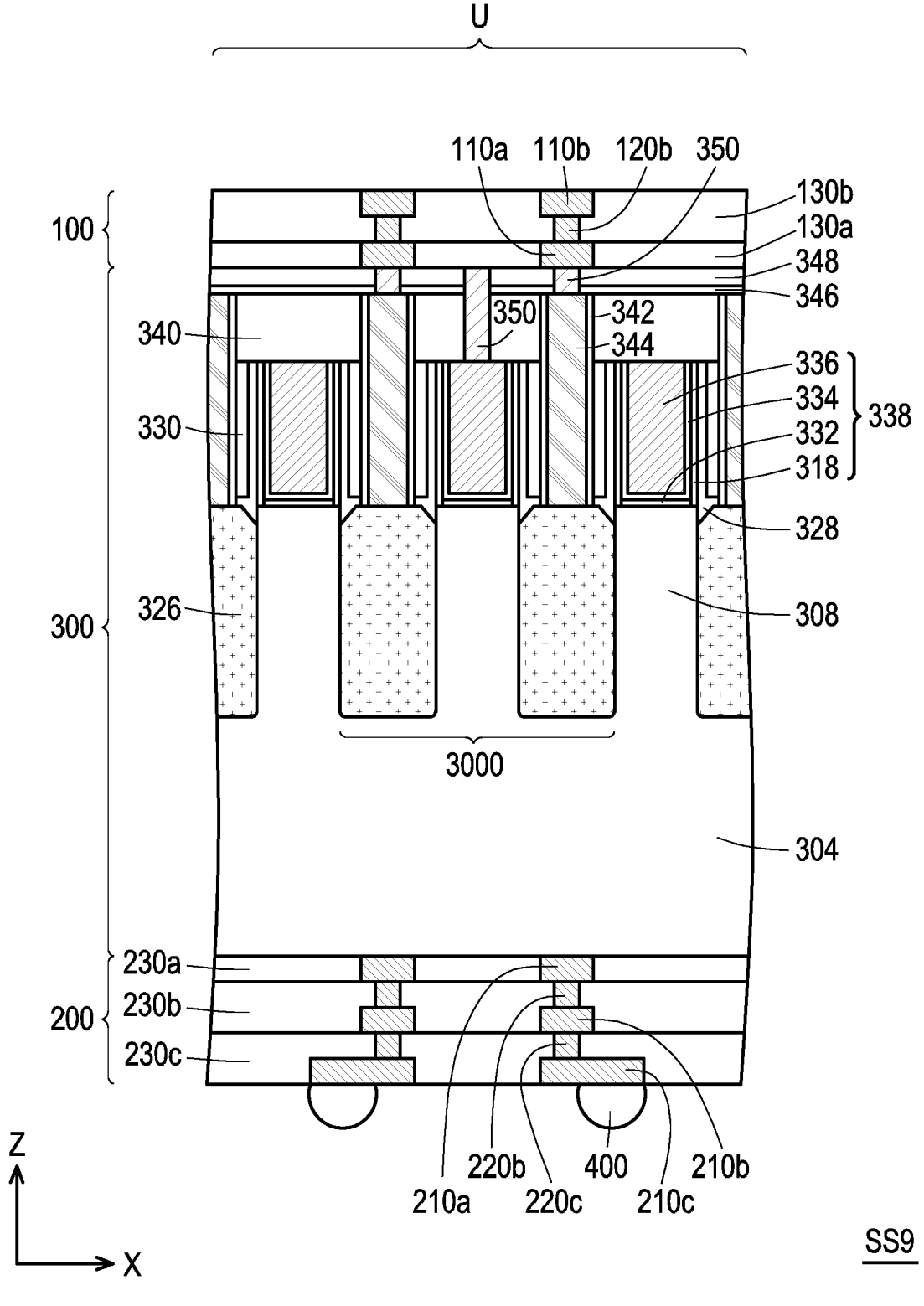
FIGS. 18A, 18B, and 18C are schematic vertical cross-sectional views of a semiconductor structure in accordance with some alternative embodiments of the disclosure.
Figure 18B:
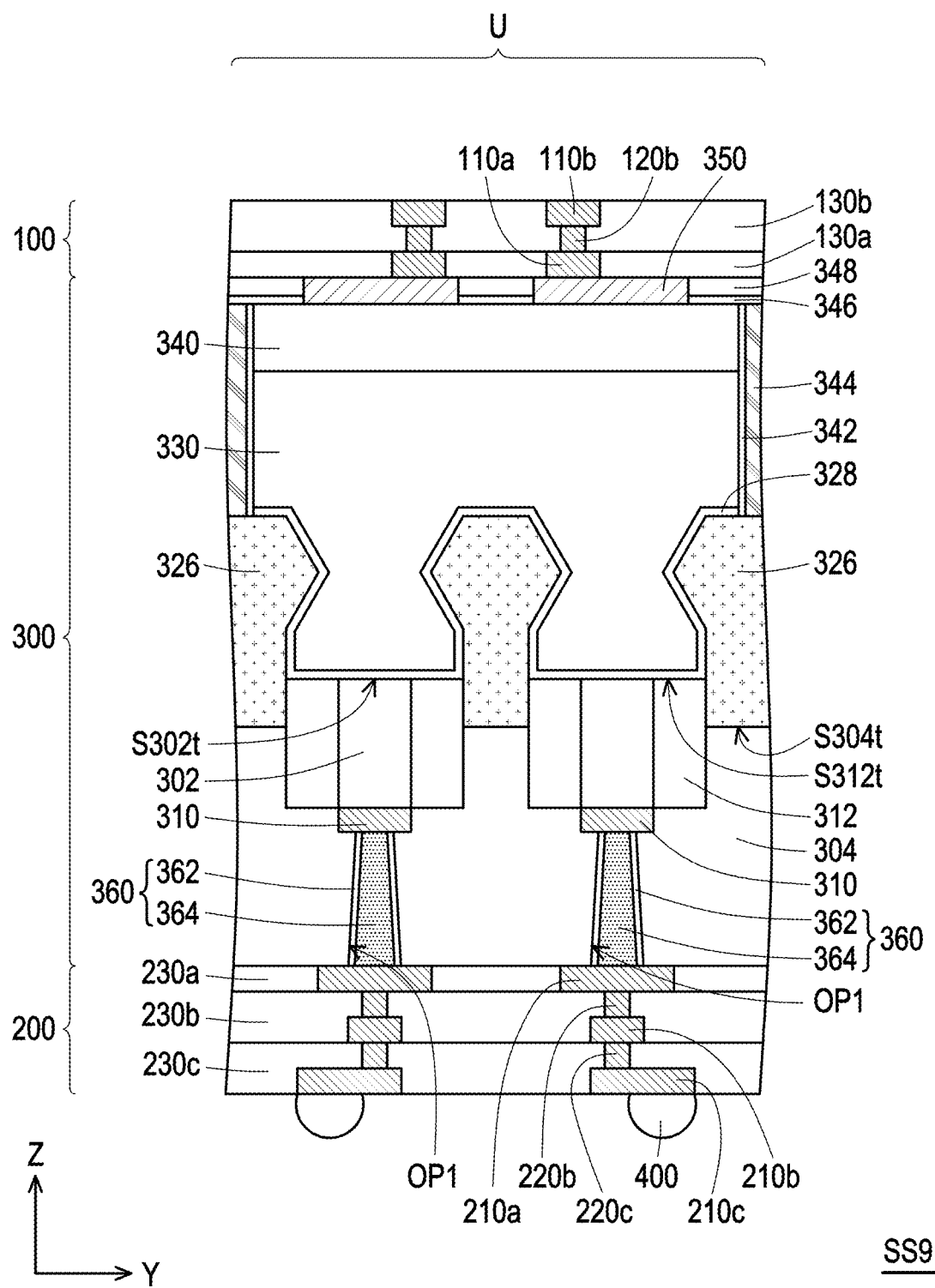
Figure 18C:
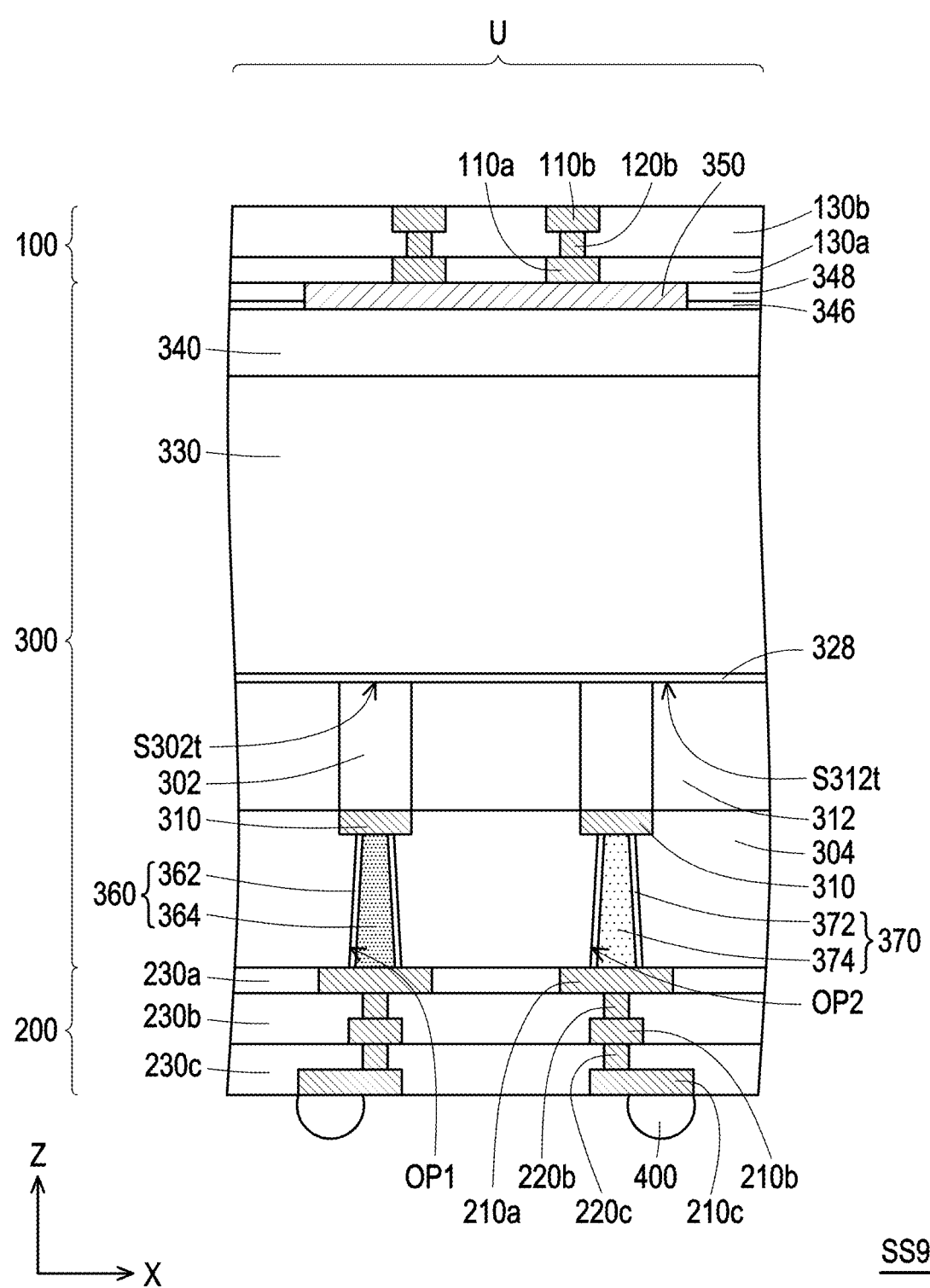

FIGS. 18A, 18B, and 18C are schematic vertical cross-sectional views of a semiconductor structure SS9 in accordance with some alternative embodiments of the disclosure. The elements similar to or substantially the same as the elements described above will use the same reference numbers, and certain details or descriptions of the same elements (e.g., the formations and materials) and the relationship thereof (e.g., the relative positioning configuration and electrical connection) will not be repeated herein. Referring to FIGS. 1H, 2H, and 3H and FIGS. 18A, 18B, and 18C together, the semiconductor structure SS1 depicted in FIGS. 1H, 2H, and 3H and the semiconductor structure SS9 depicted in 18A, 18B, and 18C are similar; the difference is that, the semiconductor structure SS9 include a TEG may be composed of one first-type TSV 360, one second-type TSV 370, one buried power tail 310 of the device layer 300 connected to the first-type TSV 360 and the second-type TSV 370, and the conductive features (e.g., conductive lines 210a) of the interconnect 200 to the first-type TSV 360 and the second-type TSV 370. Owing to the TEG, the heat generated from the devices 3000 can be converted to electric energy for re-use, such as refreshing the embedded RAM(s) or pre-charging the embedded capacitor(s). The TEG may be referred to as through-silicon TEG. The number of the first-type TSVs 360 and the number of the second-type TSVs 370 may not limited to the drawings of the embodiments, and may be selected and designated based on the demand and design requirements. In other words, the semiconductor structure SS9 may include one or more TEGs.

In one embodiments, the semiconductor structure SS9 may be manufactured by the method of FIG. 17 including steps S100 through S600 in conjunction with the method of FIG. 19A and FIG. 19B including steps S101 through S114.

It should be understood that additional processing may occur before, during, and after the illustrated actions of the method of FIG. 17 and the method of FIG. 19A and FIG. 19B to complete formation of the semiconductor structure SS9. The method of FIG. 17 includes at least steps S100 to S600. For example, the method shown in FIG. 17 begins with step S100, which provides an initial structure W1 having a substrate 304, a device(s) 3000 formed on the substrate 304, and a first interconnect 100 electrically coupled to the device(s) 3000. The initial structure W1 provided in the step S100 of the method in FIG. 17 may be manufactured by the method of FIG. 19A and FIG. 19B. For example, the method of FIG. 19A and FIG. 19B includes steps S101 to S114, where the method shown in FIG. 19A and FIG. 19B begins with step S101, which provides a substrate 304; step S102, which forms semiconductor fins 308 on the substrate 304; step S103, which forms a first isolation dielectric to cover the semiconductor fins 308 and preforms a planarization process to the first isolation dielectric; step S104, which forms trenches extending through the first isolation dielectric to the substrate 304 adjacent to the semiconductor fins 308; step S105, which forms a conductive material over the first isolation dielectric and fills the trenches with the conductive material; step S106, which performing a planarization process to the conductive material until the first isolation dielectric is exposed; step S107, which etching the conductive material in the trenches down to a given depth thus forming a plurality of buried power rails 310; step S108, which forming a second isolation dielectric over the first isolation dielectric and filling the trenches with the second isolation dielectric; step S109, which removing the second isolation dielectric over the first isolation dielectric; step S110, which recessing at least one isolation dielectric to form shallow trench isolation (STI) structures, e.g., recessing the first isolation dielectric to form a plurality of isolation structures 312 and recessing the second isolation dielectric to form a plurality of isolation structures 302; step S111, which forming poly-gate structures on the semiconductor fins 308; step S112, which forming source/drain features 326 on the semiconductor fins 308 next to the poly-gate structures; step S113, which replacing the poly-gate structures with metal gate structures 338 to form the device(s) 3000 on the substrate 304; and step S114, which forming the first interconnect 100 to connect the device(s) 3000.

In some embodiments, the second isolation dielectric forming the isolation structure 302 is made of silicon oxide, silicon nitride, silicon oxynitride, FSG, or other low-K dielectric materials. In some embodiments, the second isolation dielectric forming the isolation structure 302 has a material different than the first isolation dielectric forming the isolation structure 312. In alternative embodiments, the second isolation dielectric forming the isolation structure 3020 has a material the same as the first isolation dielectric forming the isolation structure 312. The buried power rails 310 may be referred to as conductive rails, where some of the buried power rails may also be referred to as supply power rails, and some of the buried power rails may also be referred to as ground reference rails. In some embodiments, the conductive material may include metal, such as tungsten (W), ruthenium (Ru), aluminum (Al), copper (Cu), or other suitable conductive material. In some embodiments, the conductive material may be deposited by CVD, PVD, sputter deposition, or other techniques suitable for depositing conductive materials.

The method of FIGS. 19A and 19B now proceeds to step S200, which bonds the initial structure W1 to a carrier (e.g., the temporary carrier 52 of the wafer W2 in FIGS. 1B, 2B and 3B); step S300, which thins down the substrate 304 of the initial structure W1; step S400, which forms a first TSV opening OP1 and a second TSV opening OP2 to penetrate through the substrate 304 until reaching a conductor (e.g., the buried power rails 310) formed in the initial structure W1; step S500, which forms a first-type TSV 360 in the first TSV opening OP1 and forms a second-type TSV 370 in the second TSV opening; and step S600, which forms a second interconnect 200 over the substrate 304 to connect the first-type TSV 360 and the second-type TSV 370 to form the semiconductor structure SS9 with a thermoelectric generator (TEG). After forming the second interconnect 200, a first plurality of conductive terminals may be formed on the second interconnect 200, and/or a second plurality of conductive terminals may be formed on the first interconnect 100. After forming the second interconnect 200, the carrier may be deboned from the first interconnect 100. In some embodiments, the semiconductor structure SS9 is in a wafer or panel form. After debonding the carrier, the semiconductor structure SS9 may be diced (or singulated) to form separate and individual chip or die having a structure (e.g., one or multiple unit cells U) of the semiconductor structure SS9.

That is, in other embodiments, the TEG(s) or the integrated TEG(s) included in the semiconductor structures SS1, SS2, SS3, SS4, SS5, SS6, SS7, SS7, and/or SS8 may connected to the buried power tail(s) 310, instead of the conductors 350. In further embodiments, the TEG(s) or the integrated TEG(s) included in the semiconductor structures SS1, SS2, SS3, SS4, SS5, SS6, SS7, SS7, and/or SS8 may connected to the conductive lines or vias included in interconnect 100, instead of the conductors 350. In the disclosure, an semiconductor structure may include one or more TEG(s), one or more integrated TEG(s), or one or more TEG(s) and one or more integrated TEG(s), with or without an embedded battery or an external battery. The disclosure is not limited thereto. In some embodiments, the semiconductor structures SS1, SS2, SS3, SS4, SS5, SS6, SS7, SS7, SS8, SS9, and/or modifications thereof may be individually packaged or integrated in different package types or modules, such as an integrated Fan-Out (InFO) package, an InFO package having a Package-on-Package (PoP) structure, a chip-on-wafer-on-substrate (CoWoS) package, a flip chip package of an InFO package, or the like. The disclosure is not limited thereto.

In accordance with some embodiments, a semiconductor structure includes a substrate, a device, a conductor, a backside interconnect, and a thermoelectric generator. The substrate has a front surface and a rear surface opposite to the front surface. The device is disposed on the front surface of the substrate. The conductor is disposed at or near the front surface of the substrate and electrically coupled to the device. The backside interconnect is disposed on the rear surface of the substrate and electrically coupled to the device. The thermoelectric generator is disposed in the substrate and electrically coupled to the device, and includes a first-type through via and a second-type through via. The first-type through via penetrates from the rear surface of the substrate to the conductor, and is connected to a first conductive feature of the backside interconnect and the conductor. The second-type through via penetrates from the rear surface of the substrate to the conductor, and is connected to a second conductive feature of the backside interconnect and the conductor. The second-type through via is different from the first-type through via.

In accordance with some embodiments, a semiconductor structure includes a device layer, a first interconnect, a second interconnect, and at least one thermoelectric generator. The device layer includes a plurality of unit cells interconnected to each other, each of the plurality of unit cells includes a substrate, a semiconductor fin, a plurality of isolation structures, a gate structure, a pair of source/drain regions, and buried power rails. The substrate has a front surface and a rear surface opposite to the front surface. The semiconductor fin is disposed on the front surface of the substrate. The plurality of isolation structures are disposed on the front surface of the substrate, where the semiconductor fin is disposed between two adjacent isolation structures of the plurality of isolation structures. The gate structure is stacked on and covers a portion of the semiconductor fin and portions of the plurality of isolation structures. The pair of source/drain regions are disposed at two opposite sides of the semiconductor fin exposed by the gate structure. The buried power rails are embedded in the substrate and electrically coupled to a device including the semiconductor fin, the gate structure and the pair of the source/drain regions, where the buried power rails are respectively below the plurality of the isolation structures. The first interconnect is disposed on the front surface of the substrate and electrically coupled to the devices of the plurality of unit cells. The second interconnect is disposed on the rear surface of the substrate and electrically coupled to the devices of the plurality of unit cells, where the device layer is disposed between the first interconnect and the second interconnect. The at least one thermoelectric generator is disposed in the substrate and electrically coupled to the devices of the plurality of unit cells, and includes a first-type through via and a second-type through via. The first-type through via penetrates from the rear surface of the substrate to at least one conductor disposed over the front surface of the substrate, and is connected to a first conductive feature of the second interconnect and the at least one conductor. The second-type through via penetrates from the rear surface of the substrate to the at least one conductor, and is connected to a second conductive feature of the second interconnect and the at least one conductor.

In accordance with some embodiments, a method of manufacturing a semiconductor structure includes the following steps: providing an initial structure having a substrate, a device disposed on a front surface of the substrate, and a conductor disposed at or near the front surface of the substrate and electrically coupled to the device; bonding the initial structure to a carrier; thinning the substrate of the initial structure from a rear surface of the substrate, the rear surface is opposite to the front surface; forming a first through via opening and a second through via opening in the substrate from the rear surface of the substrate until reaching the conductor; forming a first-type through via in the first through via opening and forming a second-type through via in the second through via opening; and disposing a backside interconnect on the rear surface of the substrate to connect the first-type through via and the second-type through via so to form a thermoelectric generator in the semiconductor structure, the backside interconnect being electrically coupled to the device, where the first-type through via is connected to a first conductive feature of the backside interconnect and the conductor, and the second-type through via is connected to a second conductive feature of the backside interconnect and the conductor.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor structure, comprising:
  a substrate, having a front surface and a rear surface opposite to the front surface;
  a device, disposed on the front surface of the substrate;
  a conductor, disposed at or near the front surface of the substrate and electrically coupled to the device;
  a backside interconnect, disposed on the rear surface of the substrate and electrically coupled to the device; and
  a thermoelectric generator, disposed in the substrate and electrically coupled to the device, and comprising:
    a first-type through via, penetrating from the rear surface of the substrate to the conductor, and connected to a first conductive feature of the backside interconnect and the conductor; and
    a second-type through via, penetrating from the rear surface of the substrate to the conductor, and connected to a second conductive feature of the backside interconnect and the conductor,
    wherein the second-type through via is different from the first-type through via,
    wherein at least one of the first-type through via and the second-type through via is in physical contact with the conductor, and
    wherein a thickness of at least one of the first-type through via and the second-type through via is greater than a thickness of the substrate.

2. The semiconductor structure of claim 1, further comprising:
  a frontside interconnect, disposed on the front surface of the substrate and electrically coupled to the device, wherein the conductor is disposed in the frontside interconnect.

3. The semiconductor structure of claim 1, wherein the device comprises:
  a semiconductor fin, disposed on the substrate;
  a plurality of isolation structures, disposed on the substrate, wherein the semiconductor fin is disposed between two adjacent isolation structures of the plurality of isolation structures;
  a gate structure, stacked on and covering a portion of the semiconductor fin and portions of the plurality of isolation structures; and
  a pair of source/drain regions, disposed at two opposite sides of the semiconductor fin exposed by the gate structure,
  wherein the semiconductor structure further comprises a plurality of conductive vias disposed over the substrate and electrically coupled to the device, wherein a first conductive via comprised in the plurality of conductive vias is electrically coupled to the gate structure, and second conductive vias comprised in the plurality of conductive vias are electrically coupled to the source/drain regions, and
  wherein the conductor comprises a third conductive via comprised in the plurality of the conductive vias.

4. The semiconductor structure of claim 3, wherein a first surface of the first conductive via, second surfaces of the second conductive vias, and a third surface of the third conductive via are substantially leveled with each other, wherein the first surface of the first conductive via, the second surfaces of the second conductive vias, and the third surface of the third conductive via are facing away from the device and the substrate.

5. The semiconductor structure of claim 1, wherein the device comprises:
  a semiconductor fin, disposed on the substrate;
  a plurality of isolation structures, disposed on the substrate, wherein the semiconductor fin is disposed between two adjacent isolation structures of the plurality of isolation structures;
  a gate structure, stacked on and covering a portion of the semiconductor fin and portions of the plurality of isolation structures;
  a pair of source/drain regions, disposed at two opposite sides of the semiconductor fin exposed by the gate structure; and
  at least one buried power rail, embedded in the substrate and electrically coupled to the device, wherein the at least one buried power rail is underneath a respective one of the plurality of the isolation structures,
  wherein the conductor comprises the at least one buried power rail.

6. The semiconductor structure of claim 1, wherein in a plan view, the first-type through via and the second through via comprised in the thermoelectric generator are overlapped with the device.

7. The semiconductor structure of claim 1, wherein in a plan view, the first-type through via and the second through via comprised in the thermoelectric generator are offset from the device.

8. The semiconductor structure of claim 1, wherein the backside interconnect further comprises an embedded battery electrically coupled to the device and the thermoelectric generator.

9. The semiconductor structure of claim 1, further comprising:
  a battery, attached to and electrically coupled to the backside interconnect, wherein the battery is electrically coupled to the device and the thermoelectric generator.

10. A semiconductor structure, comprising:
  a device layer, comprising a plurality of unit cells interconnected to each other, each of the plurality of unit cells comprising:
    a substrate, having a front surface and a rear surface opposite to the front surface;
    a semiconductor fin, disposed on the front surface of the substrate;
    a plurality of isolation structures, disposed on the front surface of the substrate, wherein the semiconductor fin is disposed between two adjacent isolation structures of the plurality of isolation structures;
    a gate structure, stacked on and covering a portion of the semiconductor fin and portions of the plurality of isolation structures; and
    a pair of source/drain regions, disposed at two opposite sides of the semiconductor fin exposed by the gate structure;
    buried power rails, embedded in the substrate and electrically coupled to a device comprising the semiconductor fin, the gate structure and the pair of the source/drain regions, wherein the buried power rails are respectively below the plurality of the isolation structures;

a first interconnect, disposed on the front surface of the substrate and electrically coupled to the devices of the plurality of unit cells;

a second interconnect, disposed on the rear surface of the substrate and electrically coupled to the devices of the plurality of unit cells, the device layer being disposed between the first interconnect and the second interconnect; and at least one thermoelectric generator, disposed in the substrate and electrically coupled to the devices of the plurality of unit cells, and comprising:

a first-type through via, penetrating from the rear surface of the substrate to at least one conductor disposed over the front surface of the substrate, and connected to a first conductive feature of the second interconnect and the at least one conductor; and a second-type through via, penetrating from the rear surface of the substrate to the at least one conductor, and connected to a second conductive feature of the second interconnect and the at least one conductor.

11. The semiconductor structure of claim 10, wherein the at least one thermoelectric generator comprises a plurality of thermoelectric generators each separated from each other, and each of the plurality of thermoelectric generators is electrically coupled to a respective one of the devices of the plurality of unit cells, wherein the at least one conductor comprises a plurality of conductors, each of the first-type through vias comprised in the plurality of thermoelectric generators is connected to a respective one first conductive feature of the second interconnect and a respective one of the plurality of conductors, and each of the second-type through vias comprised in the plurality of thermoelectric generators is connected to a respective one second conductive feature of the second interconnect and the respective one of the plurality of conductors.

12. The semiconductor structure of claim 10, wherein the at least one thermoelectric generator comprises a plurality of thermoelectric generators each separated from each other, and some of the plurality of thermoelectric generators are electrically coupled to a respective one of the devices of the plurality of unit cells, wherein the at least one conductor comprises a plurality of conductors, each of the first-type through vias comprised in the plurality of thermoelectric generators is connected to a respective one first conductive feature of the second interconnect and a respective one of the plurality of conductors, and each of the second-type through vias comprised in the plurality of thermoelectric generators is connected to a respective one second conductive feature of the second interconnect and the respective one of the plurality of conductors.

13. The semiconductor structure of claim 10, wherein the at least one thermoelectric generator comprises a plurality of integrated thermoelectric generators each separated from each other, and each of the plurality of integrated thermoelectric generators is electrically coupled to a respective one of the devices of the plurality of unit cells, wherein the at least one conductor comprises a plurality of conductors, each of the first-type through vias comprised in the plurality of integrated thermoelectric generators is connected to a respective one first conductive feature of the second interconnect and a first group of the plurality of conductors, and each of the second-type through vias comprised in the plurality of integrated thermoelectric generators is connected to a respective one second conductive feature of the second interconnect and the first group of the plurality of conductors.

14. The semiconductor structure of claim 10, wherein the at least one thermoelectric generator comprises an integrated thermoelectric generator, and the integrated thermoelectric generator is electrically coupled to the devices of the plurality of unit cells, wherein the at least one conductor comprises a plurality of conductors, the first-type through vias comprised in the integrated thermoelectric generator is connected to a respective one first conductive feature of the second interconnect and a second group of the plurality of conductors, and the second-type through vias comprised in the integrated thermoelectric generator is connected to a respective one second conductive feature of the second interconnect and the second group of the plurality of conductors.

15. The semiconductor structure of claim 10, wherein the at least one conductor comprises:

at least one of the buried power rails;

at least one of conductive features comprised in the first interconnect; or at least one of additional conductive features comprised in the device layer, the additional conductive features electrically coupling the devices of the plurality of unit cells and the first interconnect.

16. The semiconductor structure of claim 10, wherein a thermoelectric material of the second-type through via is different from a thermoelectric material of the first-type through via.

17. A method of manufacturing a semiconductor structure, comprising:

providing an initial structure having a substrate, a device disposed on a front surface of the substrate, and a conductor disposed at or near the front surface of the substrate and electrically coupled to the device;

bonding the initial structure to a carrier;

thinning the substrate of the initial structure from a rear surface of the substrate, the rear surface being opposite to the front surface;

forming a first through via opening and a second through via opening in the substrate from the rear surface of the substrate until reaching the conductor;

forming a first-type through via in the first through via opening and forming a second-type through via in the second through via opening; and disposing a backside interconnect on the rear surface of the substrate to connect the first-type through via and the second-type through via so to form a thermoelectric generator in the semiconductor structure, the backside interconnect being electrically coupled to the device, wherein the first-type through via is connected to a first conductive feature of the backside interconnect and the conductor, and the second-type through via is connected to a second conductive feature of the backside interconnect and the conductor, wherein the second-type through via is different from the first-type through via, wherein at least one of the first-type through via and the second-type through via is in physical contact with the conductor, and wherein a thickness of at least one of the first-type through via and the second-type through via is greater than a thickness of the substrate.

18. The method of claim 17, wherein prior to providing the initial structure, the method further comprising forming the initial structure, wherein forming the initial structure comprises:

providing the substrate;

forming a plurality of semiconductor fins on the substrate;

forming a first isolation dielectric to cover the semiconductor fins and performing a planarization process to the first isolation dielectric;

recessing the first isolation dielectric to form a plurality of first isolation structures, the semiconductor fins protruding from the plurality of first isolation structures;

forming a plurality of poly-gate structures on the semiconductor fins;

forming a plurality of source/drain features on the semiconductor fins next to the plurality of poly-gate structures;

replacing the plurality of the poly-gate structures with metal gate structures to form the device on the substrate; and forming a first interconnect to connect the device.

19. The method of claim 18, wherein prior to forming the first interconnect to connect the device, forming the initial structure further comprises:

disposing a plurality of conductive vias over the substrate, first conductive vias comprised in the plurality of conductive vias being electrically coupled to the metal gate structures, and second conductive vias comprised in the plurality of conductive vias being electrically coupled to the plurality of source/drain regions, wherein the first interconnect is formed to connect the device through the plurality of conductive vias, and wherein the conductor comprises a third conductive via comprised in the plurality of the conductive vias or a third conductive feature comprised in the first interconnect.

20. The method of claim 17, wherein prior to providing the initial structure, the method further comprising forming the initial structure, wherein forming the initial structure comprises:

providing the substrate;

forming a plurality of semiconductor fins on the substrate;

forming a first isolation dielectric to cover the semiconductor fins and performing a planarization process to the first isolation dielectric;

forming trenches extending through the first isolation dielectric to the substrate adjacent to the semiconductor fins;

forming a conductive material over the first isolation dielectric and filling the trenches with the conductive material;

performing a planarization process to the conductive material until the first isolation dielectric is exposed;

etching the conductive material in the trenches down to a given depth so to form a plurality of buried power rails, the plurality of buried power rails being electrically coupled to the device;

forming a second isolation dielectric over the first isolation dielectric and filling the trenches with the second isolation dielectric;

removing the second isolation dielectric over the first isolation dielectric;

recessing the first isolation dielectric to form a plurality of first isolation structures and recessing the second isolation dielectric to form a plurality of second isolation structures, the semiconductor fins protruding from the plurality of first isolation structures and the plurality of second isolation structures;

forming a plurality of poly-gate structures on the semiconductor fins;

forming a plurality of source/drain features on the semiconductor fins next to the plurality of poly-gate structures;

replacing the plurality of the poly-gate structures with metal gate structures to form the device on the substrate; and forming a first interconnect to connect the device, wherein the conductor comprises one buried power rail comprised in the plurality of the buried power rails.

\* \* \* \* \*